United States Patent
Naim

(10) Patent No.: US 11,616,634 B1
(45) Date of Patent: Mar. 28, 2023

(54) SIMULTANEOUS PACKET TRANSMISSION FOR 5G SYSTEMS

(71) Applicant: Muhammad Ahsan Naim, South Jordan, UT (US)

(72) Inventor: Muhammad Ahsan Naim, South Jordan, UT (US)

(73) Assignee: Muhammad Ahsan Naim, Irving, TX (US)

( * ) Notice: Subject to any disclaimer, the term of this patent is extended or adjusted under 35 U.S.C. 154(b) by 0 days.

(21) Appl. No.: 16/992,974

(22) Filed: Aug. 13, 2020

Related U.S. Application Data

(63) Continuation-in-part of application No. 16/206,795, filed on Nov. 30, 2018, now abandoned.

(60) Provisional application No. 62/593,018, filed on Nov. 30, 2017.

(51) Int. Cl.
  *H04L 7/00* (2006.01)
  *H04W 56/00* (2009.01)

(52) U.S. Cl.
  CPC ......... *H04L 7/0016* (2013.01); *H04W 56/001* (2013.01)

(58) Field of Classification Search
  CPC ............... H04L 7/0016; H04L 1/0041; H04W 56/001; H04B 10/5161; H04B 10/5561; H04B 10/613; H04Q 11/0066
  See application file for complete search history.

(56) References Cited

U.S. PATENT DOCUMENTS

| | | |
|---|---|---|
| 2017/0195066 A1 | 7/2017 | Fine et al. |
| 2018/0227161 A1 | 8/2018 | Zhang et al. |
| 2019/0052403 A1* | 2/2019 | Oveis Gharan ......... H04L 1/203 |

* cited by examiner

*Primary Examiner* — Vineeta S Panwalkar
(74) *Attorney, Agent, or Firm* — Lee Sullivan Shea & Smith LLP

(57) ABSTRACT

Methods for simultaneous packet transmission (SPT) may be used to transmit packets simultaneously on a communications link such the orthogonal frequency division multiplexed multiple access (OFDMA) downlink used in used in WiFi and LTE cellular/wireless mobile data applications. A first SPT method may employ multiple data streams and selects a subset of streams to form symbols during every intervals. This allows the use of variable code rates on different streams thereby increasing the overall throughput. A second SPT method may transmit a second data stream implicitly while transmitting a data stream explicitly on a communication channel. These SPT methods may be used either individually or jointly, and may be implemented via software changes at the transmitter and the receiver. Additionally, methods for applying constrained interleaved coded modulation (CICM) to low-density parity check (LDPC) codes and decoding LDPC codes with CICM are presented.

8 Claims, 35 Drawing Sheets

Tanner Graph used for decoding of LDPC Codes with ITBF

SIMULTANEOUS PACKET TRANSMISSION FOR 5G SYSTEMS

CROSS-REFERENCE TO RELATED APPLICATIONS

This application is a continuation-in-part of and claims priority to U.S. Non-Provisional patent application Ser. No. 16/206,795, filed Nov. 30, 2018 and entitled "Simultaneous Packet Transmission For 5G Systems," which in turn claims priority to U.S. Provisional Patent Application No. 62/593,018, filed Nov. 30, 2017 and entitled "Simultaneous Packet Transmission For 5G Systems." Each of these patent applications are incorporated by reference herein in its entirety.

FIELD

This present application relates to signaling and coding techniques for use in a digital communication system. More particularly, the present application relates to enhancing the throughput of a digital communication system that transmits multiple packets or multiple data streams. This present application discloses at least two throughput enhancing techniques for such digital communication systems. A first technique deals with simultaneous transmission of steams of packets or streams of bits. For instance, disclosed herein are techniques for how to select bits of different packets or data streams to form symbols to achieve an increased overall throughput. These data streams can be either coded or uncoded. A second technique deals with transmission of two coded streams where the coded sequence of the first coded stream, which may be referred to as the explicit coded stream, is altered according to the second coded stream, which is called the implicit coded stream, prior to transmission. As a result, the second coded stream is transferred to the destination without having to transmit it directly over the channel thereby increasing the throughput.

BACKGROUND

With rapidly increasing consumer demand, almost all communication systems are seeking ways to increase throughput to meet the consumer demand. For example, 4G LTE (long term evolution) is moving into 5G, OTN (optical transport network) is expanding its speeds into 100G and beyond, computer backbone communication is actively trying to increase speed of communication among chips, memory units, etc. to speedup digital computations, cloud computing is expanding to accommodate more clients and higher speeds. Similar trends exist in almost all types of communications. However, all such communications face many challenges in trying to achieve their desired throughput increase.

Multi-level codes (MLCs) are well documented in the literature. In a traditional MLC that has N levels employs N separately encoded streams. The lowest level employs the most powerful code (usually a low rate code) and the power of the code decreases as the level increase. The highest level can be left uncoded too. During transmission, a symbol is formed by taking one coded bit from every level and mapping N bits onto a $2^N$-ary signal constellation. Usually, the lowest level corresponds to the least significant bit of every symbol while the highest level corresponds to the most significant bit of every symbol. MLCs are usually decoded by using MSD (multi-stage decoding). In MSD each level is decoded separately starting from the lowest level. All other levels are decoded by using the decisions made by all previously decoded levels. Hard decoding and soft decoding have been separately considered to decode each level. In addition, hard iterative decoding and soft iterative decoding have been considered to improve the performance over MSD. Usually, Gray coding has been considered on the constellation, however, other forms of mapping have also been considered with MLCs in the literature. A systematic way to construct to construct the constellation and the mapping policy has also been presented according to the selected set of component codes.

Implicit transmission of information has been discussed in the literature. A SM (spatial modulation) scheme can transmit additional information from the selection of the antenna used for transmission. For example, a spatial modulation scheme that employs 16 transmitting antennas and uses QPSK for transmission, can transmit 4 bits from the selection of the specific antenna used for transmission and two additional bits from the transmitted symbol. Hence, the four transmitted bits by the selection of the antenna are transmitted implicitly while the transmitted symbol only carries two bits from the selected QPSK symbol.

It would be desirable to have methods, apparatus and systems for increasing the throughput of any existing communication system such as on the uplink or the downlink of the LTE and 5G systems, increase the throughput of multi-media applications, in the transmission over the OTN, and to increase the throughput of any communication system. It would be desirable to increase the throughput without having to significantly modify the existing modulation, demodulation, coding and decoding techniques of the system. It would also be desirable to be able to employ the same technique to improve data storage systems, etc.

Further, a constrained interleaved coded modulation (CICM) technique can be used to best map a coded stream of bits onto a higher order signal. CICM can make a higher order coded modulation scheme to outperform or perform similar to a lower order modulation scheme at high SNR. CICM technique is implemented in two steps: (a) passing a coded stream through a constrained Interleaver (called a CICM Interleaver) that is constructed according to the code used in generating that coded stream, and (b) mapping the coded interleaved bits onto a signal constellation that is mapped according to reverse Gray coding (RGC). CICM is developed with block codes and convolutional codes based on the belief that, as the SNR increases, it is most likely that any errors occur would be limited to just a single codeword in case of a block code or a single error event in case of a convolutional code. CICM is developed by ensuring that all coded bits of every codeword are placed in different symbols and ensure that mapping on the constellation is done in such a way that all single bit differences achieve the highest possible Euclidean distance on the constellation. The CICM Interleaver ensures that all coded bits of every codeword are placed in different transmitted symbols while RGC ensures that all single bit differences achieve the highest Euclidean distance on the constellation. Since almost all systems in practice employ coded information, CICM is applicable to most of the communication systems including 4G, 5G systems, optical transmissions, etc. As a result, CICM can be used to increase the data rate while performing better than the traditional methods. It has been shown that improvements of CICM can be realized over any type of a channel including fading channels. Therefore, CICM has great potential in practice when meeting the increased demand for higher data rates.

However, a CICM technique can only be used with smaller block codes or short convolutional codes. This is because the CICM technique requires consideration of a large number of codewords (in case of a block code) or a long-coded sequence (in case of a convolutional code) in order to properly design its CICM Interleaver. Since short codes are rarely used in practice, it is almost impossible to apply the CICM technique in current communication systems. If the CICM technique is applied to commonly used long codes such as low-density parity check (LDPC) codes or turbo codes, it would require many LDPC codewords or long turbo coded sequences with multiple generations of turbo coded sequences thereby increasing the decoding delay, decoding complexity and required memory. Therefore, the CICM technique is not attractive for current communications systems.

SUMMARY

In one aspect, the present application discloses SPT (simultaneous packet transmission) for increasing the throughput of a communication system. SPT employs different streams for transmission. The data packets on different streams of a SPT can be inherently present in the communication system. For example, the different types of signals, such as voice and data, or video and audio, already available in a multimedia application can form different streams of packets (one for videos, one for voice, etc.) of a SPT scheme. If not, the present application also teaches how to systematically generate different data streams from a single data stream that carries the same type of packets. Therefore, the SPT technique disclosed herein is applicable for the current LTE system, the upcoming 5G systems and multimedia applications, and the like. The throughput enhancement using SPT is feasible because SPT allows packets transmitted on some streams to employ significantly higher code rates.

In order to explain the SPT technique disclosed herein, let us consider a SPT scheme that employs a $M=2^{(m_1+m_2)}$-ary overall signal constellation for transmission, where $m_1$ and $m_2$ are two positive integers. Let $M_1=2^{m_1}$ and $M_2=2^{m_2}$. In the SPT technique disclosed herein, the overall $M=M_1M_2$-ary constellation is partitioned into $M_1$ number of distinct $M_2$-ary partitioned constellations so that no two different $M_2$-ary partitioned constellations share any common constellation points on the overall constellation. Further, partitioned constellations are chosen so that every constellation point on the overall $M_1M_2$-ary constellation belongs one and only one $M_2$-ary partitioned constellation. In addition, the partitioned constellations are selected to maintain a high MSED (minimum squared Euclidean distance) as possible within their respective partitioned constellations. As a result, the MSED of any partitioned constellation can be significantly higher than the MSED of the overall constellation. Therefore, $m_1$ number of bits (out of $(m_1+m_2)$ number of total bits) of a symbol transmitted during every interval can be used to identify the specific $M_2$-ary partitioned constellation among all $M_1$ number of such partitioned constellations, while the remaining $m_2$ number of bits can be used to identify the specific constellation point of that specific partitioned $M_2$-ary constellation. Therefore, a SPT scheme can be developed to transmit symbols that carry $m=(m_1+m_2)$ number of bits every interval, where the first $m_1$ bits of a symbol can be dedicated to selecting the particular $M_2$-ary partitioned constellation, whereas the last $m_2$ bits of a symbol can be dedicated to selecting the specific constellation point of that $M_2$-ary partitioned constellation. For example, FIG. 1 illustrates an overall 4-ary SPT constellation that corresponds to the case $m_1=m_2=1$. The overall 4-ary constellation in FIG. 1 consists of two distinct 2-ary partitioned constellations as highlighted in FIG. 1. The partitioned constellation 1 is identified by a "0" first bit of a symbol while the partitioned constellation 2 is identified by a "1" first bit of a symbol. Throughout this document, the first $m_1$ bits of a symbol that select the specific partitioned constellation are referred to as the "primary $m_1$ bits" while the last $m_2$ bits of a symbol that determine the specific constellation point of that specific partitioned constellation are referred to as the "secondary $m_2$ bits" of a symbol. Clearly, the primary $m_1$ bits that select the partitioned constellation can be placed anywhere within $m=(m_1+m_2)$ bits of the symbol while the remaining secondary $m_2$ bits can select the specific constellation point on that partitioned constellation. Note that each ith partitioned $M_2$-ary constellation corresponds to a unique combination of primary $m_1$ bits, $p_j=(p_{j1}, p_{j2}, \ldots, p_{jm_1})$, $j=1, 2, \ldots, M_1$.

With the above observations, the disclosed SPT proposes to assign each of the $M_1$ number of $M_2$-ary partitioned constellations to a specific stream of packets. As a result, a SPT has $M_1$ number of streams in addition to the stream that carries the primary $m_1$ bits of every symbol. Specifically, a SPT has the following transmission structure:

1. Employ $(M_1+1)$ number of different streams for transmission
2. Use usually a powerful code on stream 1, which is also called the primary stream, and select the primary $m_1$ bits of every symbol from that primary stream
3. Assign each of the remaining streams, streams 2 through $(M_1+1)$, a specific partitioned constellation among all $M_1$ partitioned constellations. Without loss of generality, assign the partitioned constellation j to stream $(j+1)$ $j=1, 2, \ldots, M_1$. Note that each jth partitioned $M_2$-ary constellation, which is assigned to the $(j+1)$ th stream, corresponds to a unique combination of primary $m_1$ bits, $p_j=(p_{j1}, p_{j2}, \ldots, p_{jm_1})$, where, $j=1, 2, \ldots, M_1$.
4. In every symbol, once the specific kth partitioned constellation is selected by the primary $m_1$ bits on stream 1, identify the specific constellation point on the kth partitioned constellation corresponding to the secondary $m_2$ bits taken from stream $(k+1)$.

During transmission, the first primary $m_1$ bits of a symbol are taken from stream 1. These primary $m_1$ bits uniquely identify the specific kth partitioned constellation corresponding to that symbol. Since the kth partitioned constellation is assigned to stream $(k+1)$, select the corresponding constellation point on the selected kth partitioned constellation based on the next $m_2$ bits from stream $(k+1)$. As a result, every symbol carries $m_1$ primary bits from stream 1 and $m_2$ secondary bits from one stream from streams 2 through $(M_1+1)$, which is selected based on the $m_1$ primary bits of that symbol. For example, a SPT scheme with $m_1=m_2=1$ can employ the constellation shown in FIG. 1 and use one primary stream (stream 1) and two secondary streams (streams 2 and 3).

In order achieve the best performance and to maintain the highest throughput, the mapping on the constellation in SPT can be preferably done as follows:

1. Since every combination of $m_1$ primary bits corresponds to a specific partitioned constellation, assign the same $m_1$ primary bits as the most significant $m_1$ bits of every constellation point of that specific partitioned constellation. Assign different primary $m_1$ bit combinations different $M_1$ partitioned constellations to maintain Gary coding or any other preferable mapping policy among the primary $m_1$ bit combinations of those $M_1$ partitioned constellations.

2. Maintain Gray coding or any other different mapping policy among $m_2$ secondary bit combinations within any given partitioned constellation for all $M_1$ partitioned constellations.

Therefore, even though the constellation points on the overall constellation would not maintain Gary coding among all $m=(m_1+m_2)$ bit combinations, they can maintain Gray coding among the first $m_1$ primary bits among different partitioned constellations and among the last $m_2$ secondary bits within partitioned constellations separately. However, depending on the application, SPT can use other mapping policies such as anti-Gray coding, RGC (reverse Gray coding). For example, if the SPT scheme is developed to use iterative decoding including the demodulator as in CICM (constrained interleaved coded modulation) or BICM (bit-interleaved coded modulation), RGC or other mapping policies can be used to improve performance at the expense of complexity.

As stated before, SPT schemes of the present disclosure maintain a higher minimum squared Euclidean distance (MSED) than that of the overall constellation. For example, the two partitioned constellations in FIG. 1 have a MSED which is twice the MSED of the overall 4-ary constellation. Therefore, if the receiver can correctly identify the specific partitioned constellation at the receiver by correctly decoding all $m_1$ primary bits of every symbol, the secondary $m_2$ bits of every symbol that decide the specific constellation point on the respective partitioned constellation can have more immunity for handling channel noise. For example, the two partitioned constellations in FIG. 1 have a 3 dB advantage over the overall constellation. Therefore, all streams 2 through $(M_1+1)$ can employ codes that have significantly higher code rate than the code used on stream 1 thereby increasing the overall throughput of the SPT scheme. Specifically, when stream 1 employs a code that has rate $R_1$ and all streams 2 through $(M_1+1)$ employ the same code that has rate $R_2>R_1$, the overall rate employed by the SPT scheme is $R=(m_1R_1+m_2R_2)/(m_1+m_2)$, which is higher than $R_1$ when $R_2>R_1$. Therefore, compared with a conventional transmission that employs a rate $R_1$ code for all packets, the SPT technology disclosed herein allows the use of higher rate codes on selected packets increasing the overall throughput.

So far, the SPT technology is discussed when $(M_1+1)$ different streams are available for transmission. Such scenarios are common in multimedia type systems that naturally transmit different types of streams simultaneously. The SPT technology disclosed herein can also be used with a scheme that employs only a single stream such as on the down link of the 4G LTE system and 5G systems. In such applications, as illustrated in FIG. 2, the single stream can be first passed through a SSPC (structured serial to parallel converter) in order to systematically generate all $(M_1+1)$ number of streams needed in a SPT scheme. The structured distribution of packets among the streams in SSPC allows the receiver to uniquely identify the specific stream, out of streams 2 through $(M_1+1)$, that feeds the set of $m_2$ secondary bits of every symbol. The SSPC is discussed here for convenience by assuming that all streams operate on the basis of packets or frames formed by groups of bits. However, the same SSPC technique can be used when the packet sizes vary from one packet to the other. For example, in case of the LTE, these groups can represent packets which can be used by different streams of a SPT. Similarly, when used with individually transmitted bits on different streams, the same SSPC can be used by making the frame length of a packet to one bit. The SSPC can be designed by using the following rule of operation for continuous transmission of packets:

Every stream at the output of the SSPC that is in need of a new packet gets the very next available packet of the stream at the input. A stream that is in need of a new packet is defined here as a stream that has just completed transmitting its current packet and is expected to feed its bits into the current symbol for transmission from a new packet. Since stream 1 transmits its bits in every symbol, stream 1 is in need of a new packet every time it completes its current packet. Any stream from streams 2 through $(M_1+1)$ that has been chosen to transmit the next secondary $m_2$ bits (based on the primary $m_1$ bits on stream 1) but has completed transmitting its current packet is also in need of a new packet. In case of a situation where more than one stream is in need of a new packet, the stream with the lowest assigned stream number gets the first priority.

FIG. 3 shows the operating algorithm of the SSPC of the present disclosure according to the above-mentioned rule. Note that at the beginning, stream 1 is in need of packet and hence, steam 1 gets the first packet of the stream of packets to be transmitted at the input of the SSPC. The first $m_1$ bits on that selected packet on stream 1 decides the selected stream from streams 2 through $(M_1+1)$ and hence, that selected stream gets the second packet at the input of the SSPC. The remaining packets will be assigned to the different streams of the SPT according to the algorithm shown in FIG. 3. Embodiments that employ other similar conventions such as, stream 1 has the lowest priority, etc. that still introduce a structure in the SSPC fall within the scope of the present disclosure.

The above algorithm, however, creates an issue at the end of transmission as it can leave partially completed packets in streams 2 through $(M_1+1)$. In order to overcome this issue in SPT and to maintain the same structure of transmission throughout the entire communication, a final packet, referred as an "artificial terminating packet", can be introduced on stream 1 to complete any partially completed packets on streams 2 through $(M_1+1)$. This artificial terminating packet on stream 1 carries no information and its purpose is solely to complete any partially completed packets on streams 2 through $(M_1+1)$ and to maintain the same structure of signaling. Depending on the number of remaining bits of the packets on each of the streams 2 through $(M_1+1)$, a binary sequence can be chosen as the artificial terminating packet on stream 1 to complete the remaining bits of packets on streams 2 through $(M_1+1)$ in a pre-selected order. Specifically, if the number of remaining bits of the last packet on stream j is $m_2\lambda_j$, $j=2, 3, \ldots, (M_1+1)$, then the artificial terminating packet on stream 1 is formed by placing $\lambda_j$ times the sequence $p_j$ starting from $j=2$ and keep increasing j by 1 up to $j=(M_1+1)$. As an example, consider the case when $m_1=m_2=1$ and $M_1=M_2=2$. FIG. 1 shows the constellation used for transmission of this SPT scheme with $(M_1+1)=3$ streams, that has $p_1=(0)$ and $p_2=(1)$. When all packets up to the last packet are assigned to streams 1 through 3 according to the algorithm shown in FIG. 3, let us for example assume that stream 2 still has fifty remaining bits to complete its last packet while stream 3 has forty remaining bits to complete its last packet. In that case a sequence that has 50 zeros followed by 40 ones is chosen as the artificial terminating packet on stream 1. The artificial terminating packet is uncoded and is not decoded at the receiver. However, the received signal during the transmission of the artificial terminating packet can be used to extract information about the remaining bits of the last packets of streams 2 through ($M_1$+1). Since the artificial terminating packet on stream 1 is not decoded, the artificial terminating packet can optionally employ slightly a modified convention to simply transmit $$m_1 \sum_{j=2}^{(M_1+1)} \lambda_j$$

number of zeros with me understanding that the secondary bits in the last packet come from streams 2 through ($M_1$+1) in a pre-selected systematic order. Specifically, the last packet can complete streams 2 through ($M_1$+1), one stream at a time starting from stream 2 and moving up to stream ($M_1$+1), by transmitting all of their remaining bits as sets of secondary $m_2$ bits of symbols.

The other terminating methods of SPT can include: (a) transmitting the last several pre-selected number of packets only over stream 1 thereby eliminating the possibility of having partially transmitted packets on streams 2 through ($M_1$+1), (b) transmitting the remaining bits of streams 2 through ($M_1$+1) using the standard Gray coded overall constellation, or (c) a hybrid of (a) and (b). However, the above terminating approaches (a), (b) and (c) reduces the MSED that can be achieved by the SPT technique for the terminating portion compared with the use of an artificial terminating packet thereby degrading the performance of the those last packets of the streams 2 through ($M_1$+1). This degradation is however not experienced in the case of employing the terminating artificial packet as described before.

The decoding of SPT signals begins by decoding of stream 1 correctly. It is important in SPT decoding to correctly decode stream 1 (that carries all primary $m_1$ bit combinations of all symbols) correctly because without correctly identifying stream 1, the receiver is unable to correctly identify the origin of the remaining secondary $m_2$ bits of every symbol. Therefore, SPT schemes need verify that all packets on stream 1 are decoded correctly by preferably employing a CRC or employing a different method. In case any packet on stream 1 is incorrectly decoded (i.e., fails the CRC), the decoder needs to request re-transmission of that packet on stream 1. Therefore, SPT schemes are more suitable for hybrid ARQ (hybrid automatic repeat request) schemes, such as those currently employed in the 4G LTE standard. In case of re-transmissions, the incremental redundancy method that is currently used in the 4G LTE can be used to further help to decode the same packets that failed their corresponding CRC and also to help better decode the packets that contain the secondary $m_2$ bits corresponding to the same set of symbols.

FIG. 4 shows the block diagram of the SPT receiver assuming that the decoding of each packet according to the code (or codes) employed on different streams requires soft decoding similar to the turbo decoding used in the 4G LTE system. The received signal is first fed into the received signal register. Note that each received symbol carries information about $m_1$ primary bits from stream 1 and $m_2$ secondary bits from one of streams from 2 through ($M_1$+1). As shown in FIG. 4, the receiver extracts soft information of only $m_1$ primary bits of each symbol at the beginning. The soft information which are the log likelihood (LLR) values of each primary bit is obtained in the standard manner known in the literature [Imai] using the M-ary overall constellation. Once the LLR values of a full packet on stream 1 is obtained, decode that packet according to the code used on stream 1. Verify the decoding of that packet on stream 1 is correct decoded by preferably checking a CRC. If the receiver finds that a decoded packet is incorrect, request re-transmission of the set of symbols that are responsible for providing the LLR values of that packet on stream 1. If that decoded packet on stream 1 is correct, the set of primary $m_1$ bits of every symbol related to that packet has been identified correctly preferably by using a CRC or any other method. Since the set of primary $m_1$ bits corresponds to a specific jth partitioned $M_2$-ary constellation which is assigned to stream (j+1) (1≤j≤$M_1$), the origin of each set of $m_2$ secondary bits of all the symbols related to that frame can be correctly identified using a stream and constellation finding block as illustrated in FIG. 4. For each symbol of that correctly decoded packet on stream 1, using the correctly identified specific jth $M_2$-ary partitioned constellation by the correctly decoded set of $m_1$ primary bits and the corresponding received symbol values, find the LLR values of the set of $m_2$ secondary bits and assign them to the specific stream (j+1) which is assigned to that jth $M_2$-ary partitioned constellation. When LLR values of any packet of any (j+1)th stream completes, start decoding that packet according to the code employed of that (j+1)th stream. Continue this process down to the last packet. When all the previous packets of steam 1 are correctly decoded and verified preferably by using a CRC on stream 1, the receiver can correctly identify the sequence of stream 1 in the last packet. Therefore, in the artificial terminating packet (which is the last packet transmitted on stream 1) is not decoded as the receiver already knows the primary $m_1$ bits of each symbol in it. The LLR values of the secondary $m_2$ bits of all symbols corresponding to the artificial terminating packet can therefore be calculated using each respective $M_2$-ary partitioned constellation and correctly assign to the respective streams 2 through ($M_1$+1).

The SPT schemes that have been described so far can be viewed as SPT schemes with two levels. The first level is represented by stream 1 that carries the primary $m_1$ bits of every symbol. The second level is represented by the set of streams 2 through ($M_1$+1) that feed the secondary $m_2$ bits of every symbol. The SPT technology can be easily extended to multiple levels by creating streams at the next level starting from every stream at the current highest level. For example, each of the streams at level 2, which are streams 2 through ($M_1$+1), can start a new level by sub-partitioning each of its partitioned $M_2$-ary constellations thereby creating a new level 3. Using the same terminology, a 3-level SPT can be constructed from a $M_1M_2M_3$-ary overall constellation by (a) partitioning the overall constellation into $M_1$ number of $M_2M_3$-ary partitions, and (b) sub-partitioning each $M_2M_3$-ary partition into $M_2$ number of $M_3$-ary sub-partitions. Sub-partitioning of partitioned constellations is done by following the same rules used to partition the overall constellation. Hence, every symbol of a 3-level SPT constructed using an overall $M_1M_2M_3$-ary constellation, carries m=($m_1$+$m_2$+$m_3$) bits, where $M_1=2^{m_1}$, $M_2=2^{m_2}$ and $M_3=2^{m_3}$. Further, every transmitted symbol carries $m_1$ primary bits from stream 1, $m_2$ secondary bits from streams 2 through ($M_1$+1), and $m_3$ tertiary bits from level three which is formed by streams ($M_1$+2) to ($M_1$+$M_2$+2). In general, this process can be continued until the last sub-partitions become 2-ary constellations. Clearly, as the number of levels increases the number of streams of the corresponding SPT scheme also increases. However, due to partitioning and sub-partitioning, the MSED keeps increasing as the level increases. Therefore, the rate of the code employed on all streams of a level can also be increased as the level increases. However, when multiple levels are used in a SPT, all streams that belong to all levels except for those on the highest level need to be correctly decoded. Hence, all streams, except for those at the highest level need to verify that their packets are decoded correctly by employing a CRC or any other method on each of those streams. In case any packet on any of those streams fails to correctly decode (i.e., CRC check fails), the set of symbols that include that packet needs to be retransmitted. As stated before during re-transmissions, incremental redundancy technique can be preferably used, as in the 4G LTE, to better decode the retransmitted frames.

For example, consider an embodiment with a 3-level SPT that uses a 64-QAM overall constellation with $m_1=m_2=m_3=2$, and $M_1=M_2=M_3=4$. First, the overall constellation is partitioned into four partitioned 16-ary constellations to form the second level. Each partitioned 16-ary partitioned constellations at the second level is further sub-partitioned into four 4-ary constellations to form the third level. FIG. 5 illustrates one 16-ary partition and one 4-ary sub-partition within that partition. Each symbol can be formed starting from two bits from the first level, followed by two bits from the second level and finally two bits from the third level. Note that in every symbol (a) the first two bits from the first level uniquely identify the 16-ary partitioned constellation and the corresponding second level stream that feeds the two middle bits (3rd and 4th) of every symbol, (b) the 3rd and 4th bits from the selected second level stream uniquely identify the specific 4-ary sub-partition (from the selected 16-ary partition in (a)) and the corresponding third level stream that feeds the last two bits, and (c) the last two bits from the selected third level stream determines the specific constellation point from the selected sub-partition. This 3-level SPT has one first level stream (stream 1), four second level streams (streams 2 through 5), four third level streams under each second level streams. Therefore, the 3-level SPT has one first level stream, four second level streams (that can be labeled streams 2 through 5) and 16 third level streams (that can be labeled streams 6 through 21) with a total of 21 streams. Note that the MSED of the second level streams is 4 times that of stream 1 at the first level, and the MSED of the third level streams is 4 times that of the second level streams. Therefore, all streams at the second level (streams 2 through 5) have a 6 dB advantage over stream 1, while all streams at the third level (6 through 21) have a 12 dB advantage over stream 1. Therefore, the code rate of all streams at the second level (streams 2 through 5) can be higher than that of stream 1 at the first level, and the code rate of all streams at the third level (streams 6 through 21) can be higher than that at the second level.

In general, a SPT with N levels can be constructed with a $M=\Pi_{i=1}^{N} M_i$-ary overall constellation to transmit $m_i=\log_2 M_i$ number of bits from each level i, i=1, 2, ..., N, in every symbol that carries a total of $$m = \sum_{i=1}^{N} m_i = \log_2 M$$

bits, where m and $m_i$, i=1, 2 ..., N are positive integers and N is also a positive integer. The first level of a SPT scheme has one stream and bits on the first level stream are referred to as primary bits or level-1 bits in this document. Following the description of 2-level SPT schemes, a N-level SPT scheme has $M_1$ secondary streams, which are also referred to as level-2 streams in this document. The bits of level-2 streams are referred to as secondary bits or level-2 bits in this document. As described before with 2-level SPT schemes, each of the level-2 streams is assigned a particular $\Pi_{i=2}^{N} M_i$-ary partitioned constellation out of a total of $M_1$ number of $\Pi_{i=2}^{N} M_i$-ary partitioned constellations. In order to simplify the terminology, these $M_1$ number of partitioned constellations in a general N-level SPT scheme are also referred to as level-2 partitioned constellations or simply level-2 partitions. The specific level-2 partition corresponding to a symbol is selected based on $m_1$ level-1 bits in that symbol. At any general level j, for $1<j<N$, every level-j partition is further partitioned into $M_j$ number of $\Pi_{i=(j+1)}^{N} M_i$-ary partitioned constellations, which are referred to as level-(j+1) partitioned constellations or level-(j+1) partitions. Each of the $M_j$ number of level-(j+1) partitioned constellations is assigned a separate level-(j+1) stream. In every symbol, $m_1$ number of bits from the selected level-j stream selects the specific level-(j+1) partition and the corresponding level-(j+1) stream. Therefore, noticing that every level-j stream initiates $M_1$ number of level-(j+1) streams, the total number of streams, $N_T$, used by a N-level SPT scheme can be written as $$N_T = \left[ 1 + \sum_{i=1}^{N} \left( \prod_{j=1}^{i} M_j \right) \right].$$

FIG. 6 shows the algorithm used to construct a N-level SPT signaling scheme starting from an overall $M=\Pi_{i=1}^{N} M_i$-ary constellation. The algorithm starts by partitioning the overall M-ary constellation into $M_1$ level-2 partitions. Each level-2 partition is partitioned $M_2$ times to create level-3 partitions. This process is continued until level-N partitions are created. Note that the first $m_1$ bits of every symbol are taken from the level-1 stream, which is stream 1. These $m_1$ bits uniquely identify the level-2 partition and the corresponding level-2 stream selected for that symbol. The next $m_2$ bits of that symbol are selected from that level-2 stream. These $m_2$ bits uniquely identify the level-3 partition and the corresponding level-3 stream. This process is continued until $m_{N-1}$ bits from level (N−1) uniquely identity the level-N partition and the corresponding level-N stream. The last $m_N$ bits of that symbol are taken from that selected level-N stream and those $m_N$ bits determine the specific constellation point on the selected level-N partition.

Note that every symbol is formed by taking $m_1$ bits from level j, j=1, 2, ..., N. These $m_j$ bits can be preferably arranged starting from level 1 and gradually increasing the level until level N. As a result, every symbol can be preferably formed by placing the $m_1$ bits taken from level-1 stream corresponding to that symbol at the beginning of the symbol, followed by the $m_2$ bits taken from the selected level-2 stream corresponding to that symbol, and so on up to the last $m_N$ bits taken from the selected level-N stream corresponding to that symbol. The mapping on the overall constellation is done by observing that at every level j, $1 \leq j \leq N$, that every constellation point on the overall constellation belongs to one and only one level-j partition. With that observation, the mapping on the overall constellation is done to ensure that (a) the same combination of $m_j$ bits of a symbol is assigned to all constellation points of any given level-(j+1) partition, and (b) Gray coding or any other preferable mapping policy is maintained by all $m_j$ bit combinations of symbols among all level (j+1) partitions, by all levels j, 1≤j≤(N−1). In addition, the mapping on the overall constellation points should preferably ensure that the last $m_N$ bits of every symbol that are taken from the selected level-N stream are assigned to different constellation points of each level-N partition to maintain Gray coding or any other preferable mapping policy in $m_N$ bits within all constellation points of that level-N partition. Note that, all level-N partitioned constellations are $2^{m_N}$-ary partitioned constellations.

Partitioning of constellations has been in the literature. For example, Ungerboeck codes use set partitioning. Specifically, in set partitioning, a $2^m$-ary constellation is partitioned into two sets every time until all partitions are down to 2-ary constellations. At that point one bit each of a coded stream is assigned to identify the division into the two partitions. As a result, a m-bit combination is determined for each constellation point. The SPT technique defers Ungerboeck's set partitioning in many ways as pointed out below:

1. Ungercoeck codes use one coded stream where as SPT technique uses multiple streams. In fact, each partition in SPT is assigned to a separate coded stream.
2. If an Ungerboeck code uses a $2^m$-ary constellation, it needs to use m levels of partitioning until the partitioned constellations are finally 2-ary constellations. In SPT, the number of levels and the size of the partitions can be decided as desired.
3. Ungerboeck's set partitioning allows the resulting codes to achieve higher MSED values from a single coded stream. In SPT, due to the use of multiple coded streams, much higher MSED values than those achieved by set partitioning in Ungerboeck codes can be achieved. Further, SPT schemes can maintain different MSED values for different streams with some streams with much higher than the others.
4. Comparing with SPT coded schemes disclosed herein, Ungerboeck codes can be considered as 1-level SPT schemes. The SPT technology disclosed herein is focused on N-level SPT schemes with N≥2.

Note that the SSPC block shown in FIG. 2, which is referred to here as a basic SSPC block, describes how a single stream of packets can feed its packets in a structured manner onto all ($M_1$+1) streams of a 2-level SPT. The same basic SSPC block in FIG. 2 can be used repeatedly in a N-level SPT with N>2 to transmit a single stream of packets using a N-level SPT scheme and feed packets on that single stream in a structured manner onto $N_T$ number of different streams of that N-level SPT scheme. FIG. 7 shows the construction of a super SSPC (S-SSPC) block, constructed using a number of the basic SSPC blocks shown in FIG. 2 and changing their $M_1$ value appropriately, to feed a single stream of packets into a N-level SPT when N>2. Note that a basic SSPC block in FIG. 2 is used in every partition. Since the constellation corresponding to all streams at levels 1 through (N−1) are partitioned, all streams at levels 1 through (N−1) of a N-level SPT require a separate basic SSPC as shown in FIG. 7. Hence, a N-level SPT scheme requires $$N_S = \left[1 + \sum_{i=1}^{(N-1)} \left(\prod_{j=1}^{i} M_j\right)\right]$$

number of basic SSPC blocks on streams at levels 1 through (N−1) to construct a S-SSPC block when a single stream of packets is used with a N-level SPT scheme to feed the packets in a structured manner into $N_T$ streams of that N-level SPT.

In some embodiments in multimedia type applications may require to transmit a number of streams, $N_P$, which is smaller than the number of streams of the SPT, $N_T$, i.e., $N_P < N_T$. In such embodiments, a modified S-SSPC block can be constructed using the same basic SSPC block in FIG. 2. In such applications, the construction of the S-SSPC shown in FIG. 7 can be modified to be used with a N-level SPT depending on the values of $N_P$ and $N_T$. For example, consider an embodiment in a multimedia application that has three separate streams of packets in the application ($N_P$=3). For example, these three streams could be video, audio and data. Let us consider that the application uses a 2-level SPT with $m_1 = m_2 = 2$ that employs a 16-QAM constellation. As described before, that 2-level SPT has one level-1 stream and four level-2 streams with a total of $N_T$=5 streams. In order to use this 2-level SPT for the application that has three streams, two separate basic SSPC blocks can be used as shown in FIG. 8 to construct a S-SSPC. As shown in FIG. 8, the first stream of the application is assigned to the level-1 stream of the SPT, the first two level-2 streams are generated by the second multimedia data stream using a basic SSPC block, and similarly the last two level-2 streams are generated by the third multimedia data stream using a second basic SSPC block.

Another preferable way to transmit information in a multimedia application is to assign each level to a different signal type. As a second example, consider a multimedia application that transmits voice and data. Such an application can use a 2-level SPT that employs the 4-ary overall constellation shown in FIG. 1 to transmit data over stream 1 and to transmit voice over streams 2 and 3 at level 2 as shown in FIG. 9 by using a basic SSPC block at level 2 to feed voice packets into streams 2 and 3 in a structured manner. As a third example, consider a 3-level SPT constructed with a 16-QAM overall constellation. Assume that the 3-level SPT is constructed by partitioning according to $M_1$=4, $M_2$=$M_3$=2, $m_1$=2 and $m_2$=$m_3$=1. This 3-level SPT has one level-1 stream, four level-2 streams and eight level-3 streams. Consider the use of the above 3-level SPT for the transmission of three separate signals in a multimedia application. This can be done by feeding the three different multimedia data signals to streams at levels 1, 2 and 3 with the help of two basic SSPC blocks as shown in FIG. 10.

Therefore, a S-SSPC block can be constructed using the basic SSPC block shown in FIG. 2 to generate all $N_T$ different streams of a STP scheme using a single stream of packets or any number of $N_P$ ($<N_T$) streams of packets. It is noticed that the S-SSPC block in FIG. 7 and the basic SSPC block in FIG. 2 can be used in other applications different from SPT encoding to combine different streams of operations. Specifically, a SSPC block can be used in any embodiment that needs to feed portions of one or few onto different parallel streams regardless of the specific operation (or operations) on the different parallel streams.

The SPT signaling technique disclosed herein can also be applied to constellations constructed using multiple orthogonal or nearly orthogonal dimensions. These dimensions can be formed in time domain, frequency domain, spatial domain, polarization domain, etc. For example, let us consider two frequencies in OFDM (orthogonal frequency division multiplexing) scheme where each frequency employs a 16-QAM constellation. As a result, the two tones jointly employ a 256-ary constellation. Therefore, the SPT technology disclosed herein can be applied to the joint 256-ary constellation by considering that joint 256-ary constellation as the overall constellation and partitioning it as described before to create different levels of the SPT. Similarly, the overall constellation in SPT can be constructed by considering multiple time intervals (separated in time domain) and multiple antennas (separated in spatial domain). Therefore, the SPT technology disclosed herein can be applied to overall constellations used in isolation or to overall constellations formed by combining constellations used in isolation that are separated in different orthogonal or almost orthogonal domains. These separations can be in time domain, frequency domain, spatial domain, polarization domain, etc.

FIG. 11 shows the decoding of a N-level SPT by extending the decoding of 2-level SPT shown in FIG. 4. The decoding of level-2 streams in FIG. 4, highlighted in FIG. 4, is referred to as a basic higher level decoding. Basic higher level decoding is used multiple times for the decoding of a N-level SPT as shown in FIG. 11. The decoding starts by extracting the LLR values (bit metrics) of the bits on the stream at level-1 (stream 1). Once a packet of stream 1 is complete, decode that packet and verify that the decoding is correct. Preferably, a CRC can be used to verify that the decoding has correctly decoded each of its packets. In case stream 1 decoding fails to correctly decode, request re-transmission of that packet. Once a packet of the stream at level-1 has been decoded correctly, based on that decoded bits in blocks of $m_1$ bits, identify the level-2 partition and the corresponding level-2 stream that fed the level-2 bits ($m_2$ of them) of each symbol. Then calculate the LLR values of level-2 bits using the received signal on the identified level-2 partition. Once any packet at level-2 is complete, decode that level-2 packet and verify that the decoding was correct by preferably using a CRC. Using blocks of $m_2$ bits on the correctly decoded level-2 stream, identify the level-3 partition within the previously identified level-2 partition and the corresponding level-3 stream. Calculate the LLR values of $m_3$ level-3 bits of the respective symbols using the received signal on that identified level-3 partition. Continue this process up to level-N packets until all packets are decoded. Note that packets of a N-level SPT are decoded as they are completed and not in any particular order. Specifically, anytime all bit metrics of a packet become available, that packet is decoded. When a packet at levels 1 through (N−1) is decoded, verify that packet is decoded correctly by preferably using a CRC. All packets at level-N can optionally use a CRC but they are not required to do so as there are no higher levels that dependent on the decisions of those packets. As described before with a 2-level SPT, an artificial terminating packet can be used at the end on stream 1 to transmit the remaining bits of all packets at levels 2 through N. The received signal corresponding to the artificial terminating packet is used to extract the LLR values of all the remaining bits of partially transmitted packets on streams at levels 2 through N.

When a SSPC is used at the transmitter, the receiver can automatically identify the order of the packets fed into the SSPC at the transmitter by decoding all streams of the SPT. The decoder adopts a policy similar to that the SSPC adopted at the transmitter. Specifically, the SPT can recover the order of the packets, that was fed to the SSPC at the transmitter, correctly by assigning the decoded packets a packet number starting from according to the following rules: (a) assign the lowest possible packet number to the packet that is just starting to fill-in on any stream, (b) if more than one stream have packets starting in the same interval, assign the lower packet number to the packet on the stream with the lower stream number. When packets are decoded correctly on all streams at levels 1 through (N−1) of a N-level SPT, the above rules will arrange the packets in the same order that was fed to the SSPC at the transmitter.

So far decoding of any N-level SPT has been described by verifying the decoding of all packets on streams at levels 1 through (N−1). As described before, they can be verified preferably by using a CRC on each of the streams at levels 1 through (N−1). Optionally, SPT decoding can be done without verifying any decisions at levels 1 through (N−1). One option is to assume that the decoding of packets on stream 1 is always correct. This assumption can be mostly correct if the code used on stream 1 is a very powerful low rate code. However, any errors on stream 1 would distribute the LLR values of bits on streams other than stream 1 incorrectly into different streams at levels 2 through N. This incorrect distribution of LLR values causes decoding errors and misinforms the receiver the times at which the packets on streams at levels 2 through N end. Such a SPT scheme that does not check the decoding of packets on streams 1 through (N−1) can be improved by signaling to the destination anytime a packet on streams at levels 2 through N complete. Similar control signals are commonly transmitted over a separate control channel in practical systems such as in the 4G LTE system. For example, consider a 2-level SPT that employs the 4-ary constellation in FIG. 1 as described before. This 2-level SPT has one level-1 stream (stream 1) and two level-2 streams (streams 2 and 3) and uses $m_1=m_2=1$. Further, as described before with FIG. 1, stream 2 is assigned to a bit "zero" from stream 1 and stream 3 is assigned to a bit "one" from stream 1. For example, let us assume that each packet is 100 bits long. Suppose that a packet on stream 1 was decoded with errors which were however not checked by a CRC or by using any other method. When the LLR values of streams 2 and 3 are determined based on the decoded stream 1 using the respective partitioned constellations, due to errors on stream 1, it is most likely that the end of packets on streams 2 and 3 will be determined at the receiver incorrectly. However, the additional control signal that informs the receiver when packets on streams 2 and 3 end can be used to adjust the decoding on stream 1 so that the packets on streams 2 and 3 end at the correct times. Specifically, the receiver can make the most likely decision as to how many zeros are decoded in favor of ones, or how many ones are decoded in favor of zeros on stream 1. Then the receiver can go back to the decoding of frames in stream 1 and make the required number of changes in the least reliable positions of that decoded sequence on stream 1. For example, if the receiver is informed that stream 2 has just completed its frame when the receiver has calculated only 98 LLR values of the packet of stream 2 based on the decoded stream 1, it is most likely that two zeros on stream 1 have been incorrectly decoded as ones. At that point go back to the decoded stream 1 and identify the two ones on that decoded stream 1 with the lowest LLR values and flip them to zeroes. Then re-distribute the LLR values of the second bits of the symbols to align with the end of the packet of stream 2.

Even though both MLC schemes and SPT schemes employ multiple levels, SPT schemes differ from MLC schemes by employing multiple streams at all levels above the first level. The use of multiple streams at the second and higher levels allows those levels to employ higher rate codes and achieve the highest possible MSED for each higher level. For example, let us consider the constellation in FIG. 1. If the second bit of every symbol is always selected from a single second level stream as in a regular MLC scheme, the 3 dB advantage for the second levels streams achieved by the SPT scheme is not achieved. Therefore, the SPT schemes, by employing multiple streams at second and higher levels can achieve the highest possible MSED at each of those higher level streams.

It is important to note that the transmission rates on different streams of a SPT can vary from stream to stream. In fact, only the level-1 stream (stream 1) of any N-level SPT scheme has a fixed transmission rate, and the transmission rates on all other streams are random and they can vary from one transmission to the other. However, the average transmission rate on streams at levels 2 through N can be found based on the formation of symbols and the number of streams. For example, consider again the 2-level SPT that employs the 4-ary overall constellation shown in FIG. 1. This 2-level SPT employs one level-1 stream (stream 1) and two level-2 streams (streams 2 and 3). As discussed before, every symbol is formed by one bit from stream 1 and one bit from streams 2 or 3. Therefore, the average transmission rate on streams 2 and 5 is 50% of the transmission rate of stream 1. Therefore, when used for a multimedia application, streams of a SPT scheme can be assigned to different types of signals depending on the required data rates on those signals. Since, the code rate employed on streams 2 through 5 is higher than that on stream 1, the actual message transfer rate on streams 2 and 3 can be significantly higher than 50% of the message transfer rate on stream 1. Further, by appropriately employing SSPC units to combine different streams of a SPT, it is possible to achieve different desired rates on different signals of a multimedia application using a SPT.

Even though the SPT technology has been described using packets of the same size on all streams, the packet size can vary in a SPT. Specifically, the packet size can vary from one stream to the other or it can vary from packet to packet on any given stream. The basic SSPC block or the S-SSPC block described before does not impose any conditions on the packet size of different packets. Therefore, the basic SSPC block or the S-SSPC block described before can be used when the packet sizes vary from stream to stream or from packet to packet on the same stream or when all streams vary the packet size from packet to packet independently.

As stated before a SPT scheme employs $N_T$ number of streams. During each interval $N(<N_T)$ number of streams are selected to form the symbol transmitted during that interval. In order to select N streams out of $N_T$ streams, the SPT schemes discussed so far employ partitions of the overall constellations. However, other strategies can also be adopted in a SPT scheme disclosed herein to select N streams out of $N_T$ streams during each interval. For example, different combinations of N streams that can be employed during different intervals can be pre-selected from a bank of allowed selections of N streams. If desired these selections can be varied from interval to interval in a cyclic manner. Therefore, the SPT technique is considered as a technique that chooses N number of streams out of a total of $N_T$ streams in the scheme to form the symbol transmitted during each interval.

The present application also discloses an implicit packet transmission (IPT) technique to transmit a stream of packets by transmitting the bits of that stream implicitly along with a stream of packets that is transmitted explicitly over a channel. The IPT technique can be combined with the SPT technique by applying the IPT technique to all or selected streams of a SPT scheme. The IPT technique employs two separate streams (a) an explicit stream, which is the intended transmitted stream and (b) an implicit stream which is transferred to the destination implicitly along with the explicit stream. The IPT technique teaches how an explicit stream can be combined with an implicit stream so that the implicit stream gets transferred to the destination implicitly without increasing the length of the explicit stream.

Let us describe the IPT technique starting with a binary coded explicit stream. In IPT, the coded explicit stream is altered based on the implicit stream prior to transmission. Specifically, the IPT technique disclosed herein inverts (flips) p(<n) bits out every n bits of the explicit stream before transmission, where p and n are positive integers. In other words, in every block of n bits of the explicit stream, p bits are selected and inverted prior to transmission. In the IPT technique disclosed herein, these p bits are selected based on the bits on the implicit stream. For example, when p=1 and n=16, one out of every 16 bits of the explicit stream is selected according to $n_s=4$ bits of the implicit stream and that selected bit is inverted before transmission. Note that the total number of bits transmitted is not changed due to the implicit bit stream. Note also that no bits of the implicit stream are directly transmitted over the channel. However, the information about the implicit bits is conveyed through the location of the bit that is inverted before transmission. Hence, in this example, for every four packets transmitted over the explicit stream, one packet is transferred implicitly to the destination from the implicit stream thereby increasing the overall throughput by 25%. It is also important to note that in IPT, all operations on the physical channel, such as the bandwidth, modulation technique, synchronization technique, demodulation technique, etc., can remain exactly the same as if only the explicit stream is transmitted. In general, if p bits out of every n bits are selected and inverted before transmission, $$n_s \le \log_2 \binom{n}{p}$$

number of bits of the implicit stream can be transferred implicitly to the destination in every block of n bits of the explicit stream using the IPT technique, where, $$\binom{n}{p}$$

represents the number of ways p bits can be chosen from n bits.

If necessary both explicit data stream and the implicit data streams of a IPT scheme can be generated from a single data stream. This can be done by generating the two streams using a basic SSPC in FIG. 2 as described before. Unlike in SPT, the transmission rate on the implicit data stream of a IPT is fixed compared with the transmission rate on the explicit data stream. Specifically, when explicit stream transmits n bits, the implicit stream is guaranteed to transmit $n_s$ bits. Therefore, it is also possible to arrange packets to feed them into the explicit and implicit streams without using a basic SSPC block. For example, consider the IPT scheme with n=16, p=1 and $n_s=4$ discussed before. When packets of same length are transmitted on both explicit and implicit data streams, packets can be fed to the IPT encoder 5 packets at a time. Four of those five packets (preferably packets 1 through 4) can be fed to the explicit stream while the other packet (packet 5) can be fed to the implicit code. Instead, if a basic SSPC block is used according to the same operating rules as discussed before, out of the same five packets, packet 2 would be fed to the implicit data stream while the other four packets would be fed to the explicit data stream. Therefore, in an IPT it is possible to use a basic SSPC block to generate both of its explicit data stream and its implicit data stream from a single data stream, or the packets can be fed according to a preselected rule based on the transmission rates on the two streams.

The inversion of p bits in every block of n bits is equivalent to generating an error sequence e of length n with Hamming weight p and adding that error sequence to the n bit long coded sequence of the explicit stream v, where the Hamming weight of a sequence which is also referred to as the weight in this document is the number of ones in the sequence. In other words, in every block of n bits of the explicit stream v, an n-bit long error sequence e with weight p is selected based on $n_s$ bits of the implicit stream, $v_{Im}$, and that error sequence e is added to the n-bit long block of the explicit stream v before transmission to obtain the transmitted sequence $v_s=v\oplus e$, where $\oplus$ denotes the exclusive OR operation. FIG. 12 shows the encoder of an IPT scheme that employs an explicit code $C_{Ex}$ on the explicit stream and an implicit code $C_{Im}$ on the implicit stream. The mapper M maps each $n_s$-bit long sequence $V_{Im}$ onto an error sequence e which is added to the corresponding n-bit long coded sequence v of the explicit code to form the n-bit long transmitted sequence $v_s$. As a result, for every n-bit sequence transmitted explicitly, the implicit sequence transmits $n_s$ bits implicitly. The mapper M can be easily implemented when p=1 and $n=2^{n_s}$ which needs to map every $n_s$-bit long coded sequence $v_{Im}$ onto a unique n-bit long error sequence e with weight one. The position of the single '1' in the error sequence can be easily found as $[1+\text{dec}(v_{Im})]$, where, $\text{dec}(v_{Im})$ represents the decimal value of the $n_s$-bit long implicit sequence $V_{Im}$. When p>1, the mapper M can be designed to map each sequence of $V_{Im}$ onto an error pattern with weight between 1 and p uniquely in any particular order. As seen from FIG. 12, for every n bits transmitted over the channel carries information of n coded bits of the explicit stream and $n_s$ coded bits of the implicit stream. If the rate of the explicit code $C_{Ex}$ is $R_{Ex}$ and the rate of the implicit code $C_{Im}$ is $R_{Im}$, the overall throughput is increased by a factor $R_{Im}n_s/(nR_{Ex})$ by using the IPT technique.

In an IPT scheme, it is important to properly select the values of p and n depending on the power of the code $C_{Ex}$ used on the explicit stream. Specifically, values of p and n should be selected to ensure that $C_{Ex}$ can decode the explicit coded stream reasonably well even after adding the error sequence which inverts some of its bits. The easiest way to design an IPT scheme to achieve the highest $n_s/n$ ratio is to find the smallest value of n (which is a power of 2) so that the explicit code $C_{Ex}$ on the explicit stream can still be able to decode the explicit stream reasonably well with a single bit inversion of the transmitted sequence, and then use that value of n and the corresponding value of $n_s=\log_2 n$ to design the IPT scheme as illustrated in FIG. 12. Since p=1, as described before, the design of the mapper M in that embodiment becomes very easy.

So far the IPT technique is described to alter every n coded bits of $C_{Ex}$ by adding an n-bit long error sequence generated based on the $n_s$-bit long coded bits of $C_{Im}$. However, the alternation of the coded bits of $C_{Ex}$ in an IPT scheme disclosed herein can be also done in other ways instead of adding an error sequence to it. For example, these alterations can be done according to any linear or non-linear operation that would alter the coded sequence of $C_{Ex}$ based on the coded sequence of $C_{Im}$. Some of these operations can even slightly increase the length of the coded stream of $C_{Ex}$. However, the total length of the altered sequence should be less than the sum of the lengths of the twp coded sequences of $C_{Ex}$ and $C_{Im}$. The alternation in the coded sequence of $C_{Ex}$ is done so that the receiver can use the received version of the transmitted altered coded sequence of $C_{Ex}$ to recover both the coded sequences of $C_{Ex}$ and $C_{Im}$ separately.

FIG. 13 shows the decoding algorithm of IPT signals to decode both the explicit coded stream and the implicit coded stream using soft iterative decoding. Since the decoding of explicit and/or implicit codes could require iterative decoding, such as the decoding of the turbo code employed in the 4G LTE system, the iterations between the explicit and implicit codes are referred to here as IPT iterations. Throughout the decoder, it is necessary to handle the soft information transfer from the exclusive OR operation (the modulo-2 addition) denoted by $\oplus$ which was performed during encoding as shown in FIG. 12. Specifically, if $z=(x\oplus y)$, the LLR value of z, L(z), can be found using the LLR of x, L(x), and the LLR of y, L(y), as $$L(z) = \log\frac{P(z=1)}{P(z=0)} = \log\frac{P(x=1, y=0) + P(x=0, y=1)}{P(x=0, y=0) + P(x=1, y=1)} =$$

$$\log\frac{P(x=1)P(y=0) + P(x=0)P(y=1)}{P(x=0)P(y=0) + P(x=1)P(y=1)} =$$

$$\log\frac{\exp(L(x))P(x=0)P(y=0) + \exp(L(y))P(x=0)P(y=0)}{P(x=0)P(y=0) + \exp(L(x))\exp(L(y))P(x=0)P(y=0)}$$

$$= \log\frac{\exp(L(x)) + \exp(L(y))}{1 + \exp(L(x))\exp(L(y))} \tag{1a}$$

$$\approx -\text{sign}(L(x)L(y))\min(|L(x)|, |L(y)|) \tag{1b}$$

Since x, y and z are all binary values, $z=(x\oplus y)$ leads to $y=(x\oplus z)$ and $x=(y\oplus z)$. Hence, equations (1a) or (1b) can be used to calculate the LLR value of any one of the three bits x, y or z when those of the other two are known. The above equations (1a) or (1b) are used with LLR values of any kth coded bit v(k) of the explicit stream, L(v(k)), any kth error bit e(k), L(e(k)), and kth transmitted bit $v_s(k)$, L(v(k)), throughout IPT iterations. Note that equations (1a) or (1b) operate on a bit by bit basis thereby lowering the decoding complexity. Specifically, since $v_s(k)=v(k)\oplus e(k)$, equations (1a) or (1b) can be used to find the LLR value of either L(v(k)) or L(e(k)) or L(v(k)) when the LLR values of the other two are known.

IPT iterative decoding algorithm consists of the following steps:

1. Using the received signal, extract the LLR values of the transmitted bits, $v_s(k)$, L(v(k)), k=1, 2, . . . , N, for all N bits transmitted in a frame. The values L(v(k)), k=1, 2, . . . , N, are also commonly known as channel information or the received bit metrics. The extraction of bit metrics from the received signal is well documented in the literature (Imai). Note that step 1 in regular IPT decoding is done only once to extract the bit metrics and the same set of L(v(k)), k=1, 2, . . . , N, values are used throughout the IPT iterations. However, if the IPT technique is combined with BICM or CICM to improve performance that require updating the bit metrics on the constellation, step 1 needs to be included in the iterative process as in standard BICM with iterative decoding.

2. Using L(v(k)) values found in step 1, and any soft information available for the error bits, L(e(k)), k=1, 2, . . . , N, calculate the LLR values of the coded bits of the explicit code v, L(v(k)), k=1, 2, ..., N using either equation (1a) or (1b). Note that in the first iteration all L(e(k)) values are zero, and hence, L(v(k))=L(v(k)), k=1, 2 ..., N.

3. Using the L(v(k)), k=1, 2 ..., N, values obtained in step 2, decode the explicit code $C_{Ex}$ to obtain the update the LLR values of the explicit coded sequence L(v(k)), k=1, 2, ..., N.

Note that in the first iteration decoding of $C_{Ex}$ in step 2 has no useful information about the error bits introduced due to the inverted bits prior to transmission. Therefore, the decoded bits of the explicit code in the first IPT iteration have a lower reliability compared with the case when explicit coded bit stream v is transmitted without inverting any of its bits. However, the values of n and p can be selected in the design of the IPT so that the decoded bits of the explicit code v in the first IPT iteration are still reasonably reliable. In other words, the values of p and n are chosen so that the values of L(v(k)), k=1, 2 ..., N, in the first iteration reasonably well resemble the actual coded explicit sequence v.

4. Using the LLR values of the transmitted bits, L($v_s$(k)), k=1, 2, ..., N, found in step 1 and those the of the explicit code, L(v(k)), k=1, 2 ..., N, found in step 3, obtain LLR values of the error bits e(k), L(e(k)), k=1, 2 ..., N, on a bit by bit basis using either equation (1a) or (1b).

5. Use the de-mapping policy $M^{-1}$ that de-maps blocks of n-bit long the error sequences onto blocks of $n_s$-bit long implicit coded sequences to obtain the LLR values coded bits of $v_{Im}$. Note that the de-mapper de-maps every valid n-bit long error sequence $e_k$=($e_k$(1), $e_k$(2), ..., $e_k$(n)) onto a unique $n_s$-bit long block of $v_{Im}$, $v_{Im,k}$=($v_{Im,k}$(1), $v_{Im,k}$(2) ..., $V_{Im,k}$($n_s$)) k=1, 2 ..., $2^{n_s}$. Therefore, the calculation of L($v_{Im,k}$(l)), l=1, 2, ..., $n_s$ is similar to decoding a linear block code [Shu Lin]. Specifically, in every kth block of $n_s$ bits of $v_{Im,k}$ and the corresponding n-bit long block of $e_k$ perform the following two steps: (a) using L($e_k$(j)), j=1, 2 ..., n, values calculate a metric $A_k$, k=1, 2 ..., $2^{n_s}$, for each valid error sequence $e_k$, and (b) from the de-mapping policy $M^{-1}$, calculate the LLR value of each implicit coded bit. L($v_{Im,k}$(l)), l=1, 2, ..., $n_s$, within that kth block of $n_s$ bits of $v_{Im}$. Upon completion of step 5 for all blocks of $n_s$ bits of the implicit stream $v_{Im}$, all LLR values of $v_{Im}$, L($v_{Im}$(1), L($v_{Im}$(2), ..., L($v_{Im}$(N'), where $$N' = N\left(\frac{n_s}{n}\right)$$

is the total number of coded bits transmitted within the frame.

6. Soft decode $C_{Im}$ and update the LLR values of each coded bit L($v_{Im}$(l), l=1, 2 ..., N'.

7. Perform the reverse operation of step 4 to obtain the LLR values of the error bits from the LLR values of $v_{Im}$ obtained in step 6 according to the mapping policy M on a block by block basis. Note that the mapper maps every kth $n_s$-bit long block of $v_{Im}$, $v_{Im,k}$=($v_{Im,k}$(1), $v_{Im,k}$(2), ..., $v_{Im,k}$($n_s$)) onto a n-bit long error sequence $e_k$=($e_k$(1), $e_k$(2), ... $e_k$(n)), k=1, 2 ..., $2^{n_s}$. Specifically, in every kth block of $n_s$ bits of $v_{Im}$, perform the following two steps: (a) using L($v_{Im,k}$(l)), l=1, 2, ..., $n_s$, calculate a metric $\Lambda_k$, k=1, 2 ..., $2^{n_s}$, for every combination $v_{Im,k}$, k=1, 2 ..., $2^{n_s}$, and (b) using the mapping policy M calculate an updated LLR of each error bit $e_k$(j), L($e_k$(j)), j=1, 2 ..., n. Upon completion of step 7 for each block of $n_s$ bits of $v_{Im}$, the updated LLR values of e, L(e(1)), L(e(2)), ..., L(e(N)) are available.

8. Go back to step 2 for the next IPT iteration.

Note that after running several IPT iterations according to steps 1 through 8 listed above, the decoding of $C_{Im}$ in step 6 would most likely have a very few or no errors. Therefore, at that point, the above algorithm can be modified to obtain a hard decoded sequence $v_{Im}$ from the LLR values of $v_{Im}$ obtained in step 6. Then use that hard decoded sequence $v_{Im}$ in step 7. As a result, step 7 would simply reduce to selecting the n-bit long error sequence according to the mapper M corresponding to each of the $n_s$ bit long segments of $v_{Im}$ obtained in step 6. In order to differentiate this modification, above described IPT decoding algorithm is referred to as the "initial IPT decoding algorithm", and the algorithm with the modification in steps 6 and 7 discussed above is referred to as the "modified IPT decoding algorithm". Hence, IPT iterative decoding disclosed herein can preferably run a preselected $N_1$ number of initial IPT decoding iterations followed by a preselected $N_2$ number of modified IPT decoding iterations. The values of $N_1$ and $N_2$ can be chosen depending on the component codes $C_{Ex}$ and $C_{Im}$, and the frame length to achieve best performance.

Similar to SPT schemes described before, the IPT schemes can also employ different packet sizes and different powers of codes on the explicit and implicit streams. For example, when n=16, k=1 and $n_s$=4, by choosing the packet size on the implicit stream to be 25% of the packet size on the explicit stream, when a packet on the explicit stream is complete, the packet on the implicit stream will also complete. Therefore, the IPT scheme can start decoding both the packet on the implicit stream and the packet on the implicit stream as soon as the receiver completes receiving the transmitted packet. Since the IPT decoder described above uses iterative decoding to decode both the packet on the explicit stream and that on the implicit stream jointly, the explicit code $C_{Ex}$ helps the decoding of the implicit code $C_{Im}$ and vice versa. Therefore, the power of the code $C_{Im}$ can be reduced since the power of the code $C_{Ex}$ helps decoding the packet on the implicit stream. Therefore, IPT embodiments can employ $R_{Im}$>$R_{Ex}$, or $R_{Im}$=$R_{Ex}$, or even $R_{Im}$<$R_{Ex}$.

In another aspect, the present application discloses a technique for using CICM with LDPC codes. Since most current communications systems today employ LDPC codes, it is highly desirable to be able to apply the CICM technique to LDPC codes and as a result to be able to transmit LDPC coded bits using higher order modulation while performing better than if they were to be transmitted using a lower order modulation scheme. In addition, it would be highly desirable for such a LDPC coded scheme with CICM to be able to process one LDPC codeword at a time thereby eliminating any increase in decoding delay and memory. If CICM can be applied to a single codeword of a LDPC code, its coded bits could potentially be transmitted using 16-QAM or even 64-QAM modulation while performing better or similar to employing QPSK modulation for transmission. As a result, application of CICM to LDPC codes can potentially more than double the transmission rate. In accordance with this aspect of the present application, a simple method of applying CICM to LDPC codes is presented while decoding one codeword of the LDPC code at a time.

A LDPC code can be viewed as a long code that has a collection of a many single parity check (SPC) codes. Each parity check is formed by a few variable nodes (represented by coded bits) and one check node, where, each check node receives information from several other variable nodes. Effectively, each row of the parity check matrix H of a LDPC code corresponds to a SPC code of that LDPC code. As a result, a LDPC code inherently contains a large number of short SPC codes in it. Since the CICM technique requires consideration of a large number of codewords, these short SPC codes can be used as the required codewords in the application of CICM. As a result, CICM can be applied to a single codeword of the LDPC code without having to consider multiple codewords of it.

In order to describe how the CICM technique can be applied to LDPC codes, let us consider a general LDPC code with n variable nodes (VNs), denoted by $v\_i=1, 2, \ldots, n$, and L check nodes (CNs), denoted by $c\_j, j=1, 2, \ldots, L$. Let us denote the set of ki connections stemming from any general VN vi to its associated CNs, denoted by $c\_j\_1(i), c\_j\_3(i), \ldots, c\_j\_k\_i(i)$. Similarly, let us denote the set of el_j connections stemming from any general check node c_j to its associated VNs denoted by $v\_i\_1(j), v\_i\_2(j), \ldots, v\_i\_el\_j(j)$.

As with block codes, it is assumed in the application of CICM to LDPC codes that errors would be limited to only a small number of coded bits as SNR increases. Specifically, it is assumed that the errors are limited to a set of variable nodes formed by starting from any single variable node vi and (a) following all paths that emerge from vi to the check nodes, and (b) then considering each of those check nodes back to a set of variable nodes. This set of variable nodes formed by the above steps (a) and (b) including vi, denoted by S_i, is the set of variable nodes referred to as the associated variable nodes (AVN) of the variable node vi. Therefore, in the application of CICM to LDPC codes, it is assumed that errors that occur are limited to a single Si as SNR increase. Following the above method, it is possible to obtain the corresponding set of AVN for each variable node vi, $i=1, 2, \ldots, n$. The set of AVNs, $S\_i=1, 2, \ldots, n$, are used to design the required CICM Interleaver. The goal of the CICM Interleaver is to place each coded bit of every AVN in different transmitted symbols of the $2^m$-ary constellation used for transmission. First notice that in order to transmit n coded bits using a $2^m$-ary constellation, it is necessary to use W=n/m symbols. Therefore, the aim of the CICM Interleaver in LDPC codes is to place the coded bits (variable nodes) in a m by W 2-dimensional array, called the symbol array (SA), with m rows and W columns with the aim of forming m-bit long symbols along columns to form W symbols for transmission. The objective of this CICM Interleaver is to satisfy the following condition:

no two coded bits of every Si, $i=1, 2 \ldots, n$, are placed in the same column of the SA.

However, in situations where it is impossible to satisfy the above condition, the Interleaver can be preferably designed to maintain that the coded bits of each Si are placed in as many columns as possible in the SA.

There can be many valid SAs that satisfy the above condition for all Sis, $i=1, 2 \ldots, n$. In the design of the SA, the goal is to find one such valid SA that satisfies the above condition. Many search algorithms can be developed to search for a valid SA starting from the set of Sis of a given LDPC code with n coded bits and a given value of m. One such strategy would be to place coded bits in the SA with the aim of maintaining the number of unplaced coded bits of each Si about the same for all Sis while placing bits in the SA. This strategy allows more flexibility towards the end to fill out the remaining openings of the SA without violating the above condition. Whenever, bits are selected from each Si, they can be selected either randomly or in some systematic manner such as from left to right or from right to left. In failing to find a valid SA, the process can be repeated until a valid SA (or the best possible SA) is found. An alternate strategy would be to place one Si at a time in the SA. This can be preferably done starting with the Si that has the largest number of coded bits and moving down to the Si with the lowest number of coded bits. The hope in this approach is to have all remaining places of SA in the end to fit into all remaining shorter Sis without violating the above stated condition. Again, coded bits of each Si can be either randomly selected or systematically selected, and further, the search can be repeated until a valid SA that satisfies the above stated condition.

Another approach is to design the CICM Interleaver by following the method for block codes. In this approach, Sis are treated as separate codewords. However, an adjustment is necessary since the same coded bit can appear in many Sis whereas in case block codes all coded bits are separate. This can be overcome by removing all remaining (disregarding) appearances of the same coded bit from other Sis once that coded bit is placed in SA.

It is noted here that the Interleaver design is done once prior to transmission and hence time and effort in searching for a valid SA does not contribute to the decoding delay or decoding complexity. The generated symbols from the SA are then transmitted using a signal constellation that employs RGC.

In yet another aspect, the present application discloses a technique for decoding LDPC codes with CICM. In general, CICM decoding requires iterative decoding while involving the constellation during decoding iterations. Since LDPC decoding already uses iterative decoding, the same LDPC iterations can be used to include the constellation. However, the decoder needs to use the same CICM Interleaver used at the transmitter when transferring information from the variable nodes to the constellation and the corresponding de-Interleaver when transferring information from the constellation back to the variable nodes. Checking with the constellation could be done every iteration or every N'th iteration (N'>1) depending on the situation. For example, if N=20 LDPC iterations are used, the constellation could be included after every N'=5 iterations.

It should also be understood that the various different communication techniques disclosed herein, including but not limited to the SPT techniques, the IPT techniques, and the CICM techniques, could be utilized together in any of various manners.

It should be appreciated that many other features, applications, embodiments, and variations of the disclosed technology will be apparent from the accompanying drawings and from the following detailed description. Additional and alternative implementations of the structures, systems, non-transitory computer readable media, and methods described herein can be employed without departing from the principles of the disclosed technology.

BRIEF DESCRIPTION OF THE DRAWINGS

A further understanding of the nature and advantages the present disclosure may be realized by reference to the following drawings.

DETAILED DESCRIPTION

The technology disclosed herein can be used with any communication link that transmits a stream of data from the transmitter to the receiver. The data can be in the form of frames or packets of bits, or in the form of individual bits. These frames or packets of bits, or individual bits can be originated from different types of data signals such as those found in multimedia type applications. For example, these signals in a multimedia application can be video and voice, or voice and data, etc. The technology disclosed herein can also be used when multiple packets or bits that are originated from the same type of data signals, such as voice only or data only, etc. Therefore, the technology disclosed herein is applicable to any communication link that transmits multiple packets or multiple bits originated from the same data signal or different types of data signals. Therefore, the technology disclosed herein is applicable to practically all communication systems. Specifically, the technology disclosed herein can be applied on the uplink and downlink of the 4G LTE and 5G systems, the uplink and downlink of WiFi systems, transmission over the OTN, for the transfer of data between a cloud and a user in cloud computing, in communication links of internet of things, or any other system alike. The technology disclosed herein can also be applied in medical applications, for transferring information collected by a single or a collection of sensors to (a) medical devices using a wired or a wireless channel, or (b) to a smart phone for transmission to a remotely located physician, etc.

In one aspect, the technology disclosed herein includes at least two separate techniques: the SPT technique and the IPT technique. It also includes the SSPC unit. The SPT and IPT techniques enhance the overall throughput of a communication link. Both of these two techniques do not require any hardware modification in the actual transmission system. Instead, they both only require simple software modifications at the transmitter in the encoding of data and at the receiver in the decoding of data. Any communication link can employ either the SPT technique or the IPT technique individually or it can employ both the SPT technique and the IPT technique jointly to further enhance the throughput. The SSPC unit can feed a single stream of data into parallel streams in a structured manner. The parallel streams can process the data at different rates and speeds. Therefore, the SSPC unit can be used with a SPT scheme or an IPT scheme, or it can used with any parallel processing system where the processes can perform any operation. In SPT and IPT techniques, the operations are coding operations. Other operations that can employ SSPC include packaging, routing, scheduling, etc., which include distributing different tasks into different branches, divisions, etc.

Figure 14:
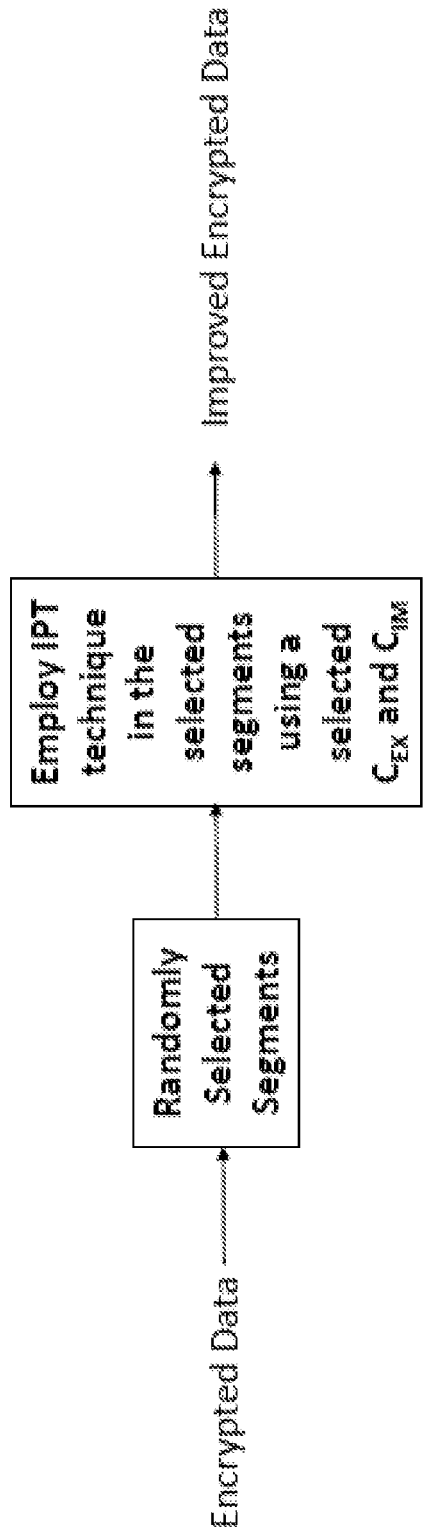
FIG. 14 shows designs illustrating exemplary methods in accordance with various aspects of the present disclosure.

One other important application of the IPT technique is in encryption and security of transmission. The IPT can be effectively employed in a communication link to add an extra layer of encryption by employing the IPT technique in selected portions of the entire data stream. The selected portions can be jointly decided by the transmitter and the receiver. FIG. 14 shows the structure of a communication link where IPT adds an extra layer of encryption to an already encrypted stream of data. The encrypted data using the first layer of encryption is divided into an explicit stream and an implicit stream in selected portions of the data stream. If an intruder is to recover the data stream correctly, the intruder first needs to know the portions of the stream that has employed the IPT technique. In addition, different implicit codes can also be used in the different portions in which the IPT technique is used to further improve security of the transmission. The same method can be used for secure data storage. The data can be stored as an IPT encoded signal which has an explicit and an implicit data stream. In addition, the IPT technique can be inserted in selected portions of the stored data to introduce a second layer of security of the stored data as described before. If an intruder is to recover the actual information from the stored data, the intruder would need to first know the portions where the IPT technique has been used and what explicit and implicit codes have been used in each of those portions to create those IPT signals. The IPT signal can be formed on an already encrypted data thereby making the IPT signaling portion to act as a second layer of security.

Figure 1:
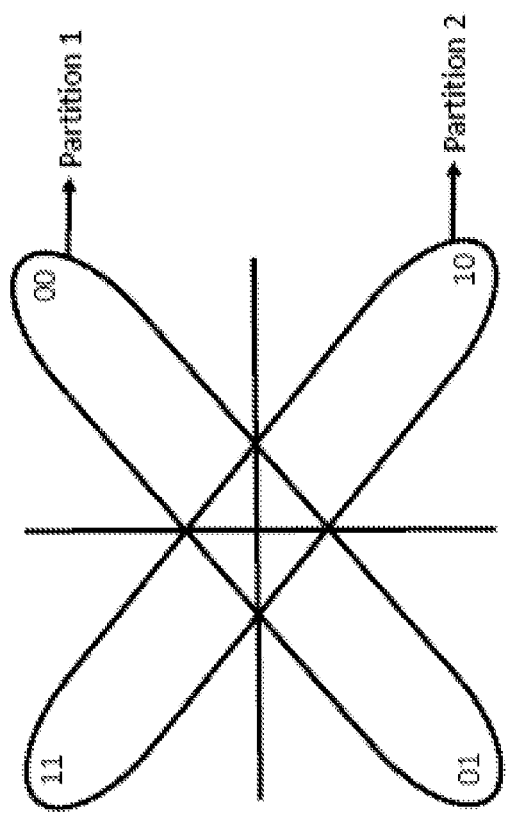
FIG. 1 shows designs illustrating exemplary methods in accordance with various aspects of the present disclosure.
Figure 2:
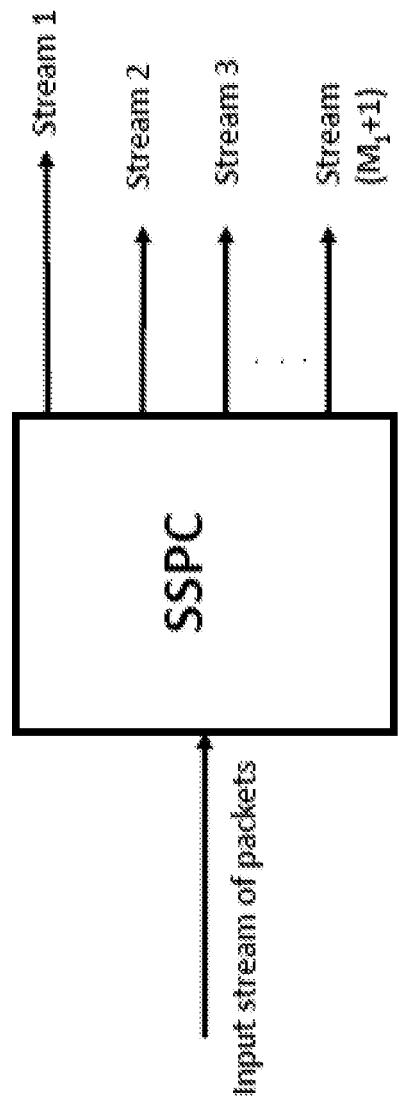
FIG. 2 shows designs illustrating exemplary methods in accordance with various aspects of the present disclosure.
Figure 9:
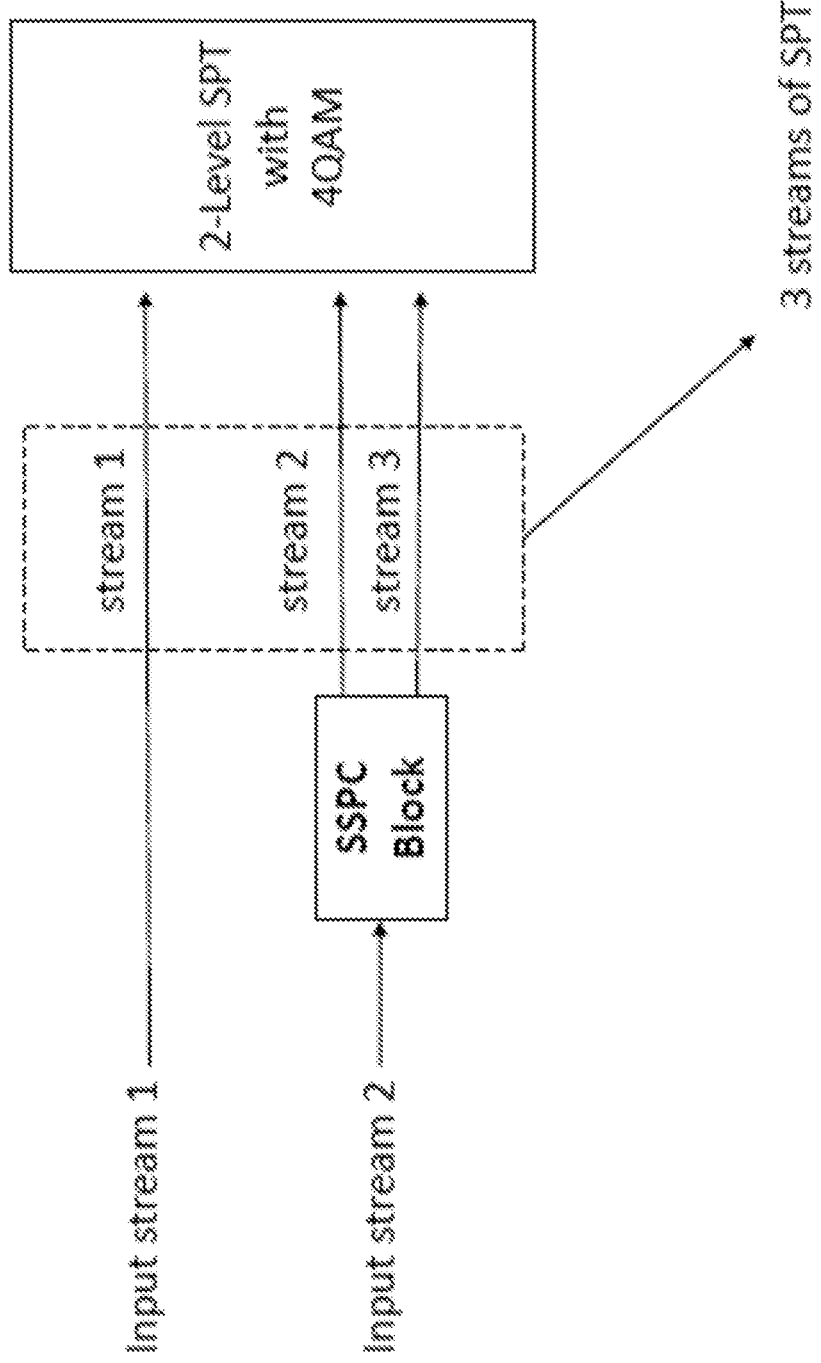
FIG. 9 shows designs illustrating exemplary methods in accordance with various aspects of the present disclosure.
Figure 10:
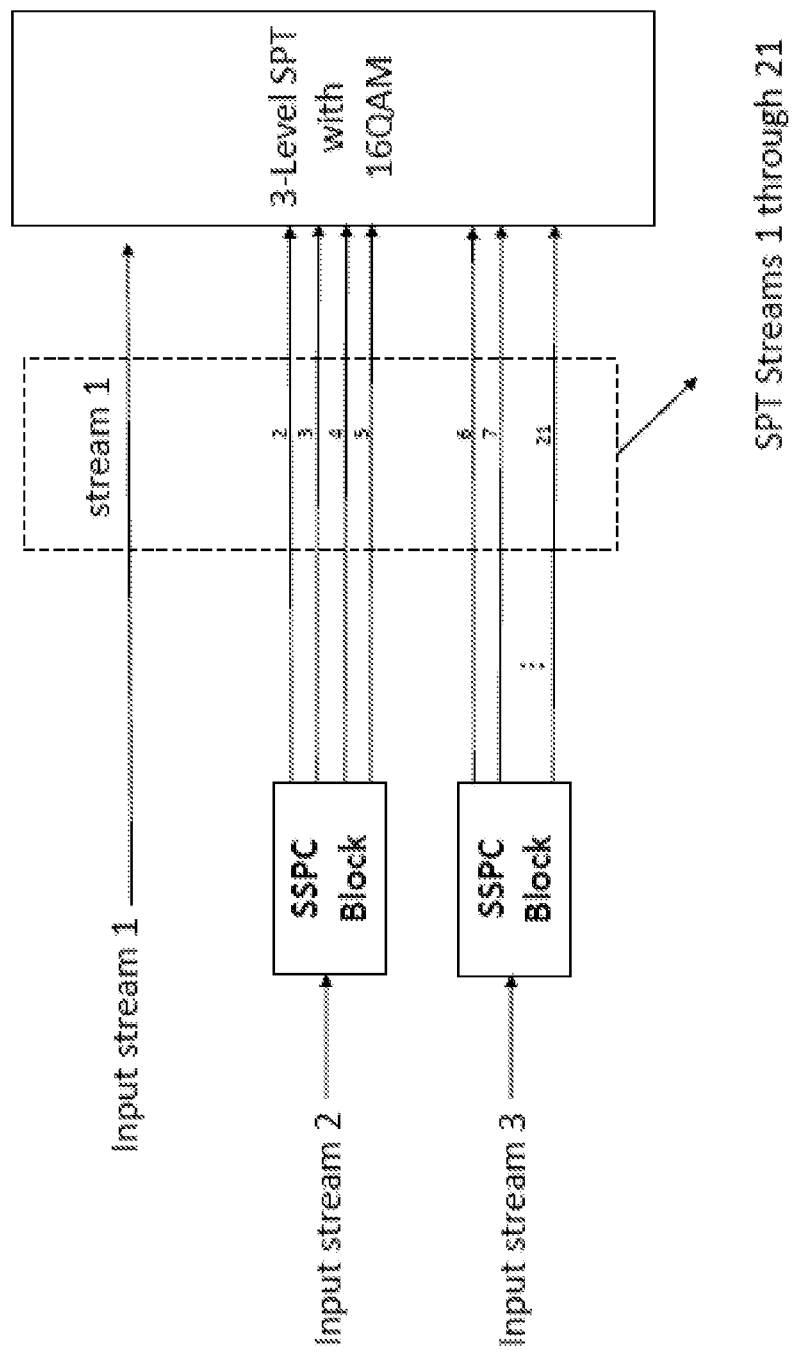
FIG. 10 shows designs illustrating exemplary methods in accordance with various aspects of the present disclosure.
Figure 11:
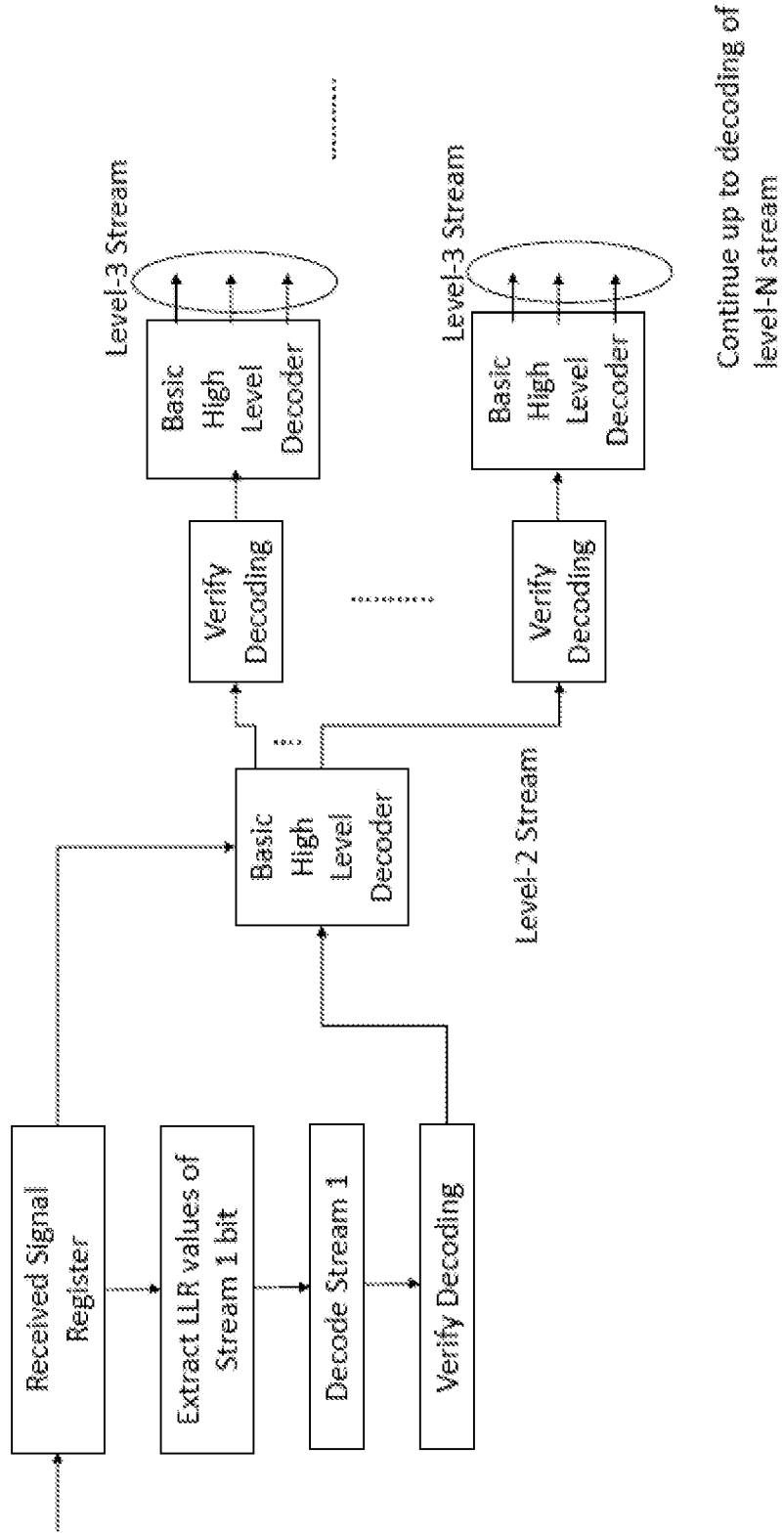
FIG. 11 shows designs illustrating exemplary methods in accordance with various aspects of the present disclosure.

Consider a 2-level SPT embodiment that employs three streams, streams 1, 2 and 3, and an overall 4-ary QPSK constellation and the mapping shown in FIG. 1. Such 4-ary constellations are very common in practice. For example, a 4-ary constellation shown in FIG. 1 is commonly used on the downlink of the 4G LTE when the channel between the base station and the user is weak. However, in most common signaling systems, such as in the current 4G LTE standard, Gray coding is commonly used instead of the mapping policy shown in FIG. 1. According to the SPT technique described before, a 2-level SPT embodiment shown in FIG. 6 with the signal constellation shown in FIG. 1 employs one first level stream (stream 1) and two second level streams (streams 2 and 3). The first bit of every symbol is taken from stream 1 while the second bit is taken from stream 2 if the first bit of the symbol is a "zero" and from stream 3 if the first bit of the symbol is a "one". The 4-ary overall constellation is partitioned into two 2-ary partitions as shown in FIG. 1. The partition 1 in FIG. 1 is assigned to stream 2 and is used when the first bit of every symbol is a "zero". Similarly, the partition 2 is assigned to stream 3 and is used when the first bit of every symbol is a "one". If all packets are of the same type, a basic SSPC block shown in FIG. 2 designed as described before can be used to systematically feed the packets into different streams of the SPT scheme. At the end of the transmission, as described before, an artificial terminating packet can be introduced on stream 1 to complete any partially completed packets on streams 2 and 3. If the packets are from different types of signals as in a multimedia application, different streams can represent different types of signals. In some embodiments, all streams at a particular level can be the same type of signals, For example, in a multimedia application that transmits data and voice, stream 1 can be formed by data while streams 2 and 3 can be formed by voice. In such embodiments, as described before, a basic SSPC block can be used as shown in FIGS. 9 and 10 to feed packets into different streams at the same level. As described before, streams 2 and 3 of this 2-level SPT scheme that uses the signal constellation in FIG. 1 have a 3 dB advantage over stream 1. Therefore, this 2-level SPT embodiment can employ a code with a significantly higher rate on streams 2 and 3 than the rate of the code employed on stream 1. As a result, this 2-level SPT embodiment can have a significantly higher overall throughput over a scheme that employs the same constellation with Gray coding to transmit a set of packets a using single stream of packets. Since every symbol carries one bit from stream 1 and one bit from streams 2 or 3, the overall rate of the 2-level embodiment is $R=(R_1+R_2)/2$, where $R_1$ is the rate of the code used on stream 1 and $R_2$ is the rate of the code used on streams 2 and 3. For example, in LTE application, if the $R_1=\frac{1}{3}$ and $R_2=\frac{4}{7}$, then $R=0.452$, representing a 35.6% increase in the overall throughput over a traditional turbo coded scheme with rate 1/3.

Figure 15:
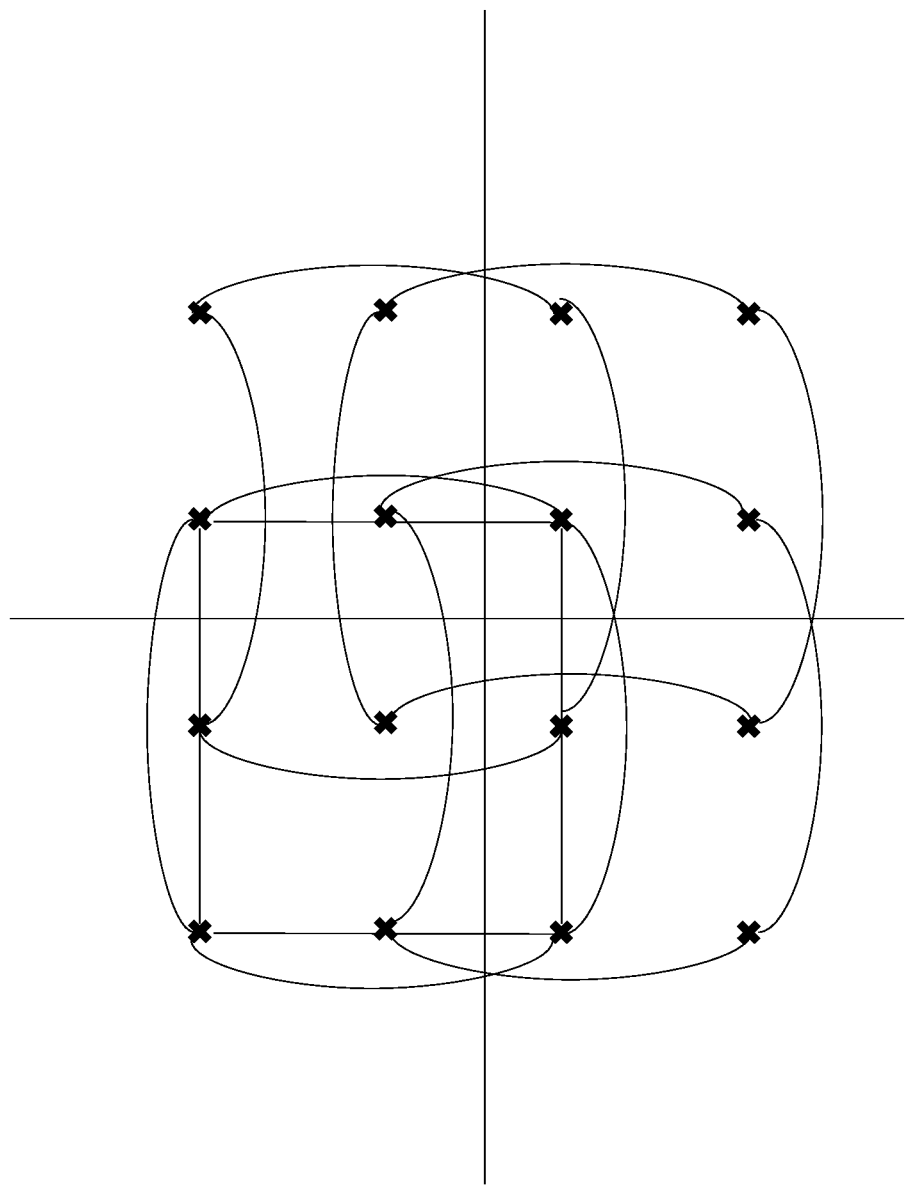
FIG. 15 shows designs illustrating exemplary methods in accordance with various aspects of the present disclosure.

Consider a second 2-level SPT embodiment that employs a 16-QAM overall constellation as shown in FIG. 15. The 16-QAM overall constellation is partitioned into four 4-ary partitioned constellations as highlighted in FIG. 15. Therefore, in this embodiment shown in FIG. 15, M=16, $M_1=M_2=4$ and $m_1=m_2=2$. Therefore, the first two bits (primary 2 bits) of every symbol identifies the specific partition as shown in FIG. 15. As a result, this 2-level SPT has one primary stream (stream 1) and four secondary streams (streams 2 through 5). As shown in FIG. 15, Gray coding is maintained for the first two bits of every symbol among the four partitions, and Gary coding is also maintained among the last two bits of constellation points within every 4-ary partitioned constellation. During transmission, the first two bits of every symbol which are taken from stream 1 identify the specific partitioned constellation and the associated stream which feeds the last two bits of that symbol. Specifically, the embodiment shown in FIG. 15 assigns the first two bit combinations "00", "01", "10", and "11" to streams 2, 3, 4 and 5 respectively and the corresponding respective partitioned constellations are highlighted in FIG. 15. As described before, all partitioned constellations have a 6 dB advantage over the overall signal constellation. Therefore, bits on streams 2 through 5 have a 6 dB advantage over those on stream 1. Therefore, the rate of the code employed by streams 2 through 5, $R_2$, can be significantly higher than the rate of the code employed on stream 1, $R_1$. Since every symbol carries two bits from stream 1 and two bits from one of the streams 2 through 5, the overall rate of the SPT scheme is $R=(R_1+R_2)/2$.

Figure 16:
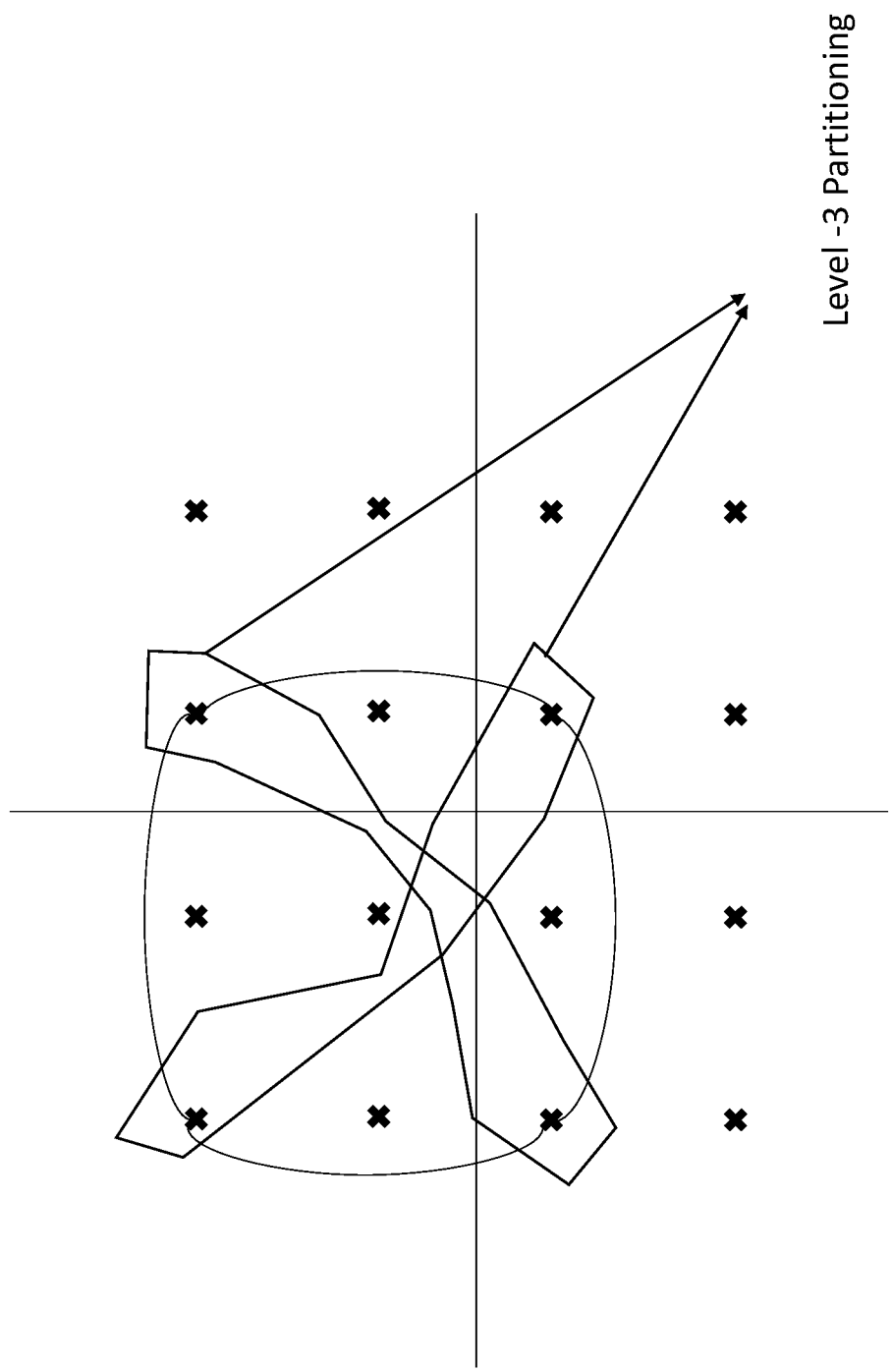
FIG. 16 shows designs illustrating exemplary methods in accordance with various aspects of the present disclosure.

The above embodiment can be modified to form a 3-level SPT embodiment by sub-partitioning each 4-ary partitioned constellation into two 2-ary sub-partitioned constellations. FIG. 16 illustrates one selected level-2 partitioning and the two level-3 partitionings in that level-2 partitioning. Since the overall 16-QAM constellation is partitioned into four level-2 partitioned 4-QAM constellations, there is one primary stream (stream 1), and four level-2 (or secondary) streams (streams 2 through 5). Similarly, since each level-2 partitioned constellation is further partitioned into two level-3 2-ary partitioned constellations, each level-2 stream initiates two level-3 streams (tertiary streams), and therefore, there are eight level-3 streams (streams 6 through 13). Therefore, the 3-level SPT that employs the 16-QAM constellation shown in FIG. 16 employs thirteen streams in total. Every symbol is formed by two bits from the level-1 stream 1, one bit from one of the level-2 streams (streams 2 through 5), and one bit from one of the level-3 streams (streams 6 through 13). This 3-level SPT forms symbols as described below: (a) first two bits of the symbol that are taken from stream 1 decide one of the four level-2 partitioned constellations and the corresponding level-2 stream from streams 2 through 5 as shown in FIG. 16, (b) 3rd bit of the symbol which is taken from the level-2 stream identified in (a) is used to identify the level-3 partition within the selected level-2 partitioned constellation and to select the corresponding level-3 stream (from streams 6 through 13), and (c) the 4th bit of the symbol which is taken from the identified level-3 stream select the specific constellation point from the selected level-3 partitioned constellation. Note that all level-2 bits have a 6 dB advantage over the primary bits, and all level-3 bits have a 9 dB advantage over primary bits. Therefore, if the rates of the codes employed for level-1, level-2 and level-3 bits are $R_1$, $R_2$ and $R_3$ respectively, their values can be chosen according to $R_3>R_2>R_1$. Since every symbol carries two level-1 bits, one level-2 bit and one level-3 bit, the overall rate of the 3-level SPT shown in FIG. 16 is $R=(2R_1+R_2+R_3)/4$.

Figure 5:
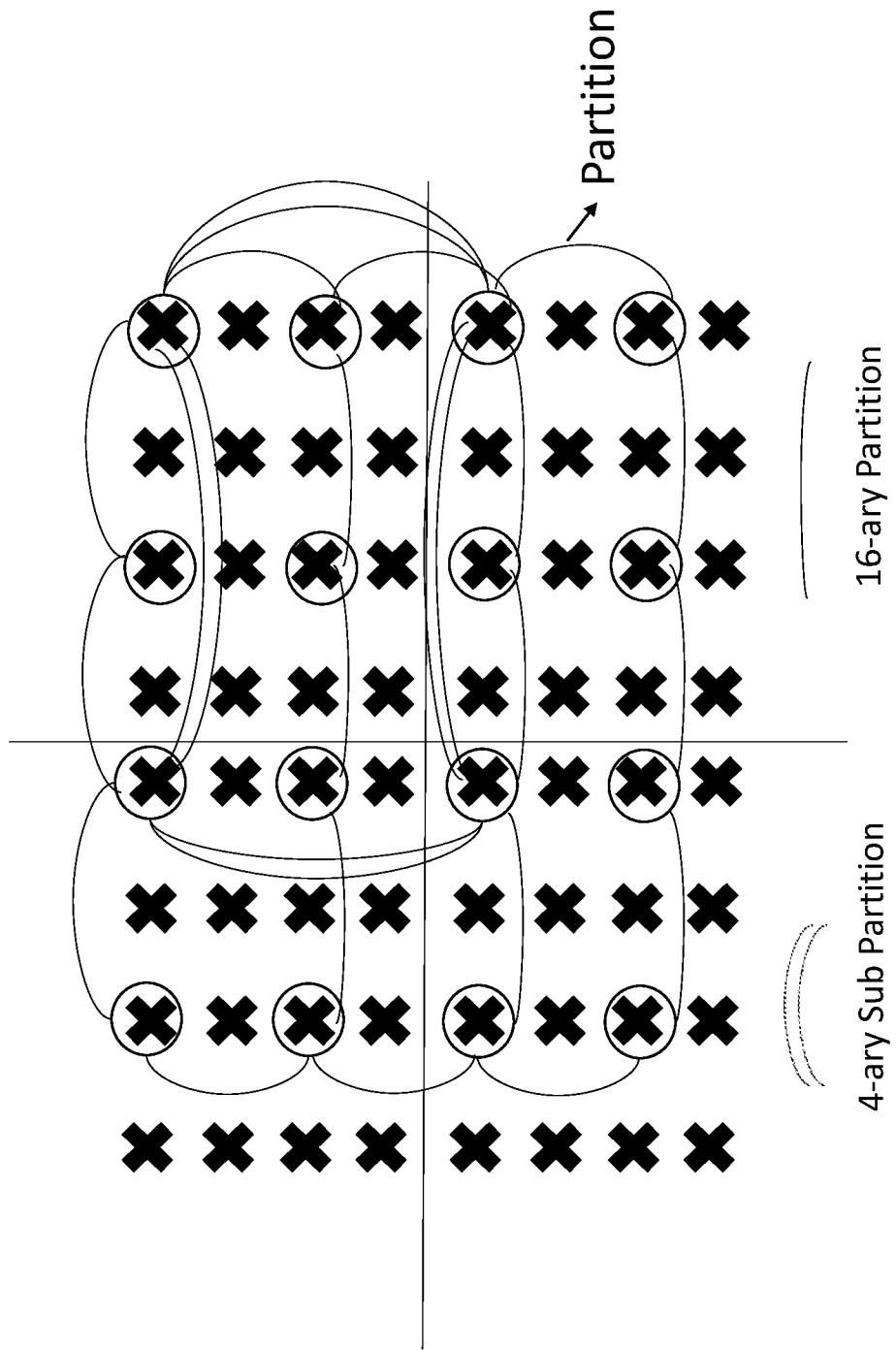
FIG. 5 shows designs illustrating exemplary methods in accordance with various aspects of the present disclosure.

Consider the comparison of a SPT scheme that employs multiple streams with a traditional coded scheme that employs a single stream that uses Gray coding on the constellation. Since the SPT technique alters the mapping from Gray coding, depending on the code employed, the rate of the code on stream 1, $R_1$, may need to be lowered below the rate of the traditional coded scheme, R', in order to make the frame error rate of stream 1 about the same as that of the traditional coded scheme, However, since the code rate on the remaining streams of a SPT can be significantly higher than R', the overall code rate R of the SPT can be significantly higher than R'. Therefore, depending on the application, the code rates on different streams of a SPT can be selected to achieve the highest increase in the overall code rate above the code rate of a traditional coded scheme, Another preferred 3-level SPT embodiment can be constructed with a 64-QAM constellation. This embodiment is constructed with parameters M=64, $M_1=M_2=M_3=4$ and $m_1=m_2=m_3=2$. FIG. 5 shows one level-2 partitioning and one level-3 partitioning within that level-2 partitioning of that 64-QAM constellation. Therefore, the overall 64-QAM constellation is partitioned into four level-2 partitioned 16-QAM constellations. The specific partition and the corresponding level-2 stream (from streams 2 through 5) is selected according to the first two bits of every symbol which are taken from stream 1 (level-1 stream which is also called primary stream). Each partitioned 16-QAM constellation is further partitioned into four level-3 partitioned 4-QAM constellations. The specific level-3 partitioned constellation and the corresponding level-3 stream (streams 6 through 21) from the selected level-2 partitioned constellation is selected according to the 3rd and 4th bits of the symbol which are taken from the selected secondary stream. The 5th and the 6th bits of the symbol taken from the selected level-3 stream select the specific constellation of the selected 4-ary sub-partition.

Figure 17:
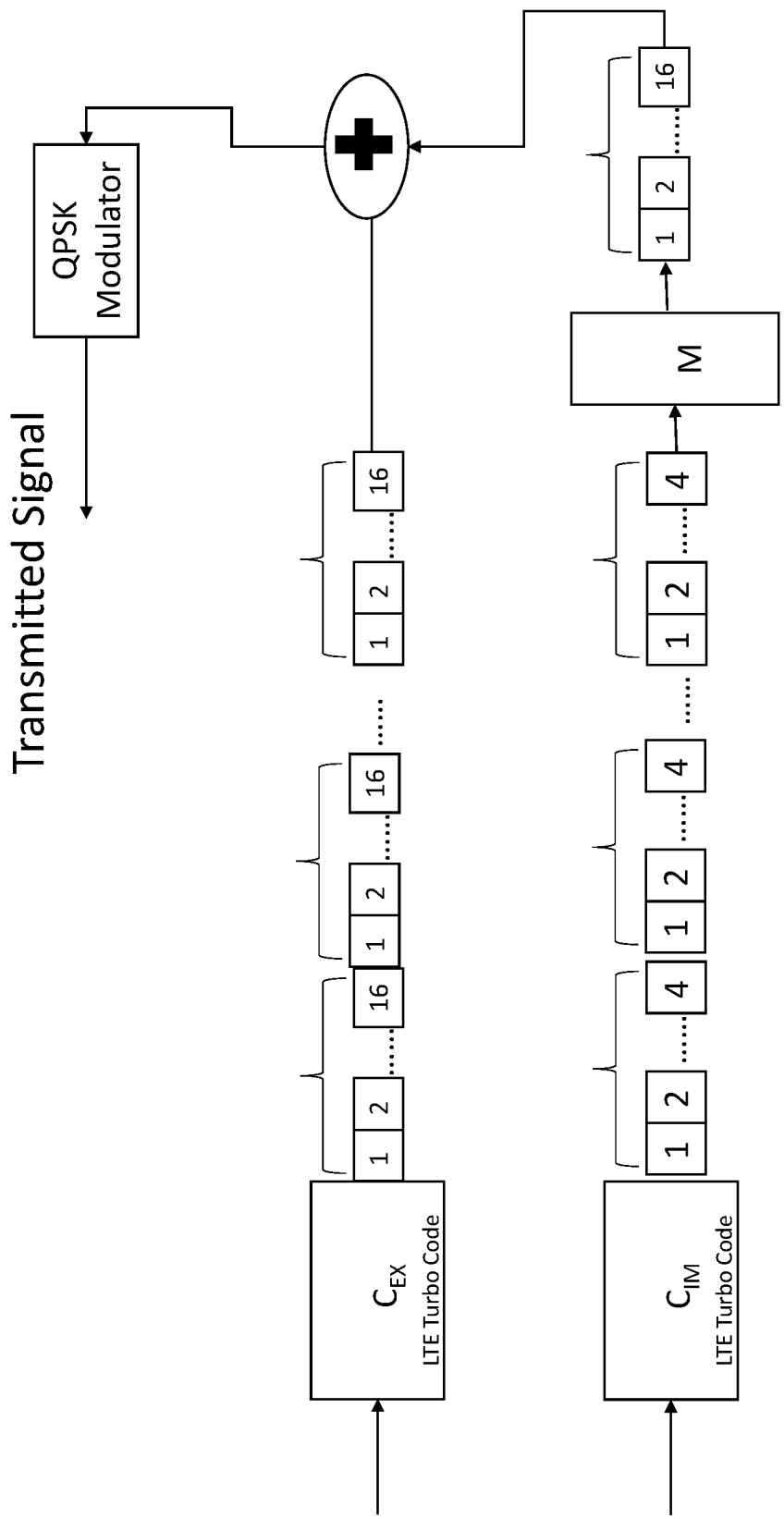
FIG. 17 shows designs illustrating exemplary methods in accordance with various aspects of the present disclosure.

FIG. 17 shows an embodiment that uses the IPT technology described before. The explicit code $C_{Ex}$ and the implicit code $C_{Im}$ can be the 4G LTE turbo code. This embodiment uses of n=16, k=1 and $n_s$=4 to increase the throughput by 25% when both $C_{Ex}$ and $C_{Im}$ have the same rate As stated before $C_{Im}$ can be a higher rate code than $C_{Ex}$. The embodiment in FIG. 17 employs a 4-ary constellation with Gray coding. In general any $2^m$-ary constellation with Gray coding or any other mapping policy on the constellation can be used with IPT signaling. As described before, if the IPT technique is coupled with BICM or CICM other mapping policy can be preferably used to enhance performance.

Figure 18:
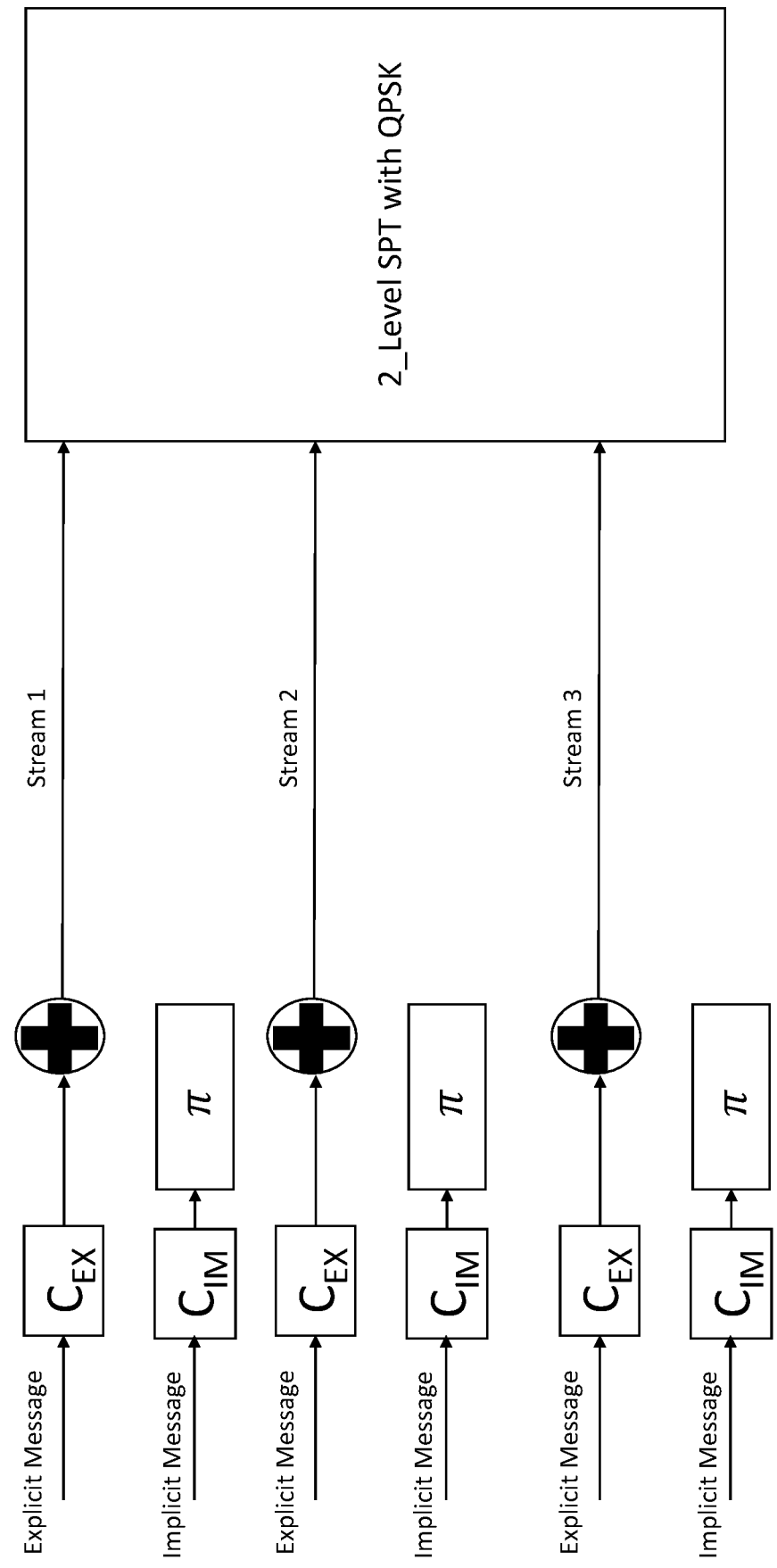
FIG. 18 shows designs illustrating exemplary methods in accordance with various aspects of the present disclosure.

FIG. 18 shows an embodiment that uses both SPT and IPT techniques simultaneously by employing the IPT technique on each stream of a SPT scheme. FIG. 18 shows the use of the IPT technique on each of the three streams of the 2-level SPT scheme described in FIG. 6 that employs a 4-ary constellation shown in FIG. 1. The explicit code $C_{Ex}$ and the implicit code $C_{Im}$ of the three streams can be selected differently from stream to stream. In general, each stream at every level of an SPT scheme can transmit an explicit stream and an implicit stream separately by using the IPT technique. Different embodiments can use the IPT technique at only selected streams of a SPT scheme. Since an N-level SPT needs to correctly decode all streams at levels 1 through (N-1), IPT technique can only be used at the Nth level to reduce complexity.

Figure 19:
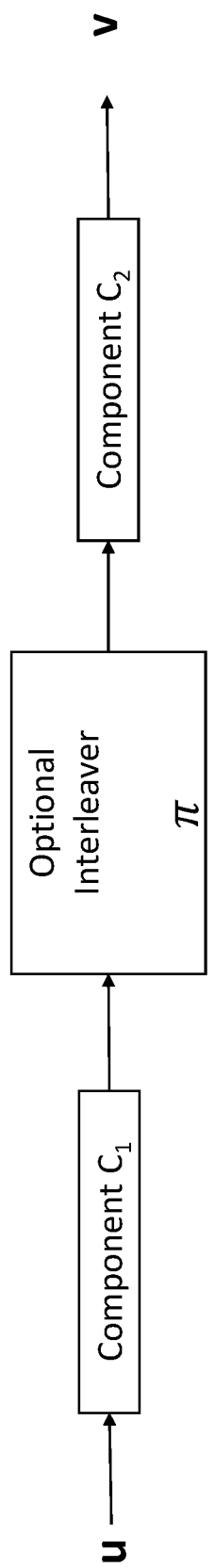
FIG. 19 shows designs illustrating exemplary methods in accordance with various aspects of the present disclosure.
Figure 20:
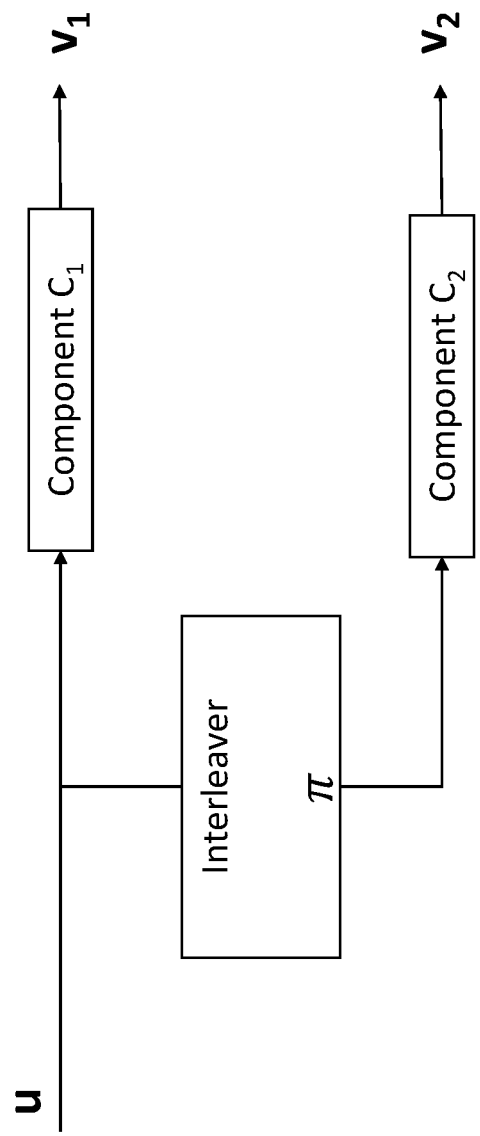
FIG. 20 shows designs illustrating exemplary methods in accordance with various aspects of the present disclosure.

In the following paragraphs, the concept of implicit transmission with bit flipping (ITBF) is explained. Let us consider two components, $C_1$ and $C_2$, of a communication system with an incoming sequence u and outgoing sequence v and an optional interleaver π connected as illustrated in FIG. 19. The sequences u and v can be the message sequence and the coded sequence, or they can be two sequence in the middle of processing at the transmitter. Further, $C_1$ and $C_2$ can be (a) two component block codes of a turbo product code (TPC), or (b) any two types of component codes of a serial concatenation from the family of block codes or convolutional codes, or (c) a code and a modulator in a coded modulation system that employs any single code such as a block code, and/or a convolutional code, and/or a turbo code and/or a low density parity check (LDPC) code. The technology disclosed herein applies to a coded system or a coded modulation system where the two components $C_1$ and $C_2$ carry out some processing like encoding or modulation at the transmitter, and the same two components provide soft information of their input and the output streams of bits at the receiver. Similarly, the technology disclosed herein also applies to configurations of two components $C_1$ and $C_2$ with input u and output ($v_1$, $v_2$) and an optional interleaver as illustrated in FIG. 20. If necessary, the number of outputs can be more than two. The components $C_1$ and $C_2$ of FIG. 20 can be two component codes of a parallel concatenated code with an interleaver which is also well known in the literature as a turbo code. Therefore, FIG. 19 and FIG. 20 are applicable to almost all communication systems in practice including 4G and 5G systems.

Figure 3:
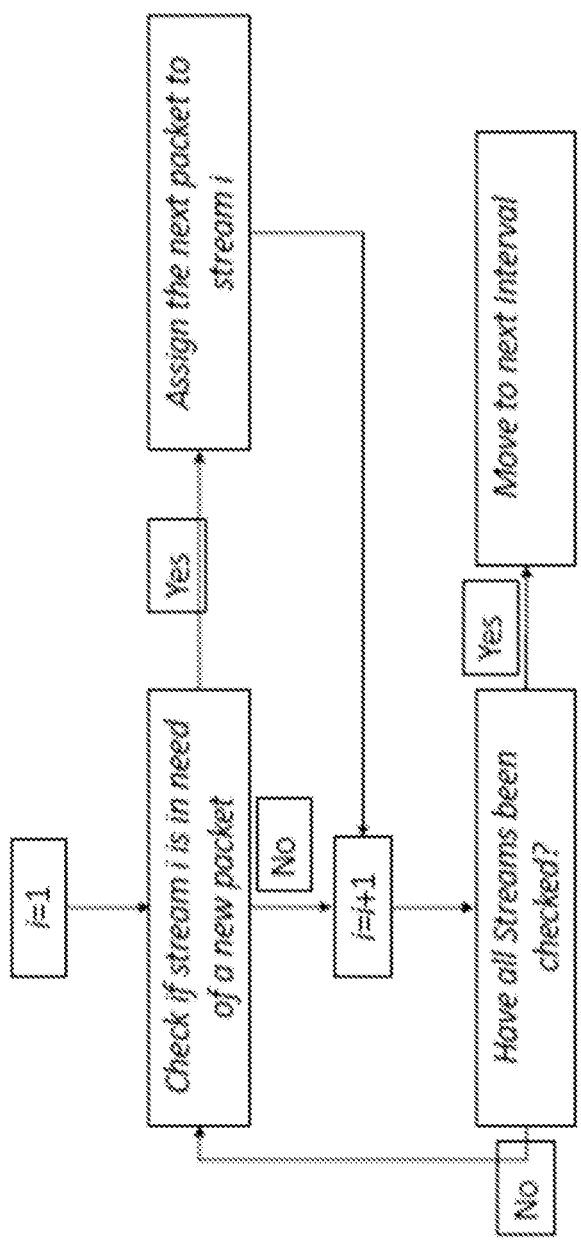
FIG. 3 shows designs illustrating exemplary methods in accordance with various aspects of the present disclosure.
Figure 4:
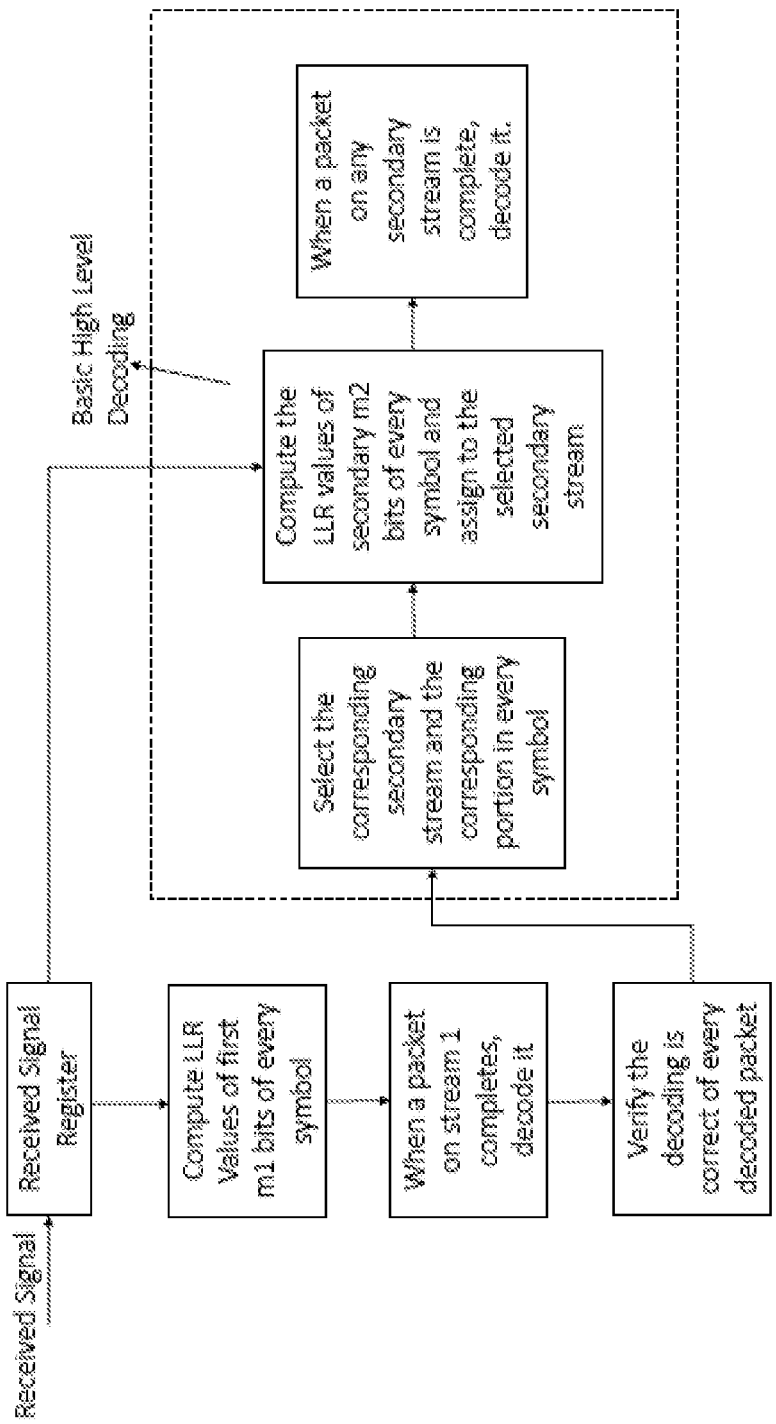
FIG. 4 shows designs illustrating exemplary methods in accordance with various aspects of the present disclosure.
Figure 21:
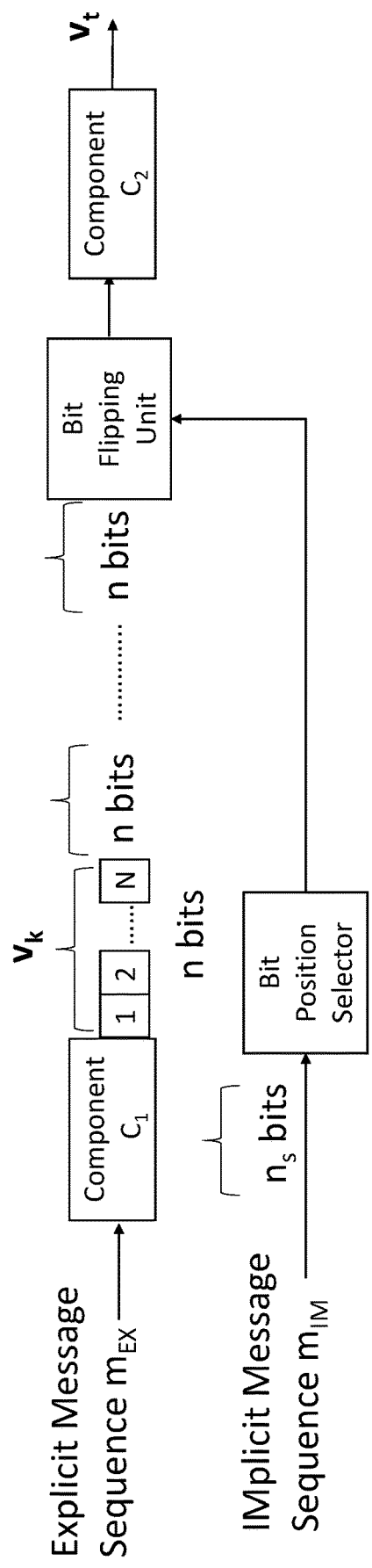
FIG. 21 shows designs illustrating exemplary methods in accordance with various aspects of the present disclosure.
Figure 22:
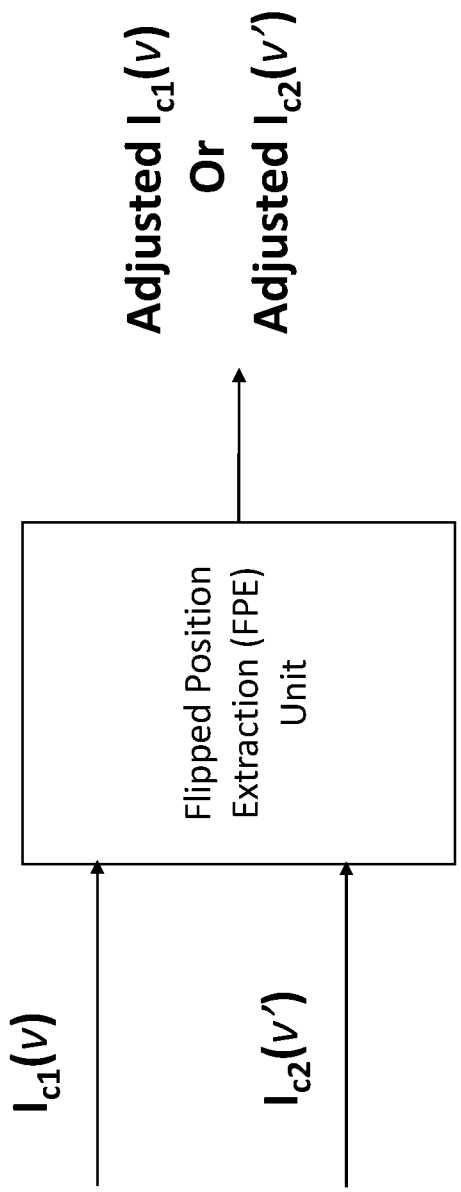
FIG. 22 shows designs illustrating exemplary methods in accordance with various aspects of the present disclosure.

This aspect of the present disclosure, referred to as implicit transmission with bit flipping (ITBF), describes a technique that allows transmission of additional information implicitly in a communication system that includes two components as illustrated in either FIG. 19 or FIG. 20. The ITBF technique is based on the observation that the information about the output of $C_1$ is provided by $C_1$ and also by $C_2$ as its input. FIG. 21 describes the processing that takes place at the transmitter when the ITBF technique is applied to the configuration in FIG. 19. As illustrated in FIG. 21, the transmitter (a) divides the output sequence of $C_1$, v, into blocks of a pre-selected number of n bits, (b) selects one bit from it in each block of n bits uniquely in a bit position selector based on $n_s = \lfloor \log_2 n \rfloor$ number of implicitly transmitted bits from a separate implicit information stream, and (c) flips that selected bit on v in a bit flipping unit to form the sequence v' before forwarding it to $C_2$ via an optional interleaver, where, $\lfloor . \rfloor$ denotes the standard floor function. If necessary, the optional interleaver could be placed before the bit flipping unit too. The output of the bit flipping unit, v', is the sequence processed by the component $C_2$ to form the transmitted sequence $v_t$ as shown in FIG. 3. FIG. 3 highlights the flipping operation for any general kth block of n bits of V, $v_k$, to form the kth block of v', $v'_k$. Note that the implicit stream is a pure information stream without any coding. Further, note that $C_1$ sees every n bit block at its output without the flip (which is v) while $C_2$ sees the output of $C_1$, which is at the input of $C_2$, with the flip (which is v'). Therefore, the information carried by every block of $n_s$ implicit bits during the transmission of every block of n bits of v (which is delivered by the flipped bit position) can be extracted by comparing the information of v' provided by $C_2$, $I_{C_2}(v')$ and the information of v provided by $C_1$, $I_{C_1}(v)$. In accordance with the present disclosure, it is proposed that the comparison of $I_{C_1}(v)$ and $I_{C_2}(v')$ is done by using a flipped position extraction (FPE) unit as illustrated in FIG. 22. However, all other methods that use $I_{C_2}(v')$ and $I_{C_1}(v)$ to handle the flipped bit are within the scope of the present disclosure.

Figure 23:
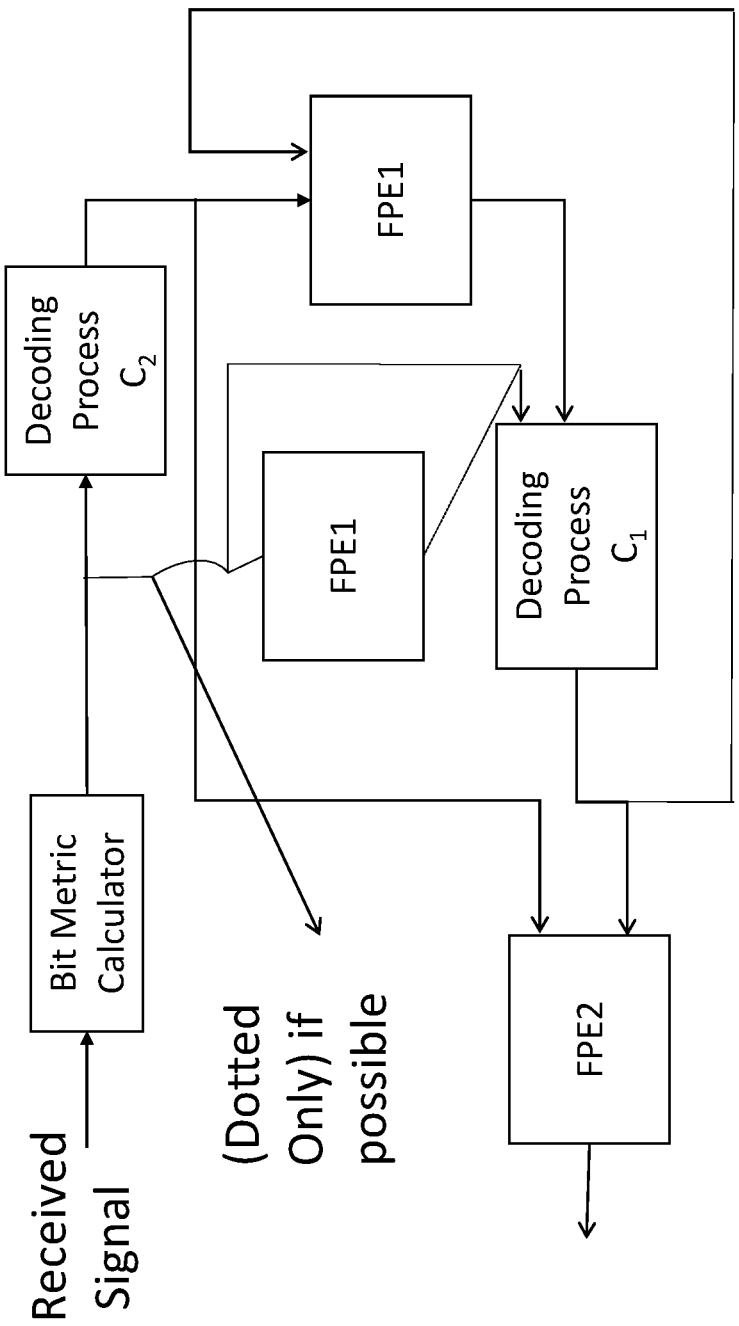
FIG. 23 shows designs illustrating exemplary methods in accordance with various aspects of the present disclosure.

ITBF decoding can be performed iteratively by running soft or hard iterations between components $C_1$ and $C_2$ as illustrated in FIG. 23. However, when exchanging information from $C_1$ to $C_2$ and from $C_2$ to $C_1$, it is necessary to employ a FPE as shown in FIG. 23. In many known applications without any flipping (i.e., v=v'), such as in a turbo product code (TPC), the output of $C_1$ (V) is also directly transmitted as a part of the transmitted sequence $v_t$. In such applications, $C_1$ carries channel information in addition to the extrinsic information obtained from $C_2$. When ITBF technique is used in such applications, channel information (also known as bit metrics) of v', $L_{ch}(v')$, is carried by the transmitted sequence $v_t$. In order to obtain channel information of V, $L_{ch}(v)$, which should be used in the decoding of $C_1$, pass $L_{ch}(v')$ through the same FPE going from $C_2$ back to $C_1$ as shown in FIG. 5. Therefore, the ITBF iterative decoding can be performed according to the following algorithm:

1. Decode $C_2$ and extract extrinsic information
2. Pass the extrinsic information obtained in step 1 to a first FPE, FPE1, to modify that extrinsic information by using the most current extrinsic information obtained from $C_1$. If no extrinsic information of $C_1$ is available, bypass FPE1 and pass the extrinsic information from $C_2$ found in step 1 to $C_1$. If $C_1$ has channel information, use the same FPE1 to modify the channel information corresponding to $C_1$. If FPE1 is not available, use the channel information of v' obtained from the channel as the channel information of $C_1$.
3. Decode $C_1$ using the extrinsic information and any available channel information provided to it in step 2 and extract extrinsic information of the output of $C_1$
4. Pass the extrinsic information obtained in step 3 to a second FPE, FPE2, to modify that extrinsic information by using the most current extrinsic information obtained from $C_2$ in step 1.
5. Go back to step 1 for the next iteration However, if $C_1$ and $C_2$ are component codes of a strong code such as a serial or a parallel concatenated code or a LDPC code, then it may be necessary to use a two step decoding procedure. In the first step run a pre-selected $N_1$ number of iterations in the normal way without any FPEs in order to capture the power of the code. Then in the second step, run a pre-selected $N_2$ number of ITBF decoding iterations described above in five steps. In the second step one or a small pre-selected number of iterations can be used in the decoding of the powerful code.

A FPE can be implemented in many different ways. It can be implemented in a hard sense or in a soft sense. In the hard sense implementation, the FPE compares $I_{C_1}(v)$ and $I_{C_2}(v')$, and determines the most likely bit position k that has been flipped within every block of n bits. Then the FPE flips the incoming soft information at that position before forwarding it to the next component. Specifically, FPE1 in FIG. 23 takes in $I_{C_1}(v)$ and the most recent $I_{C_2}(v')$ available and (a) detects the most likely kth position that has been flipped and (b) flips the sign of that kth position in $I_{C_1}(v)$ before forwarding it to $C_2$. Similarly, FPE2 takes in $I_{C_2}(v')$ and the most recent $I_{C_1}(v)$ available and (a) detects the most likely kth position that has been flipped and (b) flips the sign of that kth position of $I_{C_2}(v')$ before forwarding it to $C_1$. The identification of the flipped position can also be done in one of the following ways:

1. Pick the kth position that maximizes $|I_{C_1}(v)-I_{C_2}(v')|$. That means $$k = \max_i |I_{C_1}(v_i) - I_{C_2}(v'_i)|. \quad (1)$$

2. Pick k according to (1) but only among the $I_{C_1}(v)$ and $I_{C_2}(v')$ values that have opposite signs. In situations where no pair of values of $I_{C_1}(v)$ and $I_{C_2}(v')$ differ in sign, use method 1.
3. Noticing that the values of $I_{C_1}(v)$ and $I_{C_2}(v')$ are different in magnitudes, use scaling before comparing with each other. This can be done by first calculating a new array of $I_{C_2}(v')$, $I_{C_2}'(v')$, according to $$I'_{C_2}(v') = \frac{\alpha}{\beta} I_{C_2}(v') \quad (2)$$

where $$\alpha = \sum_{i=1}^{n} |I_{C_1}(v_i)|$$

and $$\beta = \sum_{i=1}^{n} |I_{C_2}(v'_i)|$$

Then use $I_{C_1}(v)$ and $I_{C_2}'(v')$ in determining k either according to method 1 or method 2 described above. Note that $I_{C_2}'(v')$ is used only in determining k and not for passing as extrinsic information.

4. Find the flipped position k, using any of the above three methods. Calculate $a=|I_{C_1}(v_k)-I_{C_2}(v'_k)|$ and $$b = \sum_{i=1, i \neq k}^{n} |I_{C_1}(v_i) - I_{C_2}(v'_i)|.$$

Flip the sign of the extrinsic information of the kth position (i.e., $I_{C_1}(v_k)$ in FPE1 or $I_{C_2}(v'_k)$ when in FPE2) only if a/b is bigger than some pre-selected value γ. Note that γ indicates how reliable the identified flipped position k, higher the value of γ, more reliable the identification of k is. If not, do not flip the sign of any extrinsic value in that block of n values.

A FPE can be designed in a soft sense by calculating the chance, $w_i$, that the position i, i=1, 2, ..., n, is the flipped position. The value of $w_1$ can be calculated using $I_{C_1}(v_1)$ and $I_{C_2}(v'_i)$ as $$I_{C_2}(v'_i) = (1-2w_i) I_{C_1}(v_i); i=1,2,\ldots,n \quad (3)$$

Then adjust the extrinsic values using the $w_1$ values given by (3). Specifically, in FPE1, replace $I_{C_1}(v_i)$ by $(1-2w_i)|_{C_1}(v_i)$, and in FPE2, replace $I_{C_1}(v_i')$ by $(1-2w_i)|_{C_1}(v_i')$. Note that when $w_i$ is small the extrinsic information is passed without really changing its value while when $w_i$ is close to 1, the extrinsic information is almost flipped in sign before passing. Scaling can also be used in the soft FPE by using $I_{C_2}'(v')$ discussed in method 3 of hard FPE implementation in place of $I_{C_2}(v')$ in the calculation of $w_i$ in (3).

A hybrid soft/hard FPE can also be designed by combining the hard FPE design approach 4 discussed above with soft FPE. This can be done by using the above described soft FPE when $$\frac{a}{b} < \gamma$$

and using the hard FPE when $a/b \geq \gamma$.

The adjustments made by the FPE can be either assisted or replaced by using an alternate method called progression of likelihood values (PLV). The PLV approach is based on the observation that when the flipped position is correctly identified, that decision should improve the LLR values of the next component whereas if the flipped position is incorrectly identified that should degrade the LLR values of the next component. For example, in FIG. 23, the changes of the extrinsic information made by FPE1 to correct for the flipped bit should improve or degrade the LLR values obtained in $C_2$ within the corresponding n bit block depending on whether or not the flipped position identified by FPE1 was correct or incorrect respectively. However, in order to determine whether or not the LLR values have improved, it is necessary to determine the LLR values of the next component with and without making any changes in the LLR values obtained from the current component thereby increasing the decoding complexity. If the increase in complexity is disregarded, the PLV method can be used to identify the flipped position and adjust the extrinsic information in place of a FPE. This can be done by calculating the LLR values of the next component (say $C_2$) without making any adjustment (in FPE1) for the flipped position, and also separately calculating the LLR values of $C_2$ when the flipped position is varied among each of the n possible positions. Then the flipped position can be identified as the position that improves the LLR of $C_2$ by the highest amount. However, this approach is not attractive as it requires calculating the LLR values of $C_2$ separately (n+1) number of times. Therefore, instead of using the PLV method in isolation, it can be combined with the FPE to better estimate the flipped position and update the LLR values before passing it to the next component by using the PLV approach on an as needed basis. Specifically, if the decision made by the FPE appears to be reliable, then accept its decision. However, in situations where the decision made by the FPE does not appear to be reliable, use the PLV method described above either to verify or modify the decision made by the FPE. Therefore, a combined FPE/PLV approach can be developed in the hard sense according to the following rules:

Identify the flipped bit position k in the hard FPE. In addition, calculate the average magnitude of the extrinsic information difference of all remaining positions, $L_{avg}(k)$, and the difference in the extrinsic information of the selected kth position $L(k)$ in the hard FPE. If $L(k) \geq \rho L_{avg}(k)$, accept the decision made by the FPF and move to the next component of the iterative decoding process, where, $\rho$ is a pre-selected value to maintain good performance. However, if $L(k) < \rho L_{avg}(k)$, which suggest that the decision made by the FPE is weak, turn to the PLV method by decoding the next component without adjusting the extrinsic information from the previous component. Then find the average of the absolute value of the extrinsic information of the next component, $L_{avg}$. Then adjust the extrinsic information of the previous component by assuming the flipped bit is the most likely position $k_1$ identified by the FPE and calculate the extrinsic information of next component. Then calculate the new average of extrinsic information $L_{avg}(k_1)$. If $L_{avg}(k_1) > L_{avg}$, assume $k_1$ was the flipped position and use the corresponding extrinsic information of the next stage. If not, find the extrinsic information of the next component by assuming the next most likely position $k_2$ is the flipped position and repeat the same process. Continue the same process until $L_{avg}(k_i) > L_{avg}$. At that point, assume the position $k_i$ was flipped position and use the corresponding adjusted extrinsic information of the next stage.

The ITBF technique is similar in principle to the IPT technique described before for the transmission of packets implicitly. However, the main difference between ITBF and IPT techniques is that IPT requires that the implicit stream to be coded and as a result it requires updating soft information of the coded bits of the implicit stream during iterative decoding. Therefore, a mapper and a summing unit was used in the IPT technique. In contrast, the ITBF technique mostly uses an uncoded information sequence as the implicit sequence and it can however use a code separately to improve performance of the implicit stream. Further, unlike IPT, ITBF does not require updating soft information of the implicit bits during iterative decoding. Therefore, the mapper used in IPT is referred to in ITBF as a bit position selector and the summing unit in the IPT is referred to in ITBF as a bit flipping unit. The operations in the bit position selector and the bit flipping unit in a ITBF scheme are simpler than the operations in the mapper and the summing unit in an IPT scheme.

Figure 6:
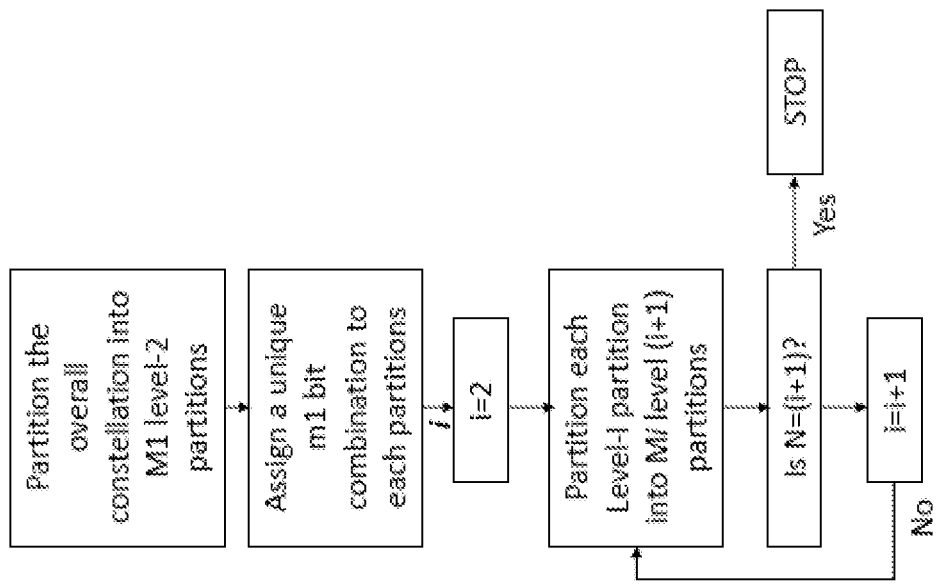
FIG. 6 shows designs illustrating exemplary methods in accordance with various aspects of the present disclosure.
Figure 7:
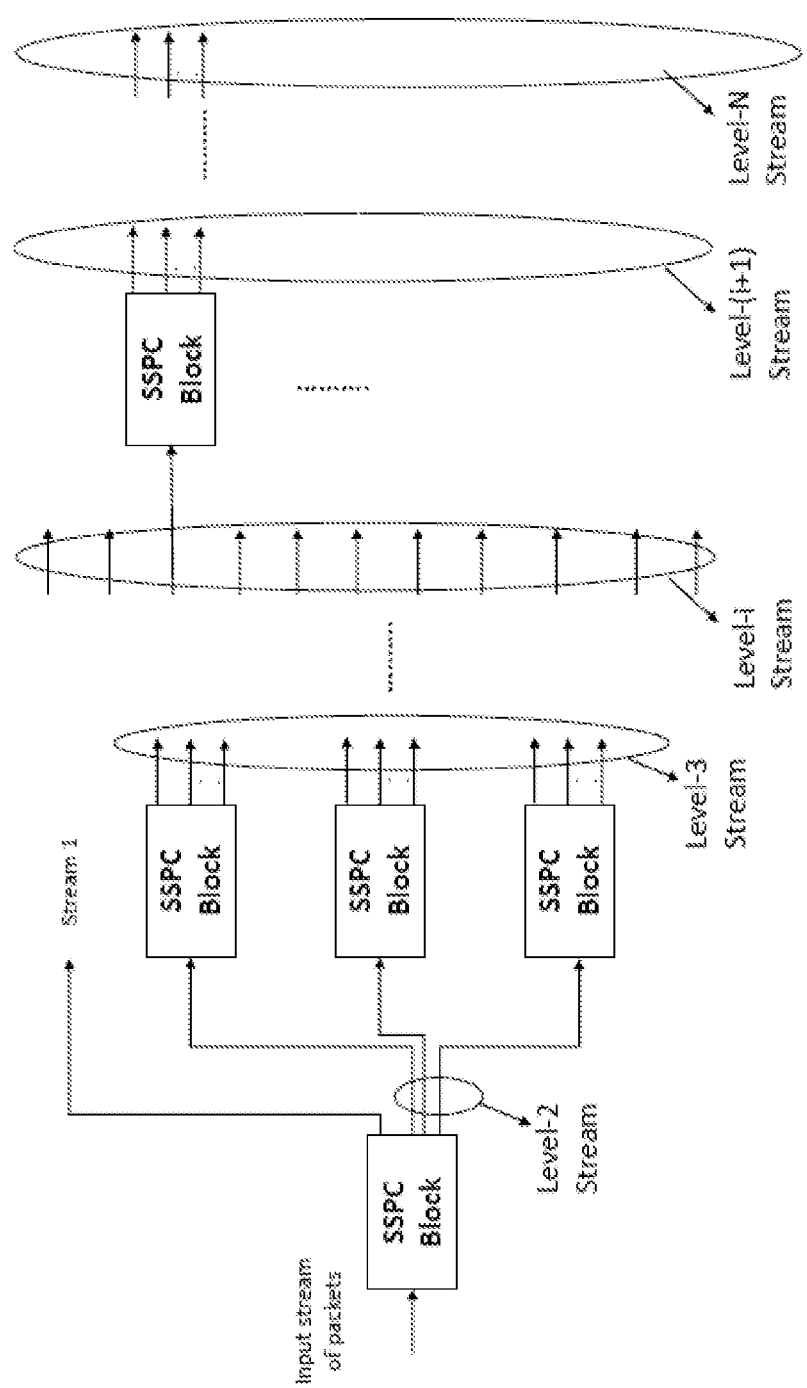
FIG. 7 shows designs illustrating exemplary methods in accordance with various aspects of the present disclosure.
Figure 8:
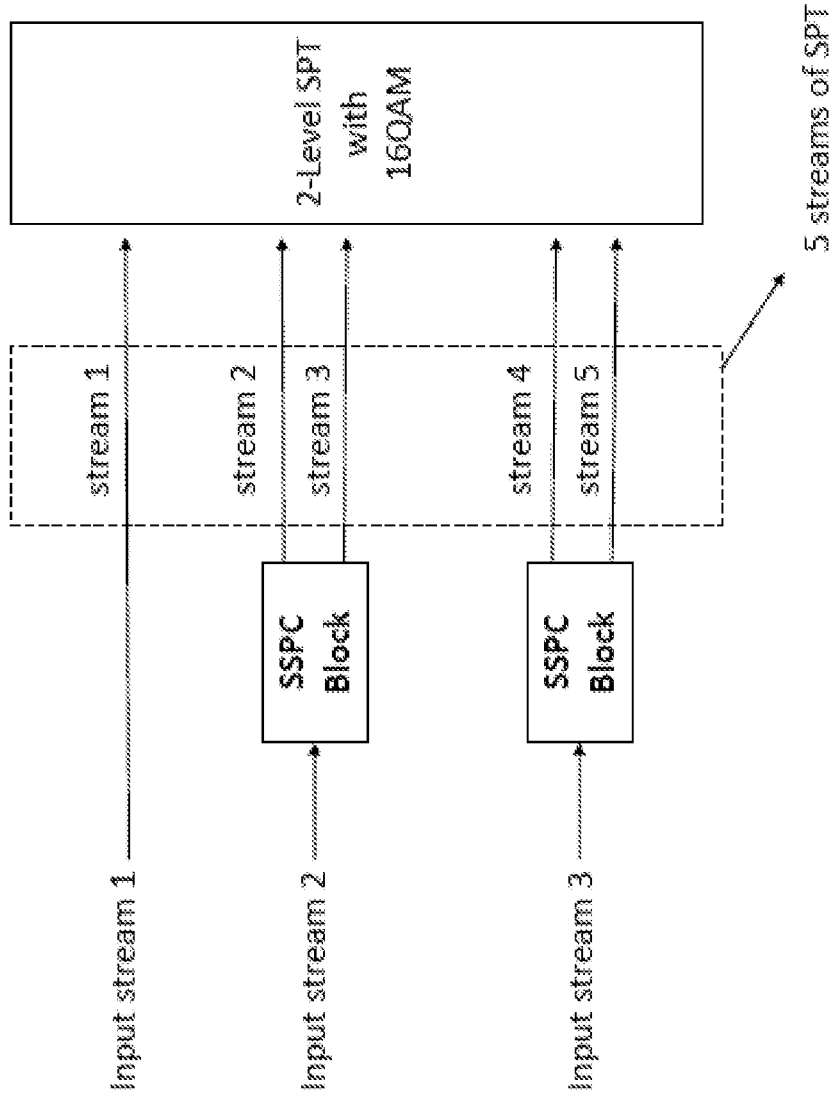
FIG. 8 shows designs illustrating exemplary methods in accordance with various aspects of the present disclosure.
Figure 24:
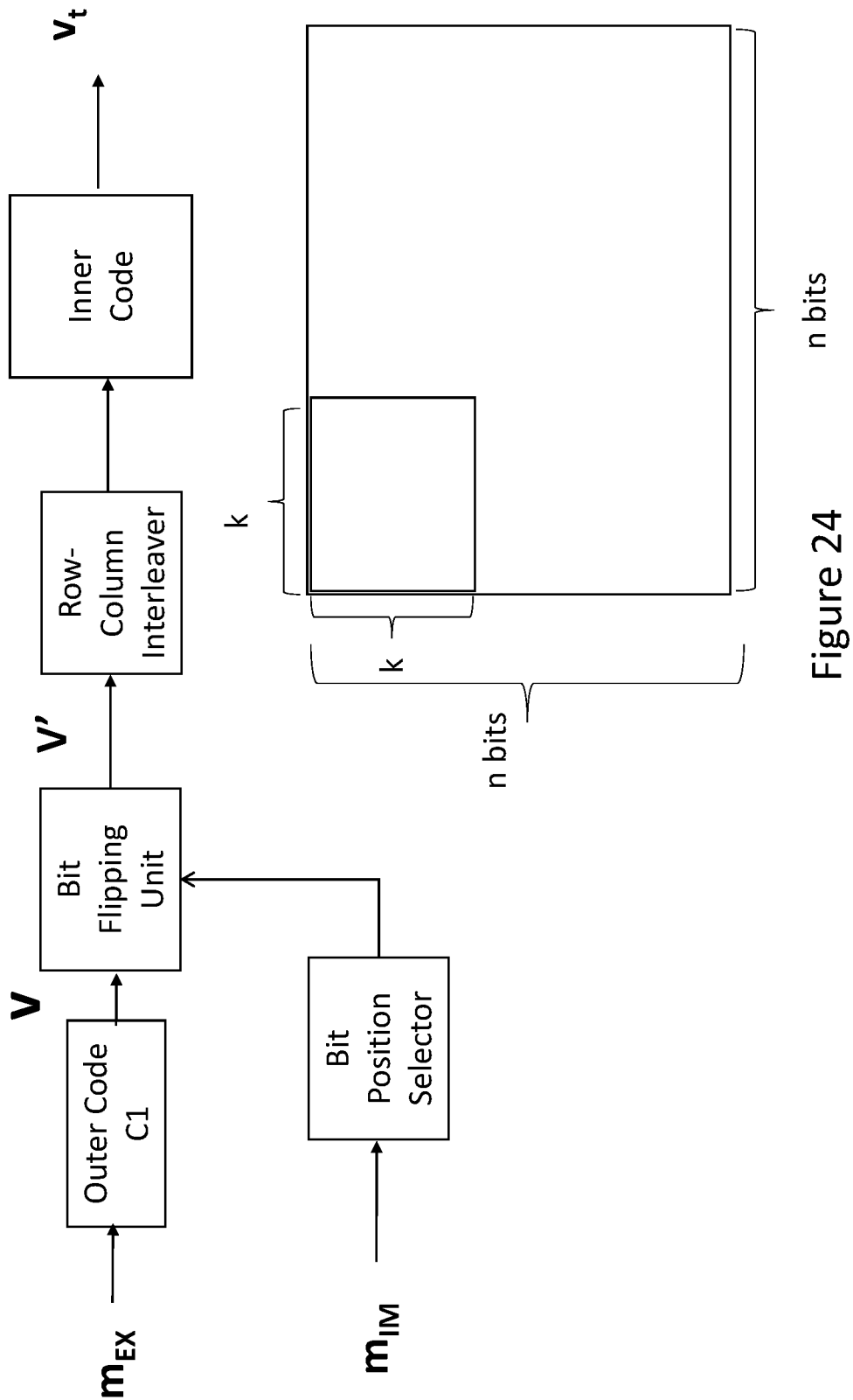
FIG. 24 shows designs illustrating exemplary methods in accordance with various aspects of the present disclosure.

Consider an ITBF embodiment of a turbo product code (TPC) constructed with a (n, k) block code with minimum Hamming distance (MHD) $d_{min} (\geq 3)$. In such a TPC, the inner code $C_1$ and the outer code $C_2$ are both (n, k) linear block codes. FIG. 6 illustrates the encoding of a n by n code array starting from a k by k message array. Note that the top k by n array is the output of $C_1$ which is checked both by $C_1$ and $C_2$. The above described ITBF technique can be applied to this product code by selecting a bit on the first row according to $\lfloor \log_2 n \rfloor$ implicit message bits at the output of $C_1$ before feeding it to $C_2$. In order to improve performance it is desirable not to flip more than one bit along the same column. This can be easily maintained by ignoring the column of the bit that has been flipped on the first row and selecting a bit from the remaining (n−1) bits on the second row according to $\lfloor \log_2 (n-1) \rfloor$ and flipping it. This process can be continued down to the kth row to select a bit out of the remaining (n−k+1) columns of the kth row according to $\lfloor \log_2(n-k+1) \rfloor$ implicit bits and flipping it. In the end at the output of $C_1$, k bits will be selected (one from each row) before encoding the inner code $C_2$ along columns. As a result, the TPC with ITBF can additionally transmit $$N_s = \sum_{i=0}^{(k-1)} \lfloor \log_2(n-i) \rfloor \quad (4)$$

number of message bits implicitly from a separate implicit message sequence. The above TPC with ITBF can be decoded according to the algorithm described before. However, if $d_{min}$ is significantly higher than 3 and each component code is capable of correcting more than one bit, it is possible to select more than one bit from each row according to implicit bits before feeding the output of $C_1$ (first k rows of FIG. 24) to $C_2$ thereby increasing the number of implicitly transmitted bits. Even though selecting bits row by row according to implicit bits is simpler, the number of transmitted implicit bits can be increased by selecting bits jointly by ensuring that only one bit from each of the first k rows are flipped while also maintaining that no column has more than one flipped bit. Specifically, if done jointly, the number of ways to select a combination of k flipped bits while ensuring the above two conditions is $N=\Pi_{i=0}^{k-1}(n-i)$. Therefore, the total number of implicit bits that can be transmitted in a code array is increased from (4) to $$N_s = \lfloor \log_2 N \rfloor.$$

Figure 25:
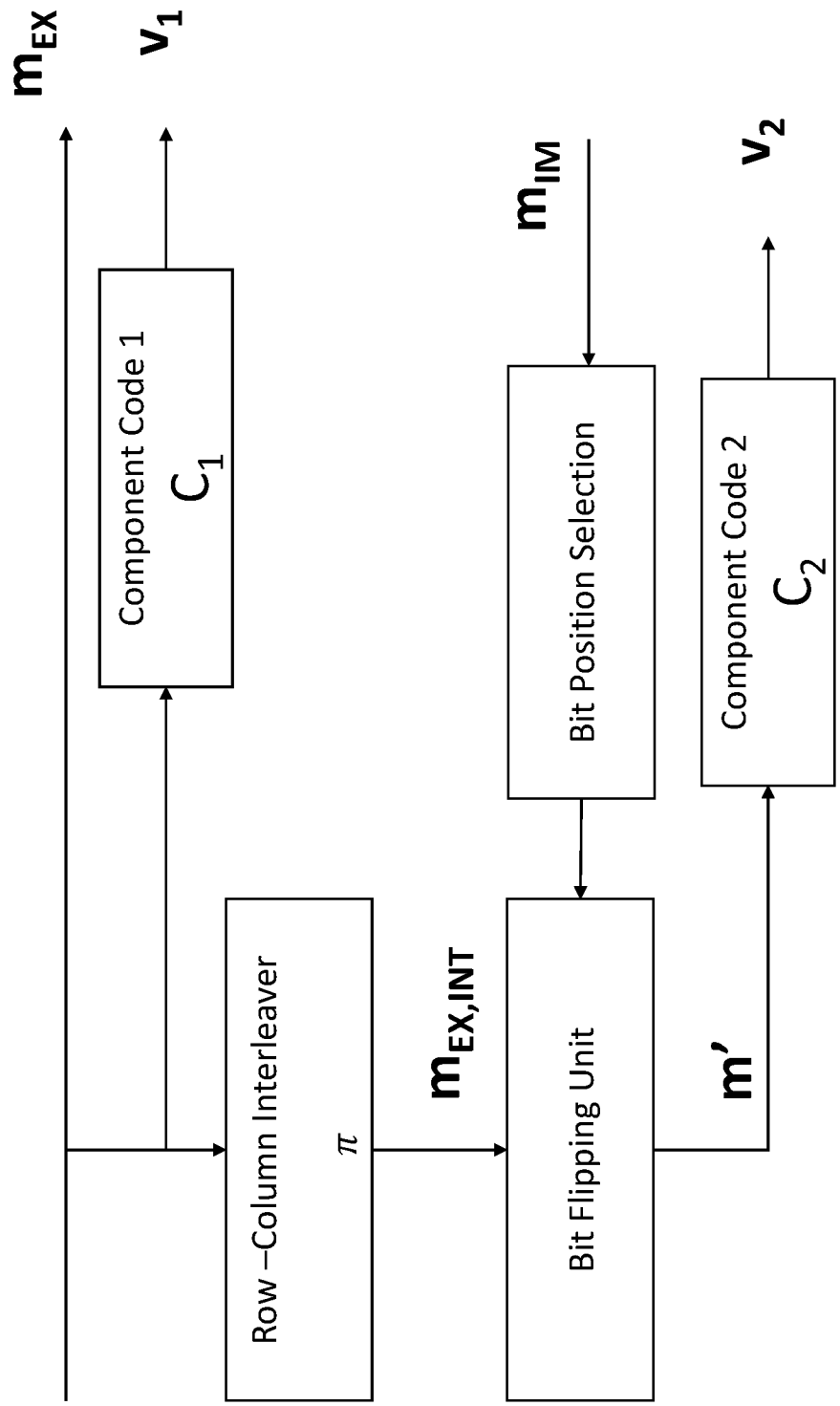
FIG. 25 shows designs illustrating exemplary methods in accordance with various aspects of the present disclosure.

Consider a second embodiment of a turbo code with the ITBF technique as shown in FIG. 25. A turbo code with two component codes transmits the explicit message bits, $m_{Ex}$, parity bits of the first component code, $v_1$, and the parity bits of the second component code, $v_2$. Further, the second component code operates on the interleaved sequence of the explicit message sequence, $m_{Ex,Int}$. The ITBF technique can be applied to such a turbo code by selecting one bit out of every n bits of the interleaved message bits, $m_{Ex,Int}$, according to $n_s = \lfloor \log_2 n \rfloor$ message bits of a separate implicit message sequence to form the sequence m' as shown in FIG. 25. Note that the first component code $C_1$ operates on the actual extrinsic message sequence $m_{Ex}$, while $C_2$ operates on the message sequence m' which contains all the flips. Further, the channel information of the message obtained from the received signal corresponds to $m_{Ex}$. Therefore, after extracting bit metrics of all bits on $m_{Ex}$, $v_1$ and $v_2$, the above turbo code with ITBF can be decoded as similarly according to the following steps:

1. Decode $C_1$ using the bit metrics of $m_{Ex}$ and bit metrics of $v_1$ and extract extrinsic information of the message sequence $m_{Ex}$
2. Pass the extrinsic information obtained in step 1 to a first FPE, FPE1, to modify that extrinsic information by using the most current extrinsic information obtained from $C_2$. If no extrinsic information of $C_2$ is available, bypass the FPE1 and pass the extrinsic information from $C_1$ found in step 1 to $C_2$. Use the same FPE1 to modify the bit metrics of the message sequence $m_{Ex}$ to obtain the bit metrics of m' corresponding to $C_2$. If no FPE information is available, use the bit metrics of $m_{Ex}$ obtained from the channel as the bit metrics of m'.
3. Decode $C_2$ using the extrinsic information from $C_1$ and the bit metrics of m' found in step 2 along with the bit metrics of its parity bit sequence $v_2$, and extract extrinsic information of m'
4. Pass the extrinsic information obtained in step 3 to a second FPE, FPE2, to modify that extrinsic information of m' by using the most current extrinsic information of $m_{Ex}$ obtained from $C_1$ in step 1 to obtain the extrinsic information of $m_{Ex}$ used by $C_1$.
5. Go back to step 1 for the next iteration to decode $C_1$ using the extrinsic information found in step 4. Continue the iterations until the required number of iterations are reached or a terminating condition is satisfied.

Consider the ITBF embodiments previously discussed before with TPC codes and turbo codes. Note that in both of those embodiments, part of the parity bits of the code, are generated according to the actual message sequence, which is referred to as the explicit message sequence, while the other parity bits are generated according to a modified version of that explicit message sequence. As described before, ITBF schemes modify the explicit message sequence by selecting bits of that explicit message sequence according to a second implicit message sequence and flipping those selected bits to generate a modified version of the explicit message sequence. Therefore, the ITBF technique can be applied to any code to generate some of its parity bits from the explicit message sequence and the remaining part of the parity bits from the modified version of the explicit sequence. Therefore, the ITBF technique can be applied to generate LDPC codes with ITBF as described below.

Figure 26:
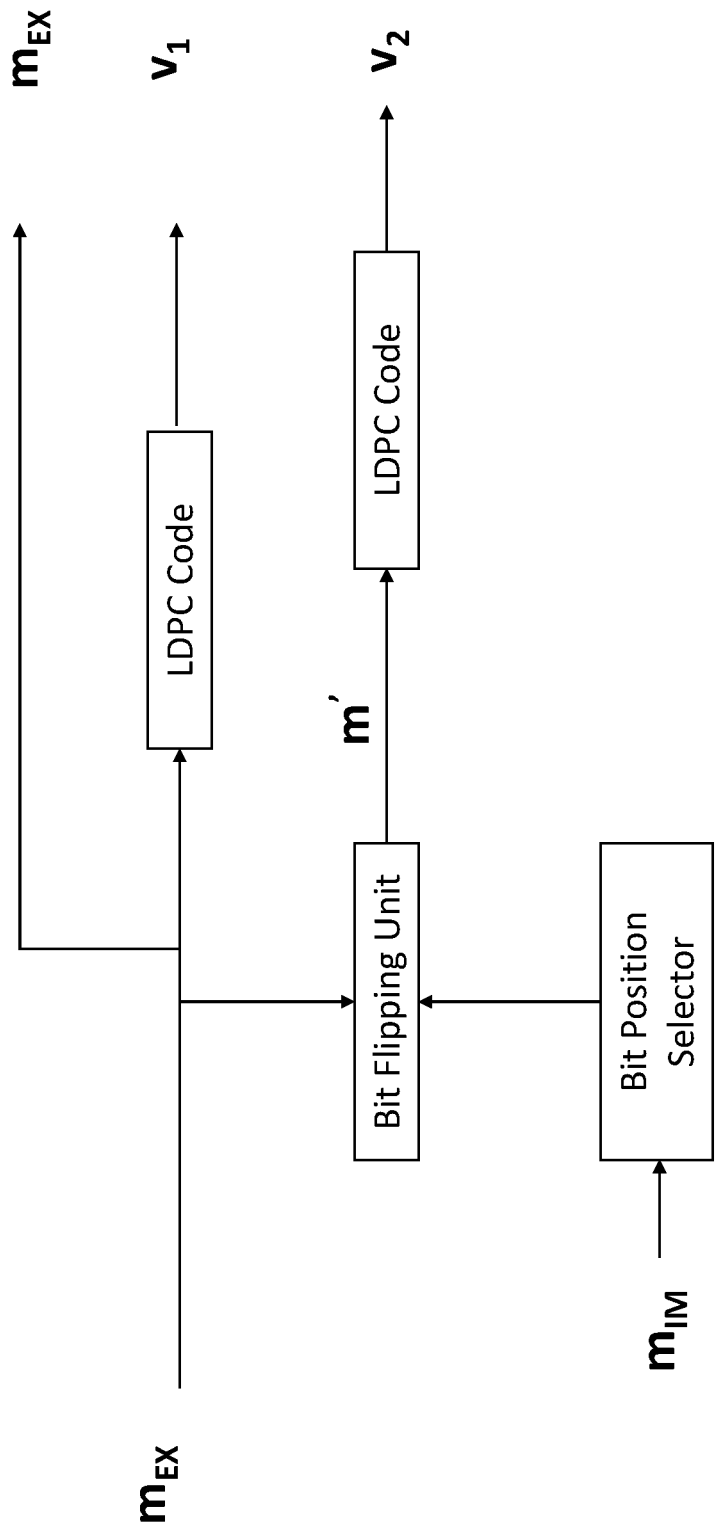
FIG. 26 shows designs illustrating exemplary methods in accordance with various aspects of the present disclosure.
Figure 27:
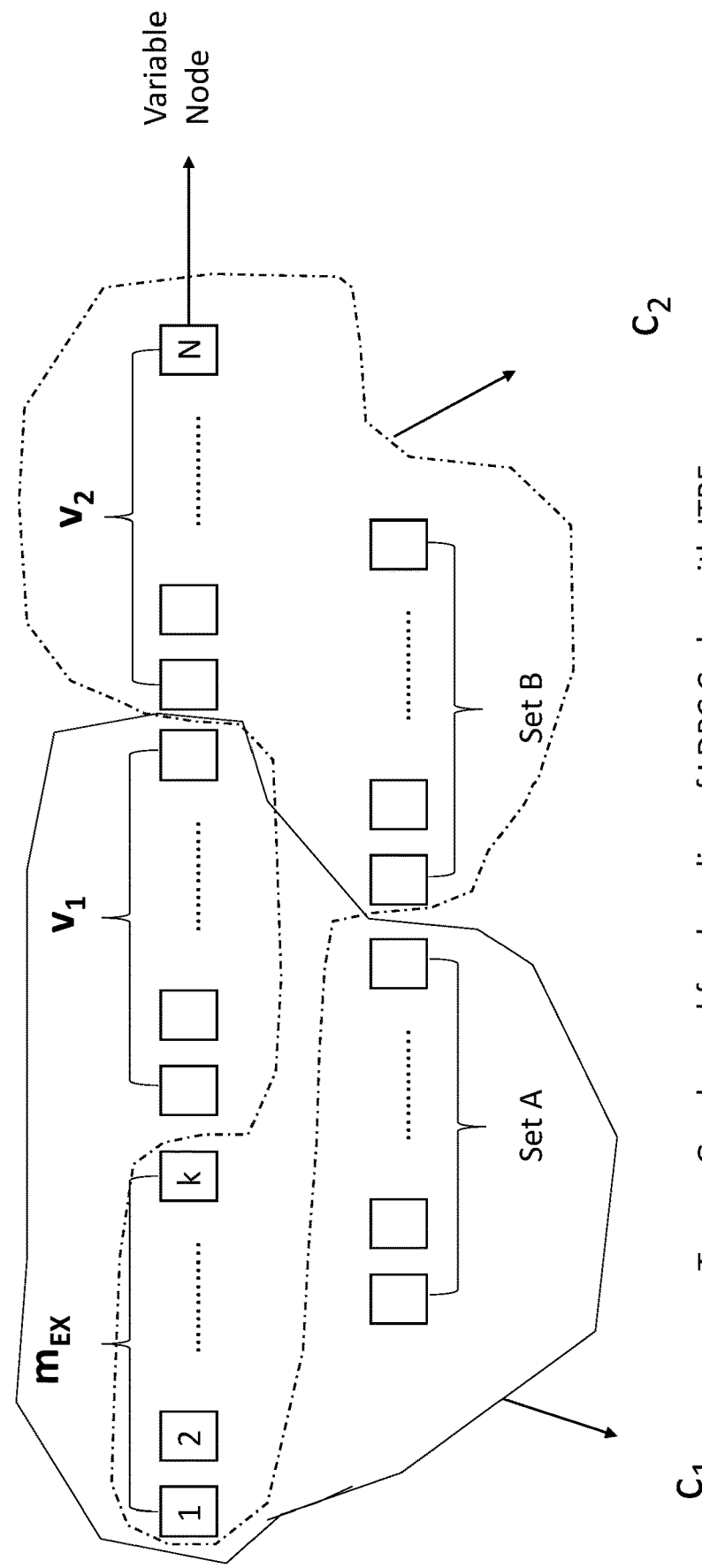
FIG. 27 shows designs illustrating exemplary methods in accordance with various aspects of the present disclosure.

Consider a third ITBF embodiment with a systematic (N, K) LDPC code that uses an explicit message sequence, $m_{Ex}$ for transmission. Then generate part of the parity bits, $v_1$, using $m_{Ex}$ as shown in FIG. 26. Then modify the sequence $m_{Ex}$ by selecting one bit out of every n bit block of $m_{Ex}$ according to $n_s = \lfloor \log_2 n \rfloor$ number of bits of a second implicit message sequence $m_{in}$, and flipping that selected bit on $m_{Ex}$ in each block of n bits to form a modified message sequence m'. Then use the modified message sequence m' to generate the remaining portion of the parity bit sequence, $v_2$, as shown in FIG. 26. In a LDPC code, the sequences $v_1$ and $v_2$ can be selected to roughly obtain the same number of check nodes for $v_1$ and $v_2$ on the Tanner graph of that LDPC code. FIG. 27 shows the set of check nodes, set A, corresponding to the explicit message sequence $m_{Ex}$ and $v_1$, and the set of check nodes, set B, corresponding to the modified message sequence m' and $v_2$ as shown in FIG. 27. In order to describe the decoding of LDPC codes with ITBF, let us denote the set of variable nodes and the set A of check nodes, corresponding to the sequences $m_{Ex}$ and $v_1$, by $C_1$. Similarly, let us denote the set of variable nodes and the set B of check nodes, corresponding to the sequences m' and $v_2$, by $C_2$ as highlighted in FIG. 27. In fact, $C_1$ and $C_2$ can be viewed as two punctured codes generated from the same LDPC code. Further, $C_1$ and $C_2$ can be decoded on the same Tanner graph using the same SPA algorithm with the only difference that the corresponding check nodes include only set A for the decoding of $C_1$ and set B for the decoding of $C_2$. Note that the bit metrics (channel information) of $m_{Ex}$, $v_1$ and $v_2$ can be obtained from the received signal. By following the decoding of turbo product codes with ITBF and turbo codes with ITBF, LDPC codes with ITBF can be decoded after extracting bit metrics of all bits on $m_{Ex}$, $v_1$ and $v_2$, according to the following steps:

1. Decode $C_1$ using the bit metrics of $m_{Ex}$ and bit metrics of $v_1$ and extract extrinsic information of the message sequence $m_{Ex}$
2. Pass the extrinsic information obtained in step 1 to a first FPE, FPE1, to modify that extrinsic information by using the most current extrinsic information obtained from $C_2$. If no extrinsic information of $C_2$ is available, bypass the FPE1 and pass the extrinsic information from $C_1$ found in step 1 to $C_2$. Use the same FPE1 to modify the bit metrics of the message sequence $m_{Ex}$ to obtain the bit metrics of m' corresponding to $C_2$. If no FPE information is available, use the bit metrics of $m_{Ex}$ obtained from the channel as the bit metrics of m'.
3. Decode $C_2$ using the extrinsic information from $C_1$ on step 2 and the bit metrics of m' found in step 2 along with the bit metrics of its parity bit sequence $v_2$, and extract extrinsic information of m'
4. Pass the extrinsic information of m' obtained in step 3 to a second FPE, FPE2, to modify that extrinsic information of m' by using the most current extrinsic information of $m_{Ex}$ obtained from $C_1$ in step 1 to obtain the extrinsic information of $m_{Ex}$ used by $C_1$ 5. Go back to step 1 for the next iteration to decode $C_1$ using the extrinsic information found in step 4. Continue the iterations until the required number of iterations are reached or a terminating condition is satisfied.

Depending on the LDPC code and the desired performance, steps 1 and 3 can employ a single or any desirable pre-selected number of SPA iterations for the decoding of $C_1$ and $C_2$ respectively. Further, in order to select the set of parity bits and the corresponding check nodes, a parity bit selection unit can be used in the decoding of LDPC codes with ITBF.

It is also desirable to select each block of n coded bits of the LDPC codes, which is modified by flipping one bit of it, to ensure that flipping of bits will influence as many check nodes as possible. This can be achieved by ensuring, as much as possible, that only one variable node, representing a coded bit, among all variable nodes that feed into each check node is allowed to be flipped. Note that if two variable nodes among those fed into a particular check node are flipped, the check node will not be able to gather any information of the flipped bit. Therefore, it is desirable to select blocks of n coded bits of the explicit stream completely from a set of paths arriving at a complete set of check nodes. In other words, it is desirable to avoid feeding coded bits arriving at a particular check node into different blocks of n bits as much as possible.

Even though the LDPC codes with ITBF has been described with systematic LDPC codes for simplicity, the same technique can be easily applied to non-systematic LDPC codes. Further, even though, the above embodiment has been described with a LDPC code C, the same ITBF technique can be applied to any code C by generating part of its parity bits from the explicit message sequence and the remaining part of its parity bits from a modified version of the explicit message sequence, modified according to a separate implicit message sequence.

Figure 28:
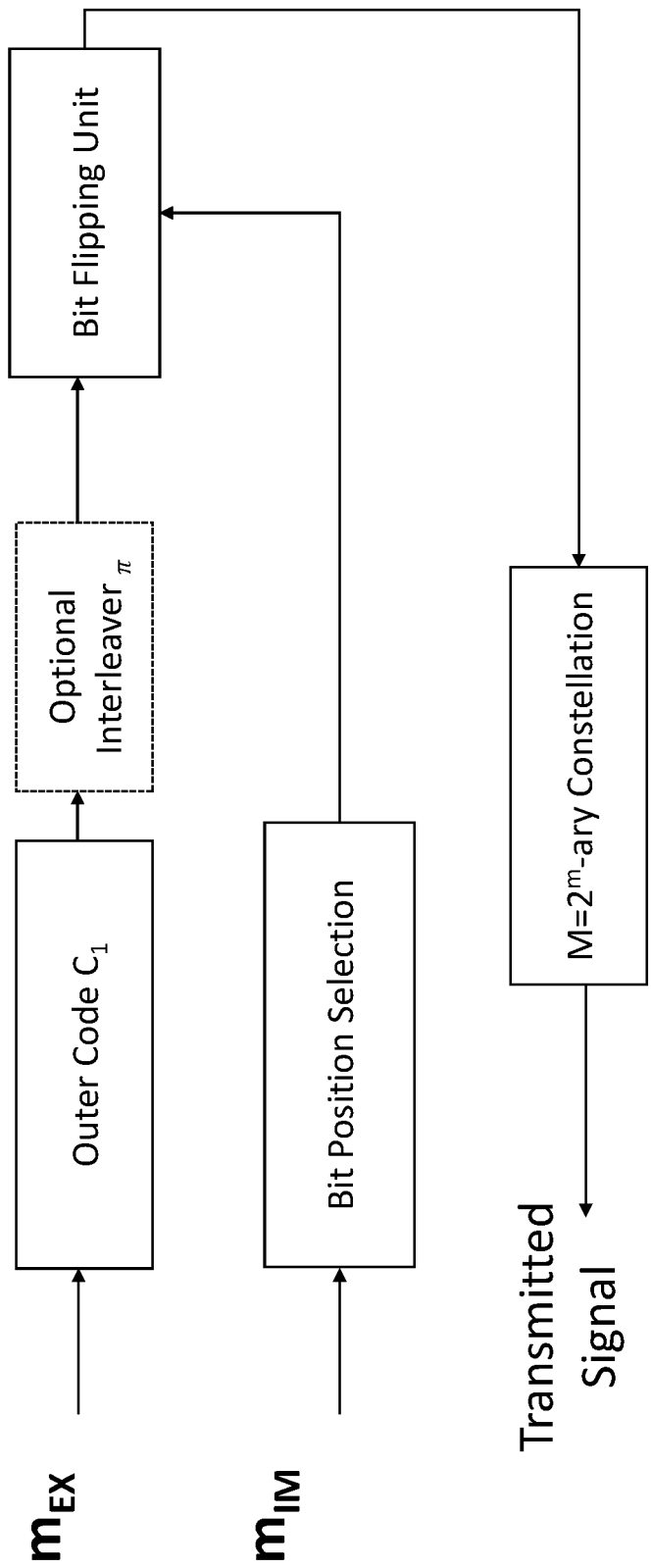
FIG. 28 shows designs illustrating exemplary methods in accordance with various aspects of the present disclosure.
Figure 29:
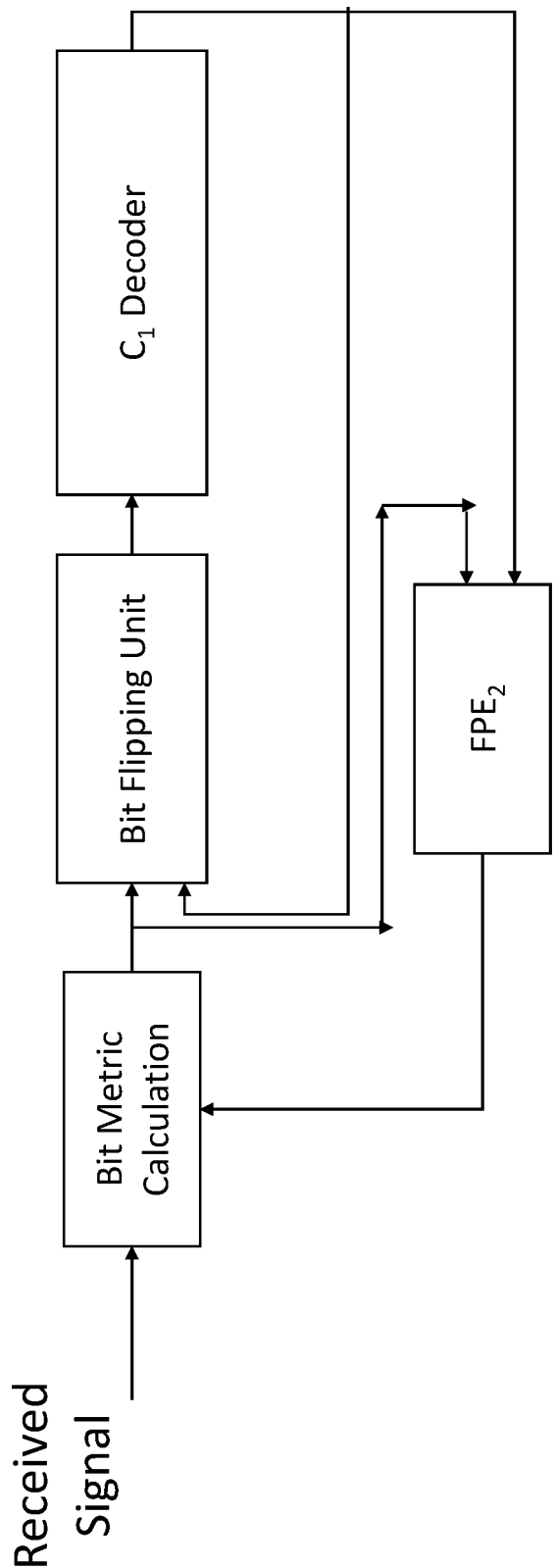
FIG. 29 shows designs illustrating exemplary methods in accordance with various aspects of the present disclosure.

The ITBF technique can be applied to a coded modulation system as illustrated in FIG. 28. In such an application the modulator acts as the second component $C_2$ while $C_1$ is the code employed in the system. An optional interleaver $\pi$ can be used in the system. If such an interleaver is used, the soft information can be transferred using an interleaver (or a de-interleaver) in order to feed the soft information in the proper order to every decoding component at the receiver as it is well known in the literature. Therefore, coded modulation schemes with ITBF are described here without an interleaver, but if an interleaver is used it can be easily incorporated in the decoder described later by using an interleaver (or a de-interleaver) in the exchange of extrinsic information. Therefore, a coded modulation system with ITBF alters the coded sequence (output of $C_1$) by selecting one bit out of every block of n bits based on $n_s = \lfloor \log_2 n \rfloor$ implicit bits and flipping that selected bit before feeding it to the modulator. These signals are decoded similar to the decoding of a TPC with ITBF or a turbo code with ITBF. First the LLR values (bit metrics) of each coded bit is extracted as in [Imai] from the demodulator according to the signal constellation. Then follow the five ITBF decoding steps to decode both the explicit and the implicit bit sequences. FIG. 29 shows the decoding procedure of coded modulation with ITBF. The decoding procedure can be described in the following steps:

1. Extract LLR values (bit metrics) of each bit using the received signal and any available extrinsic information [Imai]. In the first iteration, since no extrinsic information is available, extract bit metrics using the received signal.
2. Pass the extrinsic information found in step 1 to a first FPE, FPE1, to modify the extrinsic information obtained in step 1 using the most recent extrinsic information available from $C_1$. If no extrinsic information from $C_1$ is available bypass the FPE1 and pass the extrinsic information found in step 1 to $C_1$.
3. Decode $C_1$ using the extrinsic information provided to it in step 2 and extract extrinsic information of the output of $C_1$
4. Pass the extrinsic information found in step 3 to a second FPE, FPE2, to modify it using the extrinsic information found in step 1.
5. Pass the extrinsic information found in step 4 to update the bit metrics on the constellation and go back to step 1 for the next iteration.

Figure 30:
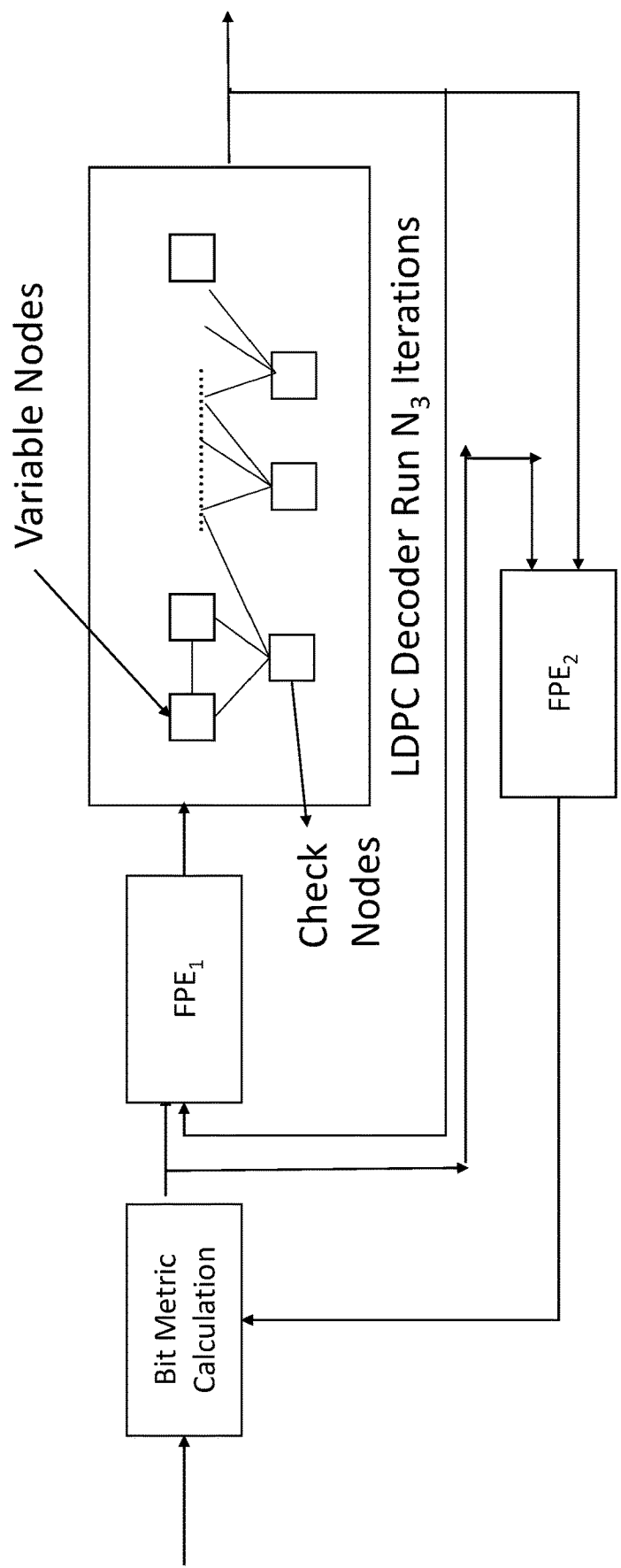
FIG. 30 shows designs illustrating exemplary methods in accordance with various aspects of the present disclosure.

The above 5 step iterative decoding algorithm can be directly applied when the outer code $C_1$ is a simple code. However, when $C_1$ is a powerful code, such as a turbo product code or a turbo code or a LDPC code, that requires iterative decoding for the decoding of $C_1$, the above algorithm can be modified to reduce the increase in decoding complexity. This can be done by inserting steps 1, 2, 4 and 5 listed above within the iterations for the decoding of $C_1$ in step 3. Consider an ITBF embodiment that transmits LDPC coded bits using a higher order signal constellation. In such an application, the transmitter functions the same way as described before by selecting one bit out of every n coded bits of the LDPC coded stream based on $n_s = \lfloor \log_2 n \rfloor$ number of implicit bits and flipping it before transmission. At the receiver, usually LDPC codes are decoded by running iterations between the variable nodes and check nodes on the Tanner graph according to the SPA algorithm. Based on the above ITBF decoding algorithm, a LDPC coded modulation scheme with ITBF can be decoded as shown in FIG. 30 according to the following algorithm:

1. Extract bit metrics from the received signal and assign them to the variable nodes disregarding any flipping has taken place. Run the LDPC decoding SPA algorithm for $N_1$ number iterations, where $N_1$ is a pre-selected integer.

Figure 13:
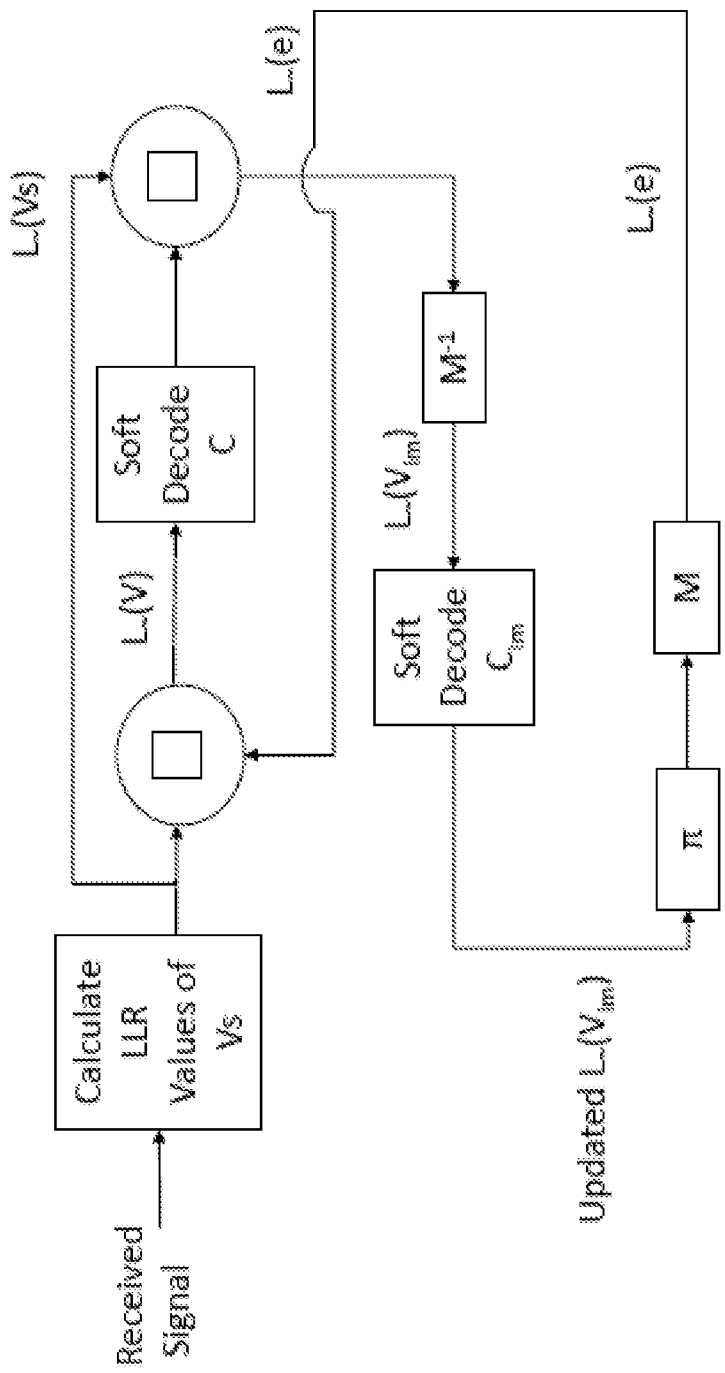
FIG. 13 shows designs illustrating exemplary methods in accordance with various aspects of the present disclosure.

This allows the LDPC code to provide a good estimate of soft values of the message nodes. However, these soft values are degraded due to the flipping compared with the quality of soft values that would be obtained without any flipping.
2. Following $N_1$ number of the standard SPA decoding iterations, modify the SPA algorithm to include two FPEs, FPE1 and FPE2, and the bit metric updating unit according to [Imai] as shown in FIG. 13.

Note that the bit metrics calculated from the constellation is a reflection of the flipped version of the coded stream which is also the transmitted sequence. However, the variable nodes during the SPA algorithm reflect the output of the LDPC code without any flips. Therefore, the most recent bit metrics calculated from the constellation and the most recent LLR values of the variable nodes can be compared in FPE1 and FPE2 to best identify the flipped positions. Therefore, the output of FPE1 highlighted in FIG. 28 is a reasonable representation of the un-flipped version of the LDPC coded sequence while the output of FPE2 in FIG. 30 is a reasonable representation of the flipped version of the LDPC coded sequence. Upon completing $N_1$ number of standard LDPC decoding iterations, run a pre-selected $N_2$ number of iterations using the algorithm shown in FIG. 6 to complete decoding. The values of $N_1$ and $N_2$ can be selected to achieve the desired performance and to limit decoding complexity. Depending on the application, once FPE1 provides extrinsic information to the LDPC decoder, if necessary any preselected $N_3$ number of iterations can be run for the SPA decoding algorithm using the same FPE1 output to reasonably well realize the effects of the provided extrinsic information. The values of $N_1$, $N_2$ and $N_3$ can be selected based on the power of the LDPC code, size of the constellation, mapping policy used on the constellation and the signal to noise ratio. There can be applications for which $N_1=N_3=1$. It is mentioned here that any FPE in a ITBF system can be implemented as a hard FPE (according to any of the four ways discussed before), or a soft FPE, or a soft/hard FPE, or according to the PLV algorithm, or combined FPE/PLV algorithm.

It is noticed that the bit error rate performance of the implicit stream relies on how the mapping is done on the constellation. In order to determine which bit has been flipped in a symbol reliably on the constellation, it is important to increase the Euclidean distance between constellation points that differ in one bit differences. Therefore, mapping policies other than traditional Gray coding can be used in a coded modulation scheme with ITBF. For example, anti-Gray coding or reverse Gray coding (RGC) can provide stronger information about the flipped bit from the constellation compared with Gray coding. However, Gray coding can provide stronger information of the remaining un-flipped bits than the other types of mapping. Therefore, depending on the application, Gray coding or any other type of coding can be used to achieve good performance of ITBF coded modulation scheme.

Figure 31:
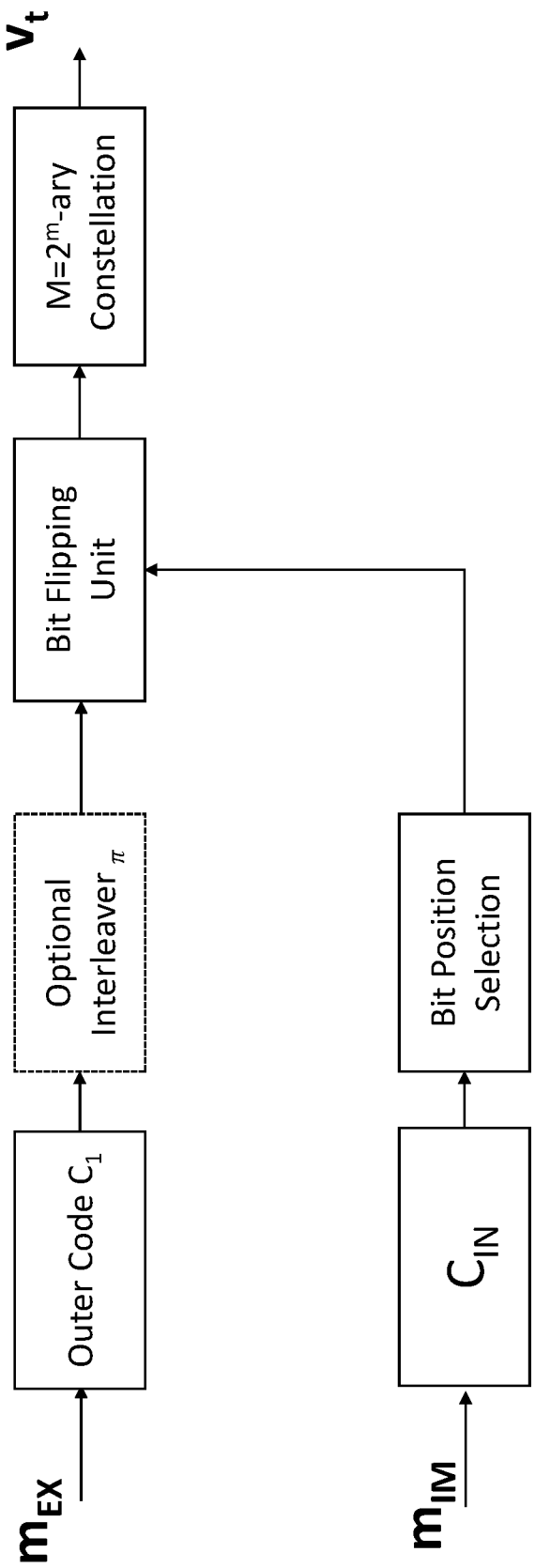
FIG. 31 shows designs illustrating exemplary methods in accordance with various aspects of the present disclosure.
Figure 32:
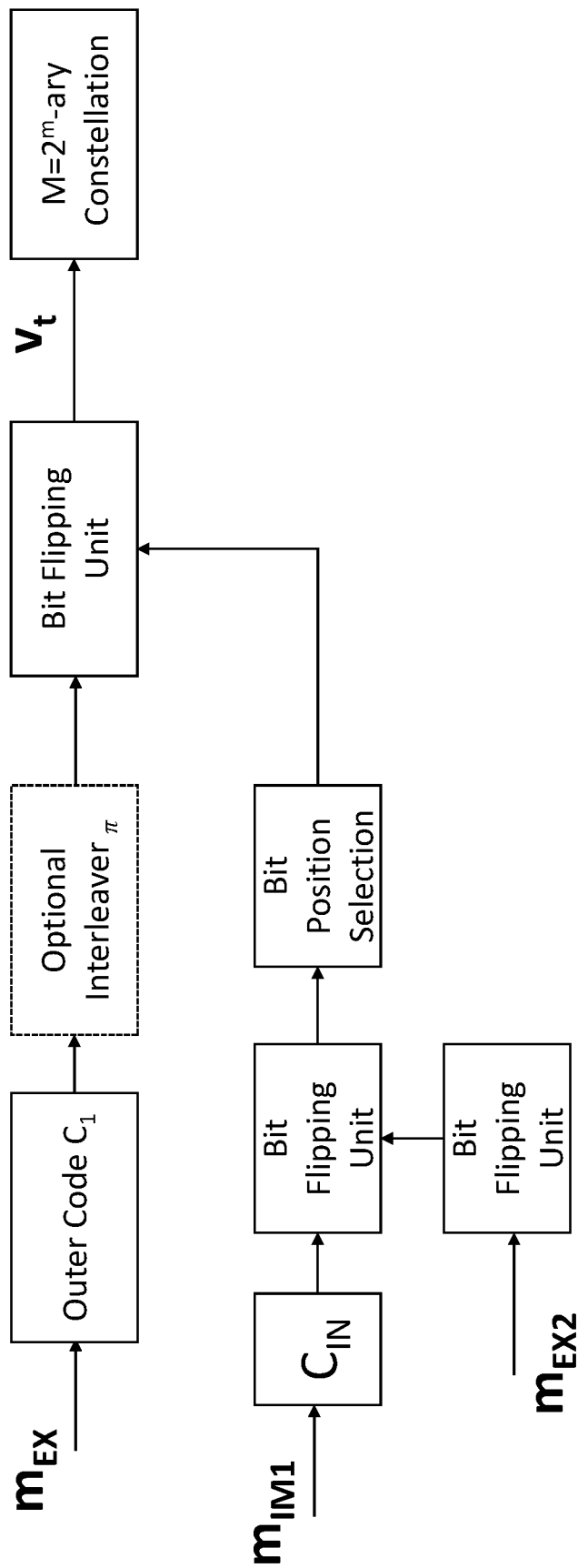
FIG. 32 shows designs illustrating exemplary methods in accordance with various aspects of the present disclosure.

Another approach for improving the performance of the implicit bit sequence is to employ a separate code on the implicit stream as shown in FIG. 31 instead of using an uncoded implicit message data stream as before. In such a coded system, the soft information of coded implicit bits can be first extracted by using the ITBF iterations as described before and after that perform soft or hard decoding of the implicit code to recover the implicit message data stream to achieve the desired error rate performance. Since the ITBF iterations are likely to provide mostly reliable soft information of coded implicit bits, a high rate code $C_{Im}$ can be usually used on the implicit stream. Another way to further increase the transmission rate in the scheme shown in FIG. 31 is to use a second uncoded implicit stream, $m_{Im2}$, by applying the ITBF technique to the code $C_{Im}$. FIG. 32 shows such a structure that employs two implicit streams, $m_{Im1}$ and $m_{Im2}$. The decoding of such a coded scheme follows directly from the iterative decoding of coded modulation schemes with ITBF described before. The only difference is that the same iterative process is needed twice, first to use the ITBF decoding algorithm shown in FIG. 29 to extract soft information of the first coded implicit stream, then to use the ITBF decoding algorithm shown in FIG. 23 to recover the two implicit message streams. If the code $C_1$ in FIG. 28, or code $C_1$ and/or $C_{Im}$ in FIGS. 31 and 32, is a LDPC code or any other powerful code that requires iterative decoding, the same decoding method described before and shown in FIG. 30 can be used to recover both the explicit message sequence $m_{Ex}$ and the implicit message sequence $m_{Im}$.

Figure 33:
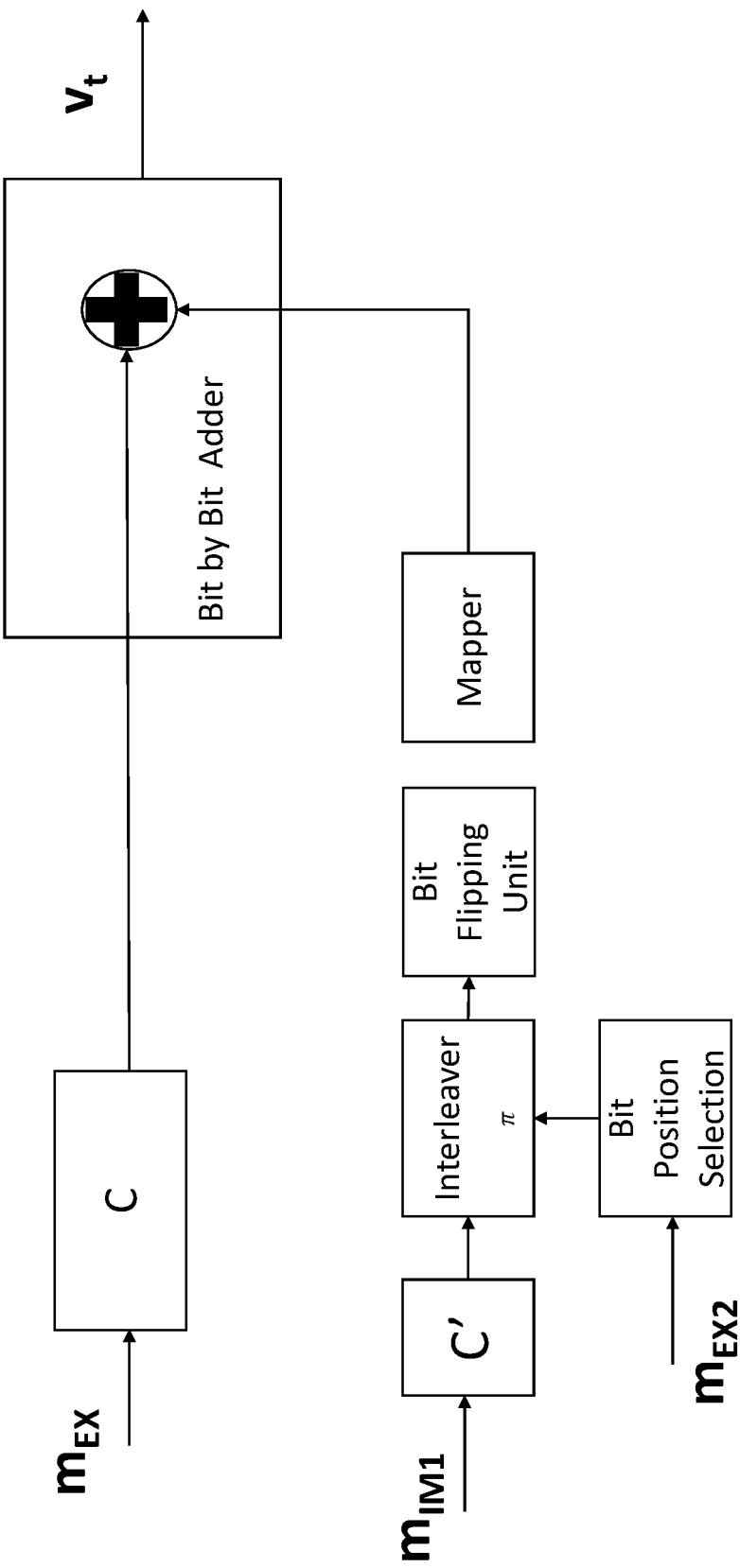
FIG. 33 shows designs illustrating exemplary methods in accordance with various aspects of the present disclosure.

Another method to transmit two implicit message sequences, $m_{Im1}$ and $m_{Im2}$, is to extend the IPT technique described before with one implicit stream to handle two implicit streams. This is done by applying the ITBF technique described before to the coded implicit stream by adding second implicit stream. FIG. 33 shows the structure of a new class of IPT schemes, referred to here as IPT-2 schemes, that can transmit one stream $m_{Ex}$ explicitly and two streams $m_{Im1}$ and $m_{Im2}$ implicitly. The first implicit stream is coded while the second implicit stream is uncoded. IPT-2 schemes select one bit out of every n' bits of the first coded implicit stream, $v'_{Im}$, according to $n'=\lfloor \log_2 n' \rfloor$ bits of $m_{Im2}$ and flip that selected bit in the a bit flipping unit to form the sequence $v_{Im}$. Then, as in IPT schemes, one bit out of every n coded bits of the explicit stream, $v_{Ex}$, is selected according to $n_s=\lfloor \log_2 n \rfloor$ bits of $v_{Im}$ and flip that bit before forming the transmitted sequence $v_t$. Note that the processing on the first implicit stream $m_{Im1}$ is the same as the structure of an ITBF scheme shown in FIG. 21 with $m_{Im2}$ as its implicit stream. At the receiver, IPT iterative decoding structure shown in FIG. 13 can be modified by replacing the decoding of the implicit code $C_{Im}$ by the ITBF decoding algorithm shown in FIG. 23. After running the modified IPT iterations, all three sequences can be decoded. The explicit message sequence $m_{Ex}$ and the first implicit message sequence $m_{Im1}$ follow directly from the modified IPT iterations, while $m_{Im2}$ can be directly recovered from the information of the FPE as it identifies the flipped bit position which uniquely determine $n'_s$ number of bits of $m_{Im2}$ for every n' number of bits identified on $v'_{Im}$.

Figure 12:
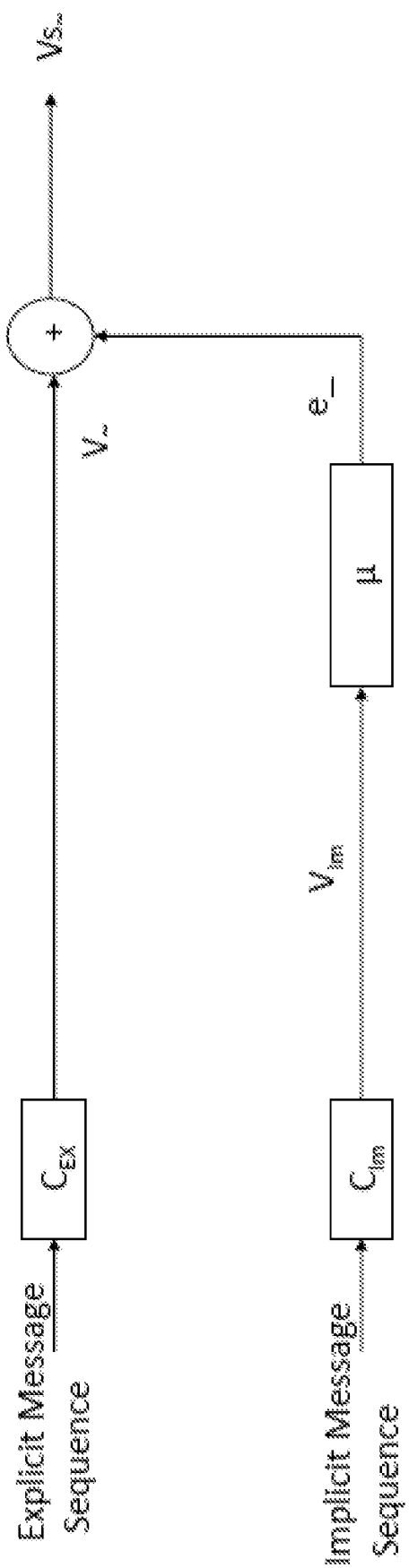
FIG. 12 shows designs illustrating exemplary methods in accordance with various aspects of the present disclosure.

When LDPC codes are used in a IPT shown in FIG. 12 or a IPT-2 scheme as shown in FIG. 33 as the code $C_{EX}$ on the explicit stream and also code $C_{Im}$ on the implicit stream, the decoding can be done by inserting the IPT iterations within LDPC decoding iterations. This can be done by running only a preselected $N_1$ number of LDPC iterations (SPA iterations) in the decoding of $C_{EX}$ and $C_{Im}$ in the decoder shown in FIG. 13. The value of $N_1$ is selected to be sufficient for the LDPC decoder to feel the effect of any changes made during the IPT iterations. Similarly, if LDPC codes are used in a IPT-2 scheme shown in FIG. 33 as the code on the explicit stream and also on the first implicit stream, the decoding can again be done by inserting the modified IPT iterations within LDPC decoding iterations as described before. Again, in the decoding of the explicit and implicit codes, only a small pre-selected $N_1$ number of SPA decoding iterations can be used within the modified IPTC-2 iterations. For some applications $N_1$ in a IPT or a IPT-2 can be as small as small as 1 or 2. As a result, the increase in decoding complexity is rather small in a IPT or a IPT-2 when the component codes are LDPC codes.

In ITBF or IPT or IPT-2, a portion of a message stream is transmitted implicitly while transmitting the remaining portion explicitly as a coded stream over a channel. It is noticed that when both implicit and explicit streams are formed from a single message stream, there is no restriction on how the two streams are formed. Therefore, the implicit and explicit streams can be formed from the original message stream in any preferable way. That flexibility available in a ITBF scheme or a IPT scheme or a IPT-2 scheme inherently introduces a second layer of encryption. For example, let us consider a IPT scheme that transmits 25% of a coded stream implicitly when transmitting the remaining 75% of the coded stream explicitly. That means on average one out of every five bits of the original message sequence can be transmitted implicitly while transmitting the remaining four bits explicitly. In this scheme, if there are $5\lambda$ message bits in the original message stream, then there are $$\binom{5\lambda}{\lambda}$$

ways to divide it to form the implicit and explicit streams. For higher values of $\lambda$, which is usually the case in practice, this number is a very large number. Therefore, if a third party is to somehow receive the transmitted sequence $v_r$, that third party will not be able to decode the two sequences without knowing how the original message sequence is divided to form the implicit and explicit sequences. Therefore, ITBF, IPT and IPT-2 schemes inherently introduce encryption by the division of the original message sequence to form the implicit and explicit streams. It is also noted here that the original sequence can be already encrypted. In that case, how the original encrypted sequence is divided into explicit and implicit streams introduces an additional second layer of encryption.

Another approach for increasing the information transfer rate is to allow interference during transmission. For example, in an OFDM system if the frequencies are brought closer to each other lowering the standard spacing than 1/T, more frequencies can be placed within a given bandwidth, where 1/T is the symbol rate. However, in such a system, the orthorgonality condition is violated causing interference among frequencies.

Similarly, interference can be present in any domain such as, time domain, spatial domain, or it can be present in presence of mismatches such as I/Q mismatch. Traditional method of signaling is to somehow find ways to avoid interference or to combat it at the receiver using interference cancellation or mismatch cancellation.

Figure 34:
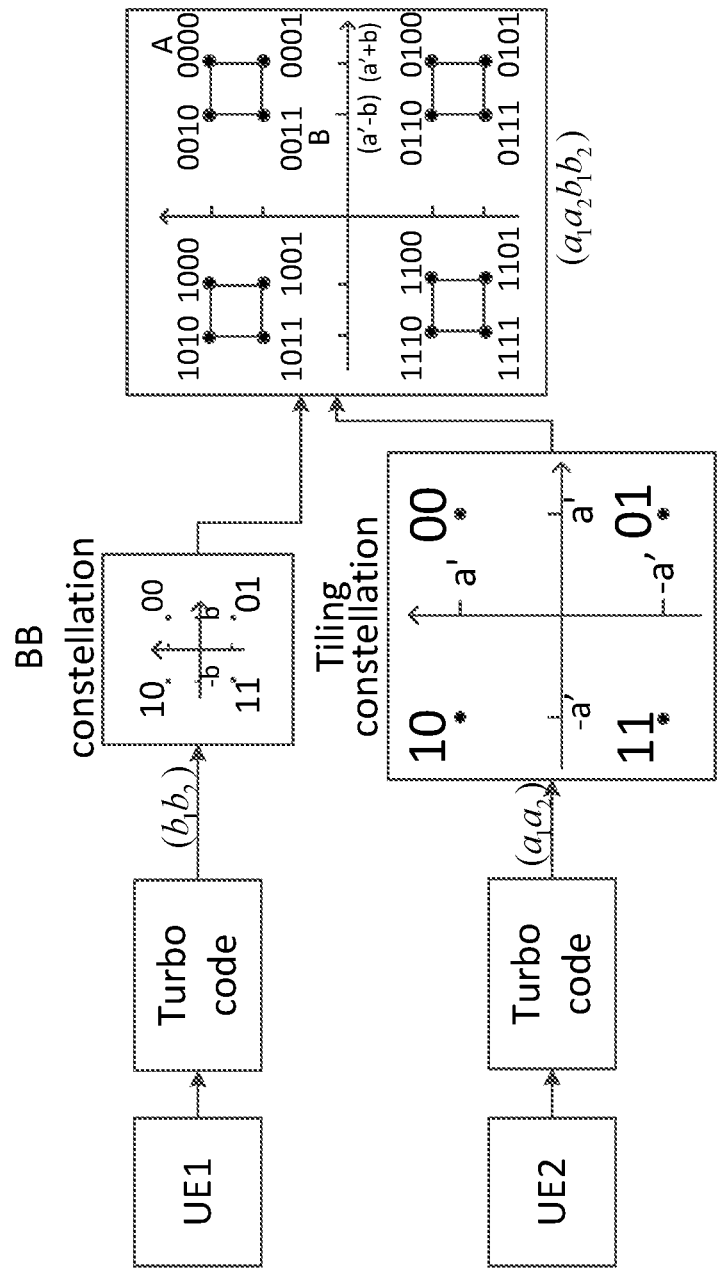
FIG. 34 shows designs illustrating exemplary methods in accordance with various aspects of the present disclosure.

In the literature, the BOMA technique has been proposed to transmit a message sequence from a second user when the message from a first user is transmitted on the downlink of a wireless system. BOMA employs a sparse signal constellation which can be derived using the building block principle that has been used in the design of multilevel codes. For example, FIG. 34 shows a 16-ary sparse constellation that can be used to additionally transmit two bits of user 2 while transmitting two bits of user 1. In that example, user 1 is considered to have a weaker channel while user 2 is considered to have a stronger channel. The constellation shown in FIG. 34 is constructed by following the building block approach by (a) constructing a QPSK constellation for the two bits of user 2 with constellation points (±b, ±b), which is referred to as the building block (BB) constellation, and (b) placing four copies of the building block formed in (a) at the QPSK constellation of the two bits of user 1 with constellation points (±a, ±a), which is referred to as a tiling constellation. As a result, the first two bits of the 16-QAM sparse constellation come from user 1 while the last two bits come from user 2. At the receiver, both users can separately extract the respective LLR values of only their own bits from the received signal.

Note that the primary user, user 1, can view user 2 as interference. As a result, the interference of user 2 expands the original QPSK constellation with points (±a, ±a) of user 1 into a 16-ary sparse constellation with the interference. Therefore, any interference results in an expanded signal constellation. More importantly, the BOMA principle allows the extraction of the LLR values of both the information of the desired signal (which is user 1 in the previous example) and the information of the interfering signal (which is user 2 in the previous example) simultaneously. Therefore, the detection used in the BOMA approach, referred to here as BOMA detection, can be extended to multiple interferences by systematically expanding the constellation according the BB methodology, and extracting the LLR values of the desired bits and each interfering bit separately from the same received signal. As a result, the BOMA approach can be used to combat interference in a communication system. Therefore, signals can be transmitted with interference but the likelihood values of different bits can be extracted using the BOMA detection approach. This is in contrast to traditional thinking which tries to avoid interference and to find ways, such as interference cancelation, equalization, etc., to remove interference before detection. This aspect of the present disclosure, referred to as BOMA detection in presence of interference (BDPI), can be used to transmit signals with interference thereby increasing the information transfer rate.

Figure 35:
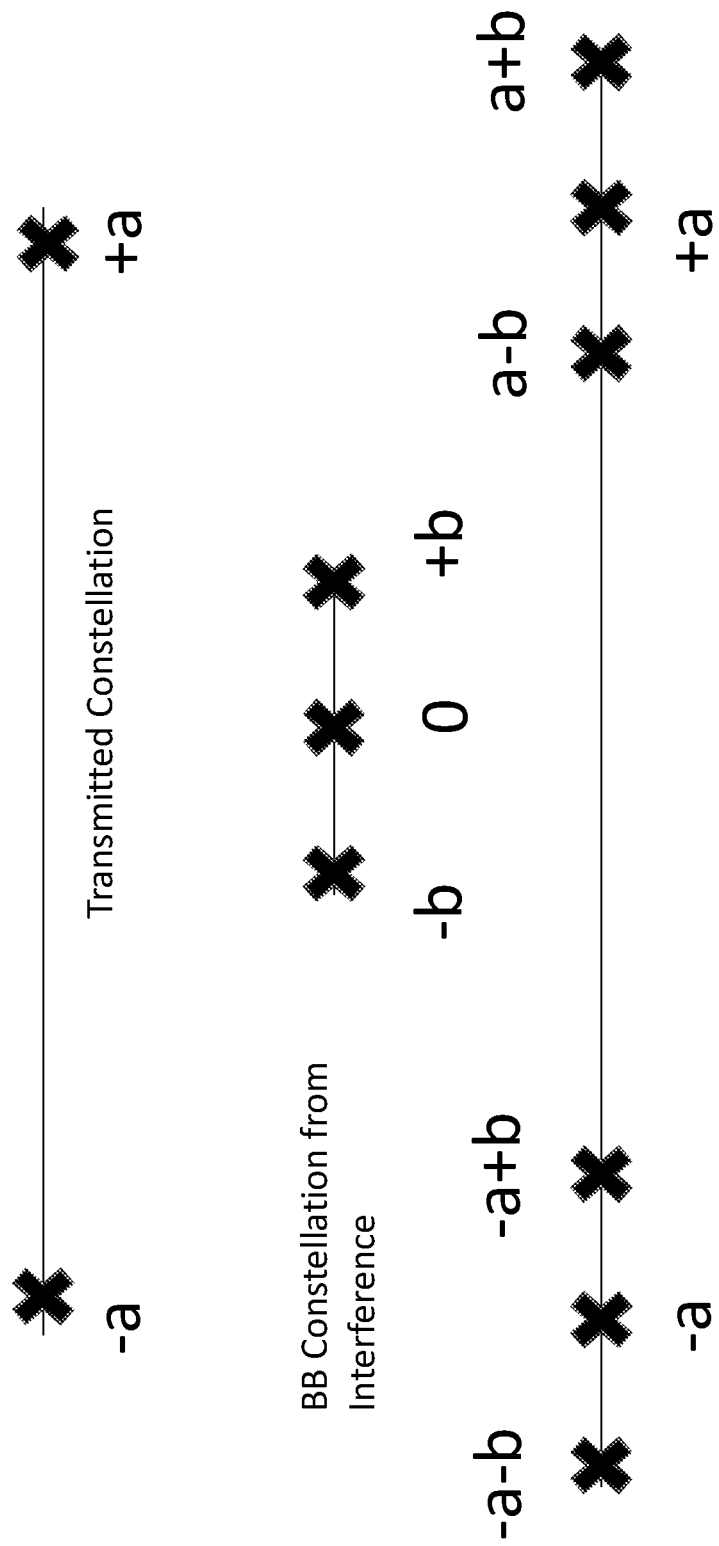
FIG. 35 shows designs illustrating exemplary methods in accordance with various aspects of the present disclosure.

For example, let us consider a transmission scheme that employs BPSK modulation transmitted over a channel that causes inter-symbol interference (ISI) from only the two adjacent symbols. Let us also assume that the channel response is in the form $h=(0, 0, \ldots, h_{-1}, h_0, h_1, \ldots 0, 0)$ with $h_1=h_{-1}$. Therefore, during every n th interval, the overall constellation with interference from both adjacent symbols can be found by viewing the effect of each interfering signal in the form of a BB. FIG. 35 illustrates how the overall constellation with interference from both adjacent symbols can be found by considering the effect of one symbol at a time. As it can be seen from FIG. 35 the combined BB formed by both adjacent interfering symbols is a 3-ary constellation. Therefore, the overall sparse signal constellation with the interference from both adjacent symbols and the desired signal used by the scheme during every interval is a 6-ary constellation as illustrated in FIG. 35.

The above method can be extended to include ISI from up to N symbols from each side. Noticing that the interference from any ith pair of neighboring symbols on the two sides create a 3-ary BB, $BB_i$, i=1, 2, . . . N, the effective interference BB, $BB_{eff,N}$, from any N pairs of interfering symbols can be found by starting from $BB_1$ (which is also $BB_{eff,1}$) and placing each $BB_i$ at each constellation point of $BB_{eff,i-1}$, to form $BB_{eff,i}$, for i=2, 3, . . . N.

During decoding, each received signal $y_k$ transmitted during any k th interval, carries (2N+1) LLR contributions for bits transmitted during intervals (k−N), (k−N+1), . . . , (k+N). These contributions, denoted by LLR(k, k−j), j=N, (N−1), . . . , N, can be found by following BOMA decoding approach on the overall signal constellation $BB_{eff,N}$. Therefore, upon calculating LLR contributions from each received signal, $y_k$, −∞<k<∞, each bit will have up to (2N+1) LLR contributions. However, note that when only a finite number of symbols are transmitted, the initial N bits and the final N bits will have fewer LLR contributions. The overall LLR value of each jth bit, L(j) can be calculated by adding all LLR contributions of that bit as $$L(j) = \sum_k LLR(k, k-j)$$

Upon calculated the bit metrics for each bit in presence of interference, they can be used to decode the message bits if an error correcting code is employed at the transmitter, or use the bit metrics calculated in any known method as directed by the receiver.

As N increases, calculating all (2N+1) LLR contributions from each $y_k$ become challenging. Hence, an algorithm can be developed to efficiently calculate the LLR value of each bit by actively searching for the most significant constellation points for which each bit is a 1 and a 0 separately. If the Max-log-MAP based LLR values are calculated, only the most significant (closest to the received signal $y_k$) constellation point for 1 and most significant constellation point for 0 are needed. These two constellation points corresponding to each bit can be efficiently searched using the standard search algorithms even though the overall sparse constellation is very large.

As noted above, in another aspect, the present application discloses a technique for using CICM with LDPC codes. Since most current communications systems today employ LDPC codes, it is highly desirable to be able to apply the CICM technique to LDPC codes and as a result to be able to transmit LDPC coded bits using higher order modulation while performing better than if they were to be transmitted using a lower order modulation scheme. In addition, it would be highly desirable for such a LDPC coded scheme with CICM to be able to process one LDPC codeword at a time thereby eliminating any increase in decoding delay and memory. If CICM can be applied to a single codeword of a LDPC code, its coded bits could potentially be transmitted using 16-QAM or even 64-QAM modulation while performing better or similar to employing QPSK modulation for transmission. As a result, application of CICM to LDPC codes can potentially more than double the transmission rate. In accordance with this aspect of the present application, a simple method of applying CICM to LDPC codes is presented while decoding one codeword of the LDPC code at a time.

A LDPC code can be viewed as a long code that has a collection of a many single parity check (SPC) codes. Each parity check is formed by a few variable nodes (represented by coded bits) and one check node, where, each check node receives information from several other variable nodes. Effectively, each row of the parity check matrix H of a LDPC code corresponds to a SPC code of that LDPC code. As a result, a LDPC code inherently contains a large number of short SPC codes in it. Since the CICM technique requires consideration of a large number of codewords, these short SPC codes can be used as the required codewords in the application of CICM. As a result, CICM can be applied to a single codeword of the LDPC code without having to consider multiple codewords of it.

In order to describe how the CICM technique can be applied to LDPC codes, let us consider a general LDPC code with n variable nodes (VNs), denoted by $v\_i=1, 2, \ldots, n$, and L check nodes (CNs), denoted by $c\_j, j=1, 2, \ldots, L$. Let us denote the set of $k_i$ connections stemming from any general VN vi to its associated CNs, denoted by $c\_j\_1(i)$, $c\_j\_3(i), \ldots, c\_j\_k\_i(i)$. Similarly, let us denote the set of $el\_j$ connections stemming from any general check node $c\_j$ to its associated VNs denoted by $v\_i\_1(j)$, $v\_i\_2(j), \ldots, v\_i\_el\_j(j)$.

As with block codes, it is assumed in the application of CICM to LDPC codes that errors would be limited to only a small number of coded bits as SNR increases. Specifically, it is assumed that the errors are limited to a set of variable nodes formed by starting from any single variable node vi and (a) following all paths that emerge from vi to the check nodes, and (b) then considering each of those check nodes back to a set of variable nodes. This set of variable nodes formed by the above steps (a) and (b) including vi, denoted by $S\_i$, is the set of variable nodes referred to as the associated variable nodes (AVN) of the variable node vi. Therefore, in the application of CICM to LDPC codes, it is assumed that errors that occur are limited to a single Si as SNR increase. Following the above method, it is possible to obtain the corresponding set of AVN for each variable node vi, $i=1, 2, \ldots, n$. The set of AVNs, $S\_i=1, 2, \ldots, n$, are used to design the required CICM Interleaver. The goal of the CICM Interleaver is to place each coded bit of every AVN in different transmitted symbols of the $2^m$-ary constellation used for transmission. First notice that in order to transmit n coded bits using a $2^m$-ary constellation, it is necessary to use $W=n/m$ symbols. Therefore, the aim of the CICM Interleaver in LDPC codes is to place the coded bits (variable nodes) in a m by W 2-dimensional array, called the symbol array (SA), with m rows and W columns with the aim of forming m-bit long symbols along columns to form W symbols for transmission. The objective of this CICM Interleaver is to satisfy the following condition:

no two coded bits of every Si, $i=1, 2, \ldots, n$, are placed in the same column of the SA.

However, in situations where it is impossible to satisfy the above condition, the Interleaver can be preferably designed to maintain that the coded bits of each Si are placed in as many columns as possible in the SA.

There can be many valid SAs that satisfy the above condition for all Sis, $i=1, 2, \ldots, n$. In the design of the SA, the goal is to find one such valid SA that satisfies the above condition. Many search algorithms can be developed to search for a valid SA starting from the set of Sis of a given LDPC code with n coded bits and a given value of m. One such strategy would be to place coded bits in the SA with the aim of maintaining the number of unplaced coded bits of each Si about the same for all Sis while placing bits in the SA. This strategy allows more flexibility towards the end to fill out the remaining openings of the SA without violating the above condition. Whenever, bits are selected from each Si, they can be selected either randomly or in some systematic manner such as from left to right or from right to left. In failing to find a valid SA, the process can be repeated until a valid SA (or the best possible SA) is found. An alternate strategy would be to place one Si at a time in the SA. This can be preferably done starting with the Si that has the largest number of coded bits and moving down to the Si with the lowest number of coded bits. The hope in this approach is to have all remaining places of SA in the end to fit into all remaining shorter Sis without violating the above stated condition. Again, coded bits of each Si can be either randomly selected or systematically selected, and further, the search can be repeated until a valid SA that satisfies the above stated condition.

Another approach is to design the CICM Interleaver by following the method for block codes. In this approach, Sis are treated as separate codewords. However, an adjustment is necessary since the same coded bit can appear in many Sis whereas in case block codes all coded bits are separate. This can be overcome by removing all remaining (disregarding) appearances of the same coded bit from other Sis once that coded bit is placed in SA.

It is noted here that the Interleaver design is done once prior to transmission and hence time and effort in searching for a valid SA does not contribute to the decoding delay or decoding complexity. The generated symbols from the SA are then transmitted using a signal constellation that employs RGC.

As noted above, in yet another aspect, the present application discloses a technique for decoding LDPC codes with CICM. In general, CICM decoding requires iterative decoding while involving the constellation during decoding iterations. Since LDPC decoding already uses iterative decoding, the same LDPC iterations can be used to include the constellation. However, the decoder needs to use the same CICM Interleaver used at the transmitter when transferring information from the variable nodes to the constellation and the corresponding de-Interleaver when transferring information from the constellation back to the variable nodes. Checking with the constellation could be done every iteration or every N'th iteration (N'>1) depending on the situation. For example, if N=20 LDPC iterations are used, the constellation could be included after every N'=5 iterations.

It should also be understood that the various different communication techniques disclosed herein, including but not limited to the SPT techniques, the IPT techniques, and the CICM techniques, could be utilized together in any of various manners.

Example embodiments of the disclosed innovations have been described above. Those skilled in the art will understand, however, that changes and modifications may be made to the embodiments described without departing from the true scope and sprit of the present invention, which will be defined by claims.

The invention claimed is:

1. A communication system comprising:
a first apparatus comprising a transmitter, wherein the first apparatus is configured to:
receive a first stream of bits and a second stream of bits;
apply a component $C_1$ that takes the first stream of bits as its input and outputs a stream of bits according to the rules of processing of $C_1$;
select a position between 1 and n $=2^{n_s}$, according to every block of $n_s$ bits of the second stream of bits;
modify the stream of bits at the output of component $C_1$ by flipping the position selected by a bit position selector in every block of n bits of the stream of bits at the output of component $C_1$;
apply a component $C_2$ that takes the modified stream of bits at the output of component $C_1$ as its input and outputs a stream of bits according to the rules of processing of component $C_2$; and
form a stream of symbols by mapping every block of m bits of the stream of bits at the output of component $C_2$ onto a constellation point of a 2m-ary signal constellation.

2. The communication system of claim 1, further comprising:
a second apparatus comprising a receiver that is communicatively coupled to the first apparatus via a communication channel, wherein the receiver is configured to receive a signal comprising the 2m-ary signal constellation and wherein the second apparatus is configured to:
calculate a bit metric of every bit of each m-bit symbol on the 2m-ary signal constellation using the received signal;
reverse the processing of component $C_2$ used at the transmitter, in accordance with the rules of processing of component $C_2$ used at the transmitter, using the bit metrics calculated from the received signal and any soft information provided to it by component $C_1$ and then provide soft information of the stream of bits at the input of component $C_2$;
adjust for any bit metrics available for component $C_1$ in the received signal;
reverse the processing of component $C_1$ used at the transmitter, in accordance with the rules of processing of component $C_1$ used at the transmitter, using the soft information available and any available bit metrics of the stream of bits output by component $C_1$ and then update the soft information at the stream of bits at the output of component $C_1$; and
run iterations up to a selected number of iterations or until any selected stopping criterion is met.

3. The communication system of claim 1, where components $C_1$ and $C_2$ are component codes of a turbo product code.

4. The communication system of claim 1, where components $C_1$ and $C_2$ are component codes of a serially concatenated code.

5. The communication system of claim 2, wherein components $C_1$ and $C_2$ are component codes of a turbo product code.

6. The communication system of claim 2, wherein components $C_1$ and $C_2$ are component codes of a serially concatenated code.

7. The communication system of claim 2, wherein the second apparatus is further configured to:
adjust the soft information of the stream of bits at the input of component $C_2$ using the most recent soft information available in the stream of bits output by component $C_1$.

8. The communication system of claim 2, wherein the second apparatus is further configured to:
adjust the soft information of the stream of bits at the output of component $C_1$ using the most recent soft information available at the input of $C_1$.

* * * * *